United States Patent
Yanagisawa et al.

(10) Patent No.: US 10,606,541 B2
(45) Date of Patent: Mar. 31, 2020

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Yuichi Yanagisawa, Tochigi (JP); Nozomu Sugisawa, Isehara (JP); Natsuko Takase, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/540,672

(22) PCT Filed: Jan. 14, 2016

(86) PCT No.: PCT/IB2016/050154
§ 371 (c)(1),
(2) Date: Jun. 29, 2017

(87) PCT Pub. No.: WO2016/116833
PCT Pub. Date: Jul. 28, 2016

(65) Prior Publication Data
US 2018/0039471 A1    Feb. 8, 2018

(30) Foreign Application Priority Data

Jan. 22, 2015    (JP) .................................. 2015-010295

(51) Int. Cl.
*G06F 3/14*        (2006.01)
*H05B 33/12*    (2006.01)
(Continued)

(52) U.S. Cl.
CPC ........ *G06F 3/1446* (2013.01); *G02F 1/13336* (2013.01); *G06F 3/044* (2013.01);
(Continued)

(58) Field of Classification Search
CPC .... G06F 3/1446; G06F 3/1438; G06F 3/0412; G06F 3/044; G02F 1/13336; G02F 1/1347; G02F 1/134309
(Continued)

(56) References Cited

U.S. PATENT DOCUMENTS 7,489,286 B2    2/2009  Kawase et al.
8,289,687 B2   10/2012  Weinstein et al.
(Continued)

FOREIGN PATENT DOCUMENTS

CN    001713035 A    12/2005
CN    101326507 A    12/2008
(Continued)

OTHER PUBLICATIONS

International Search Report (Application No. PCT/IB2016/050154) dated May 10, 2016.
(Continued)

*Primary Examiner* — Fred Tzeng
(74) *Attorney, Agent, or Firm* — Robinson Intellectual Property Law Office; Eric J. Robinson

(57) ABSTRACT

A display device or an electronic device with high portability and browsability is provided. A display device which includes two display panels that overlap with each other and in which the area of a portion where the two display panels overlap with each other is variable is provided. The larger the area where the two display panels overlap with each other is, the smaller the display device becomes. The first display panel includes a first region that performs display. The second display panel includes a second region that performs display, and a third region that is adjacent to the second region and transmits visible light. When the third region overlaps with the side of a surface which performs
(Continued)

display of the first region, display can be performed using a seamless large display region.

19 Claims, 34 Drawing Sheets

(51) Int. Cl.
| | |
|---|---|
| G06F 3/041 | (2006.01) |
| G06F 3/044 | (2006.01) |
| G02F 1/1333 | (2006.01) |
| H01L 27/32 | (2006.01) |
| G02F 1/1337 | (2006.01) |
| G02F 1/1339 | (2006.01) |
| G02F 1/1343 | (2006.01) |
| G02F 1/1368 | (2006.01) |
| H01L 51/00 | (2006.01) |
| H01L 51/52 | (2006.01) |

(52) U.S. Cl.
CPC ............ *G06F 3/0412* (2013.01); *G06F 3/14* (2013.01); *G06F 3/1438* (2013.01); *H01L 27/3267* (2013.01); *H01L 27/3293* (2013.01); *H05B 33/12* (2013.01); *G02F 1/1337* (2013.01); *G02F 1/1368* (2013.01); *G02F 1/13394* (2013.01); *G02F 1/134309* (2013.01); *G02F 2001/13398* (2013.01); *G02F 2001/133742* (2013.01); *G02F 2203/64* (2013.01); *G09G 2370/16* (2013.01); *G09G 2380/02* (2013.01); *H01L 27/323* (2013.01); *H01L 27/3204* (2013.01); *H01L 51/0097* (2013.01); *H01L 51/5237* (2013.01); *H01L 2251/5338* (2013.01)

(58) Field of Classification Search
USPC ......................................................... 345/1.3
See application file for complete search history.

(56) References Cited

U.S. PATENT DOCUMENTS

| | | | |
|---|---|---|---|
| 9,088,006 B2 | 7/2015 | Yamazaki et al. | |
| 9,614,022 B2 | 4/2017 | Miyake et al. | |
| 9,627,648 B2 | 4/2017 | Yamazaki et al. | |
| 2005/0285811 A1 | 12/2005 | Kawase et al. | |
| 2006/0139234 A1* | 6/2006 | Tanaka | H04N 13/31 345/9 |
| 2007/0136405 A1 | 6/2007 | Weinstein et al. | |
| 2008/0060238 A1* | 3/2008 | Chiang | G09F 13/04 40/564 |
| 2012/0049718 A1* | 3/2012 | Watanabe | G02F 1/13336 313/110 |
| 2014/0104246 A1* | 4/2014 | Rao | G09G 5/00 345/204 |
| 2014/0118651 A1* | 5/2014 | Hirosawa | G02F 1/134309 349/43 |
| 2014/0347806 A1 | 11/2014 | Totani | |
| 2015/0042896 A1* | 2/2015 | Lee | G02F 1/1347 348/790 |
| 2015/0169274 A1 | 6/2015 | Holung et al. | |
| 2015/0301266 A1* | 10/2015 | Araki | G02B 6/005 349/65 |
| 2016/0037608 A1 | 2/2016 | Ikeda et al. | |
| 2016/0044751 A1* | 2/2016 | Ikeda | H05B 33/02 362/227 |
| 2016/0103649 A1* | 4/2016 | Yoshitani | G06F 3/1446 345/694 |
| 2016/0155391 A1* | 6/2016 | Takesue | G06F 3/1438 345/690 |
| 2016/0210103 A1* | 7/2016 | Yoshizumi | G06F 3/1446 |

FOREIGN PATENT DOCUMENTS

| | | |
|---|---|---|
| CN | 104183197 A | 12/2014 |
| DE | 102014118099 | 6/2015 |
| EP | 1612658 A | 1/2006 |
| EP | 1963982 A | 9/2008 |
| GB | 2522981 | 8/2015 |
| JP | 2006-010811 A | 1/2006 |
| JP | 2007-114694 A | 5/2007 |
| JP | 2009-518695 | 5/2009 |
| JP | 2010-224326 A | 10/2010 |
| JP | 2014-197522 A | 10/2014 |
| JP | 2015-005786 A | 1/2015 |
| JP | 2015-118704 A | 6/2015 |
| KR | 2006-0048387 A | 5/2006 |
| KR | 2014-0136880 A | 12/2014 |
| TW | I257596 | 7/2006 |
| WO | WO-2007/067996 | 6/2007 |
| WO | WO-2012/049968 | 4/2012 |

OTHER PUBLICATIONS

Written Opinion (Application No. PCT/IB2016/050154) dated May 10, 2016.

* cited by examiner

FIG. 1A1 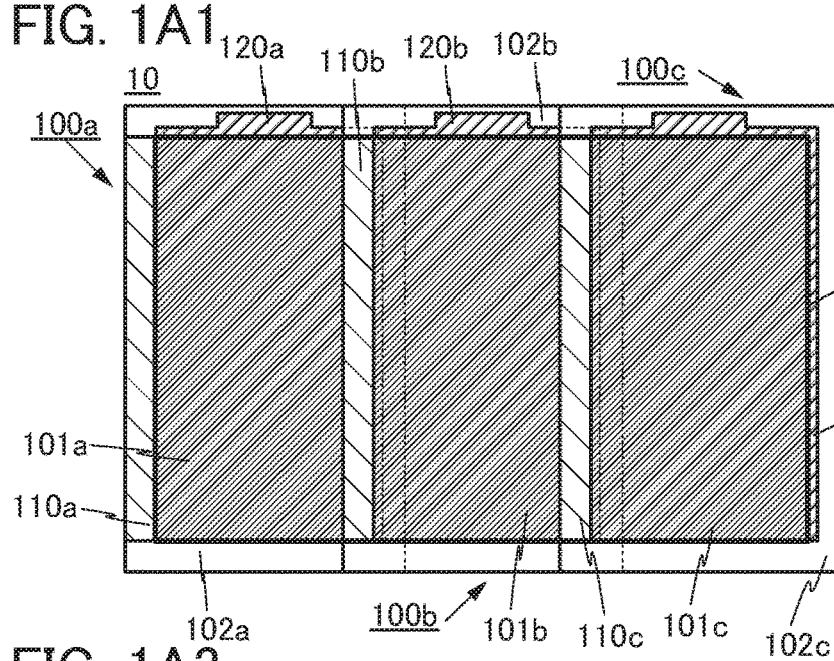
FIG. 1A2 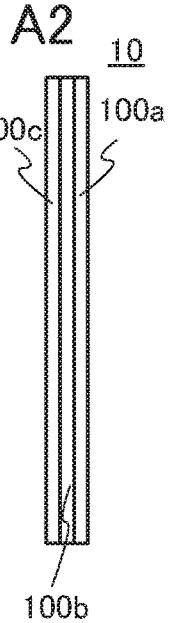
FIG. 1A3 
FIG. 1A4 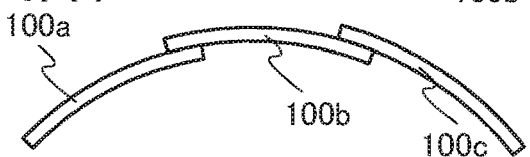
FIG. 1B1 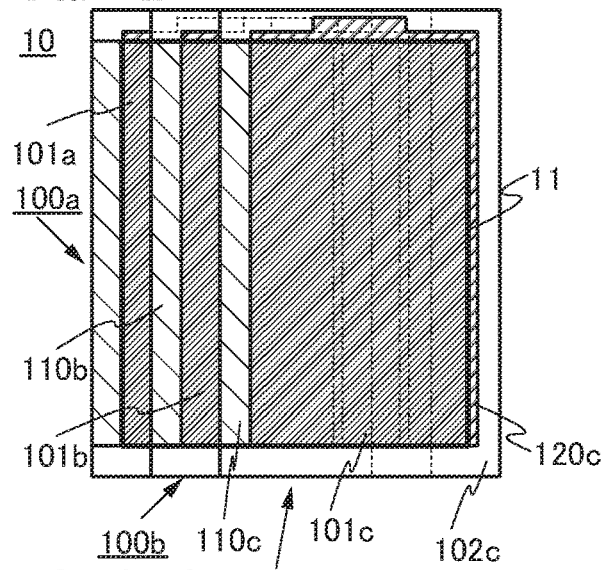
FIG. 1C1 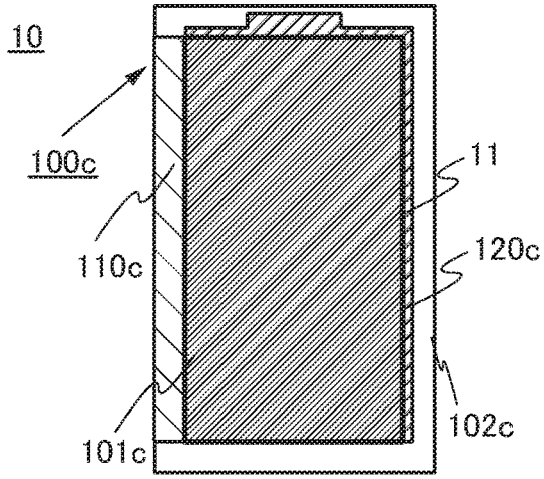
FIG. 1B2 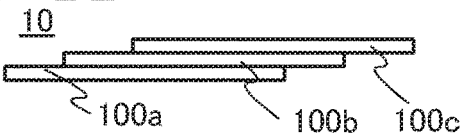
FIG. 1C2
FIG. 1C3
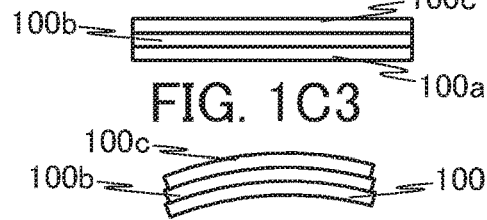

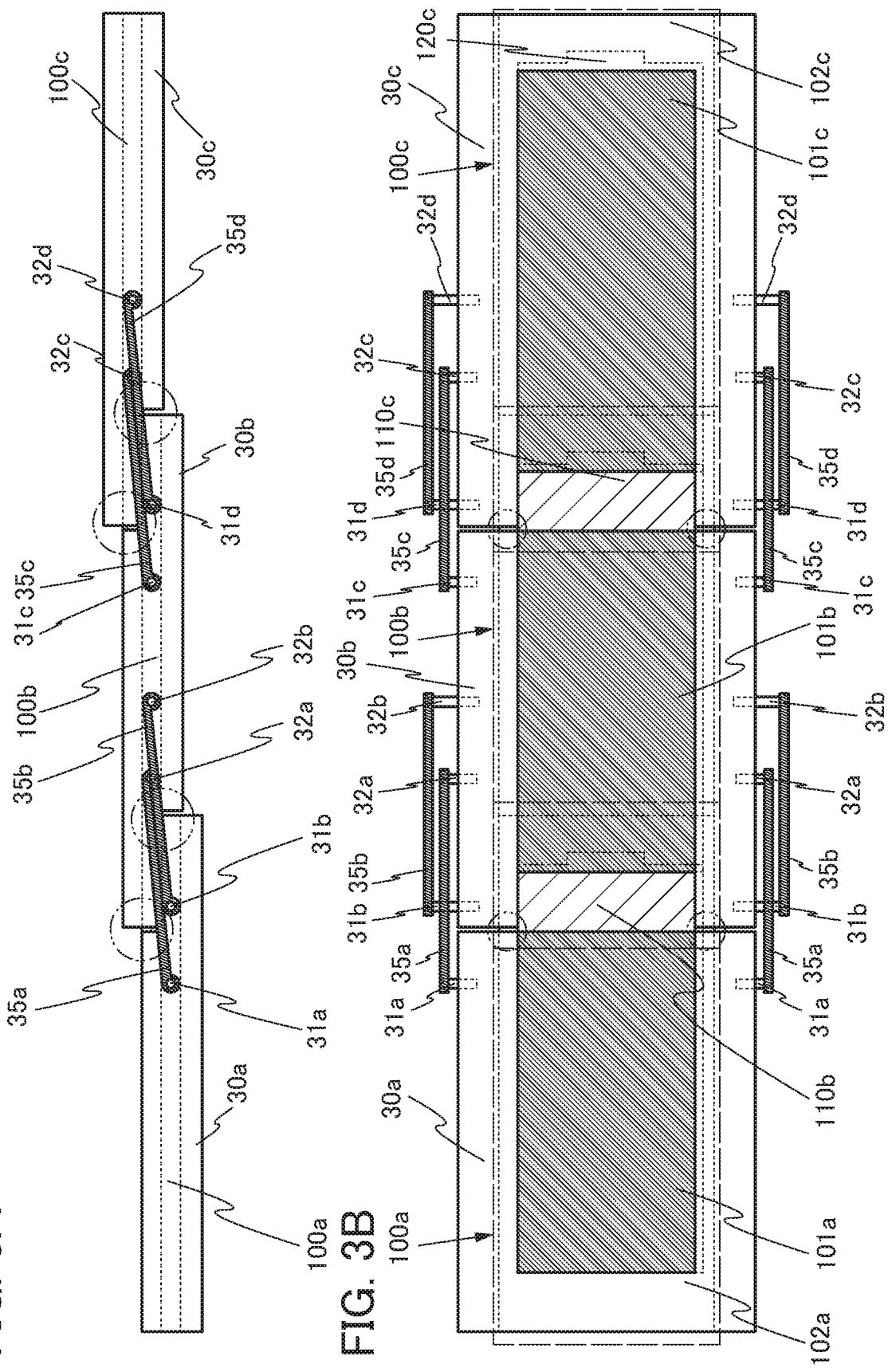

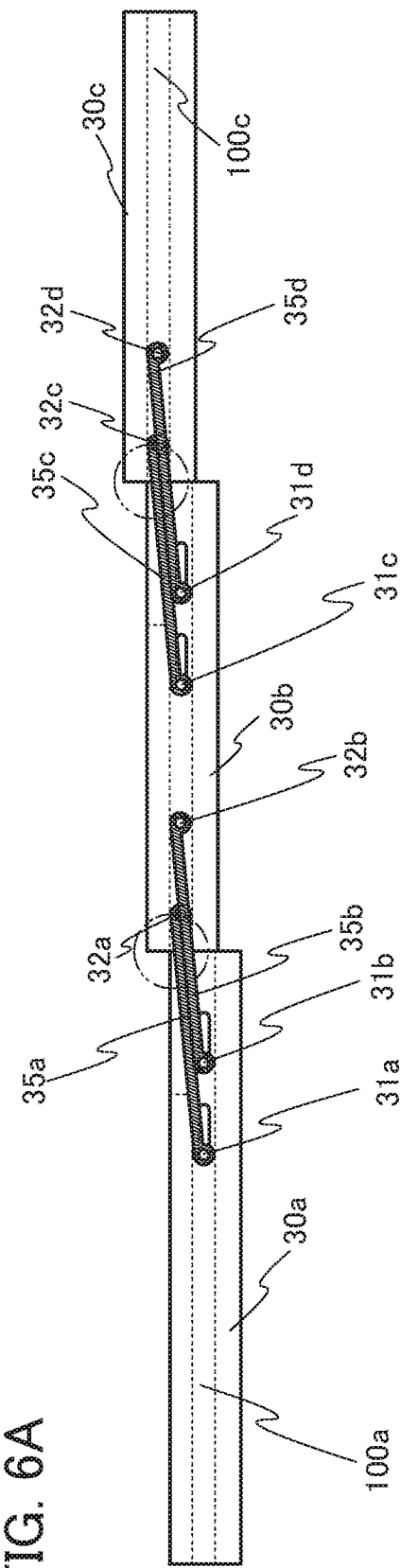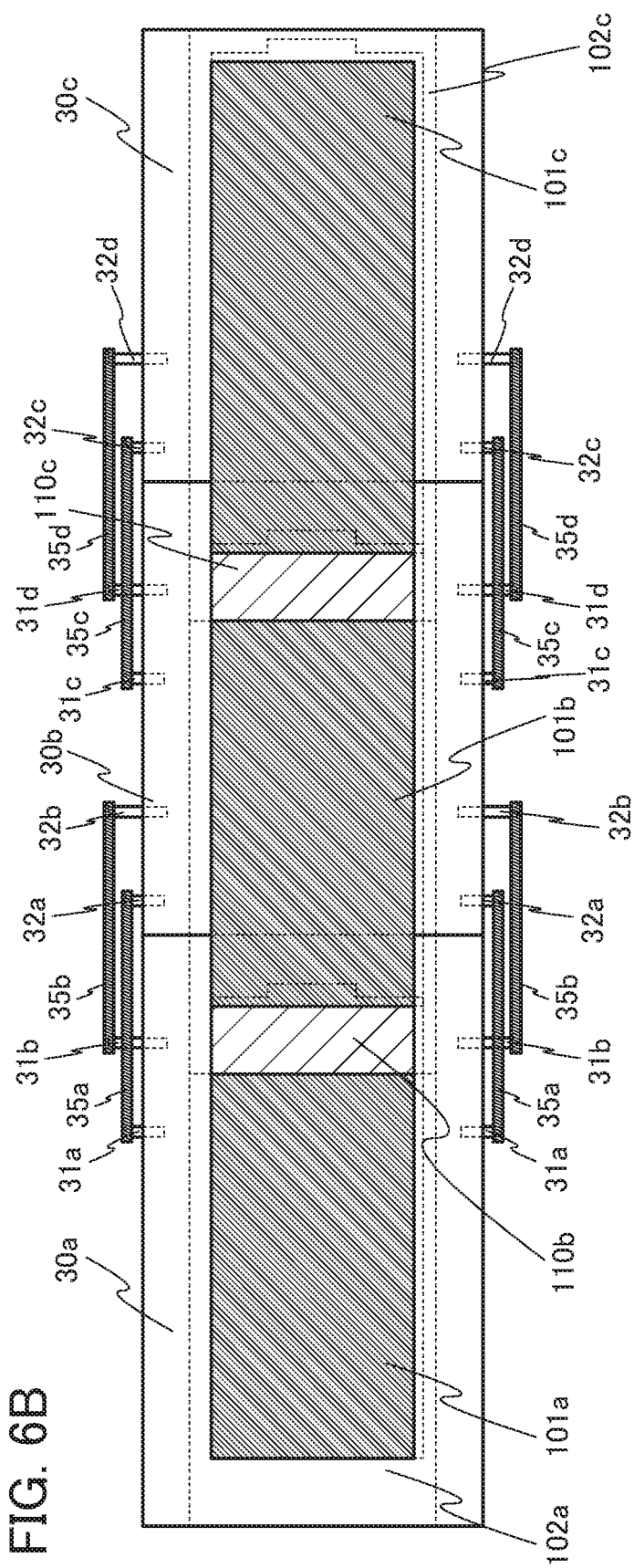

FIG. 8A1
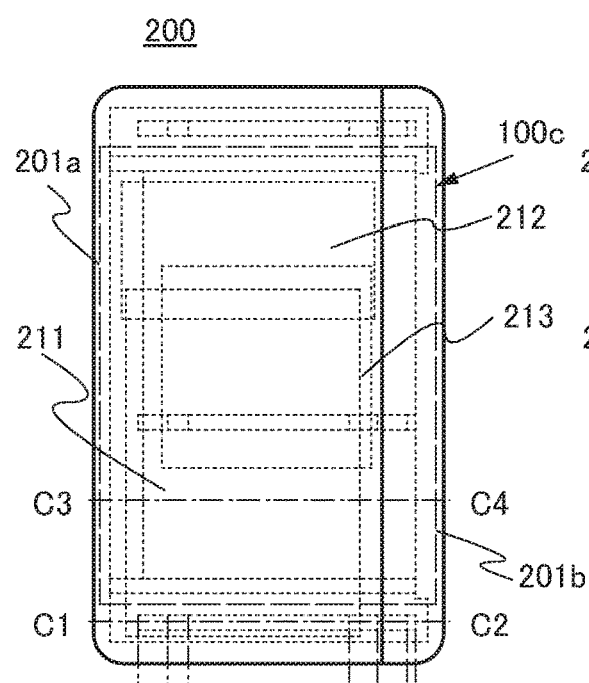
FIG. 8B1
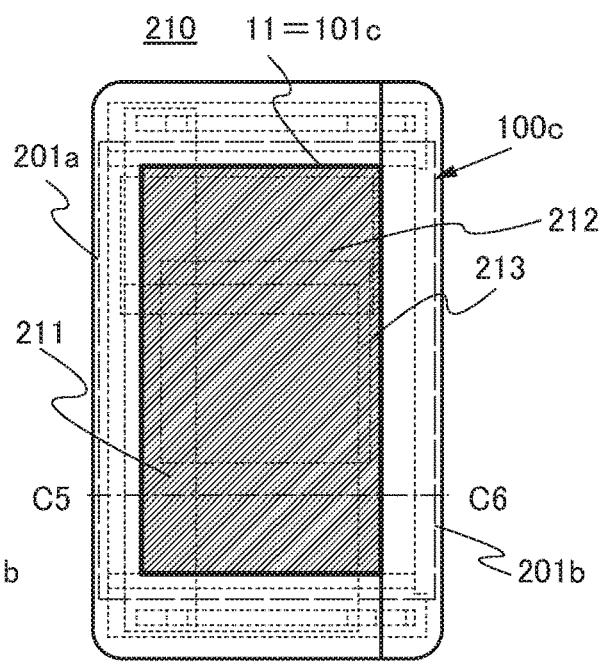
FIG. 8A2
FIG. 8A3
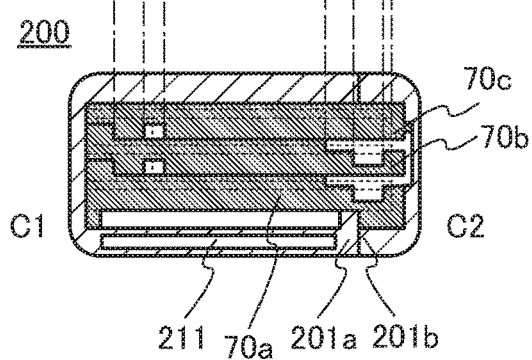
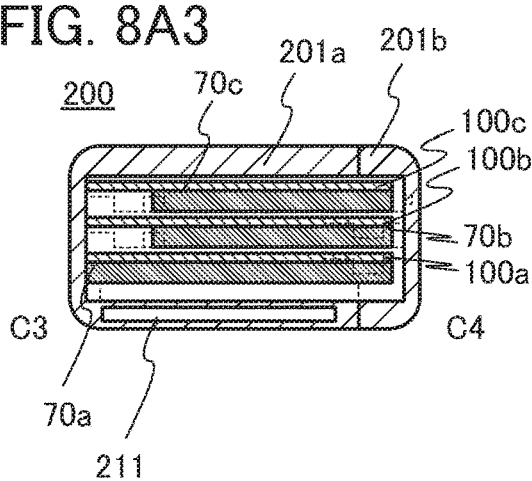
FIG. 8B2
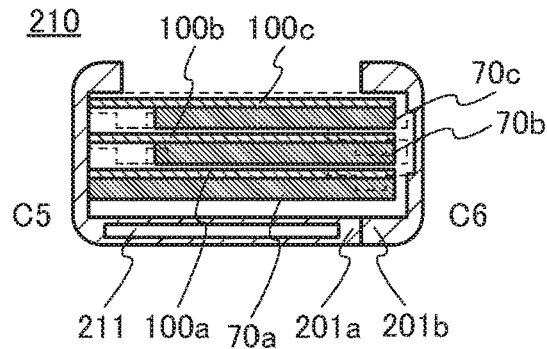
FIG. 8B3
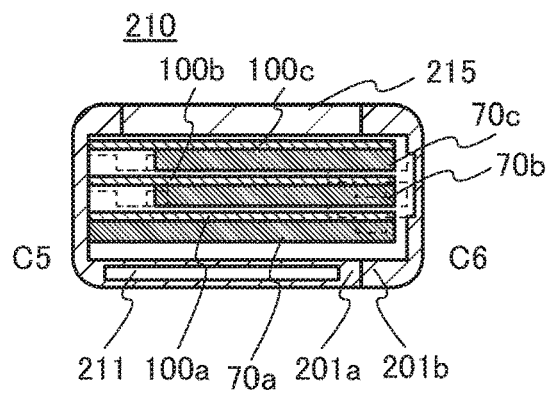

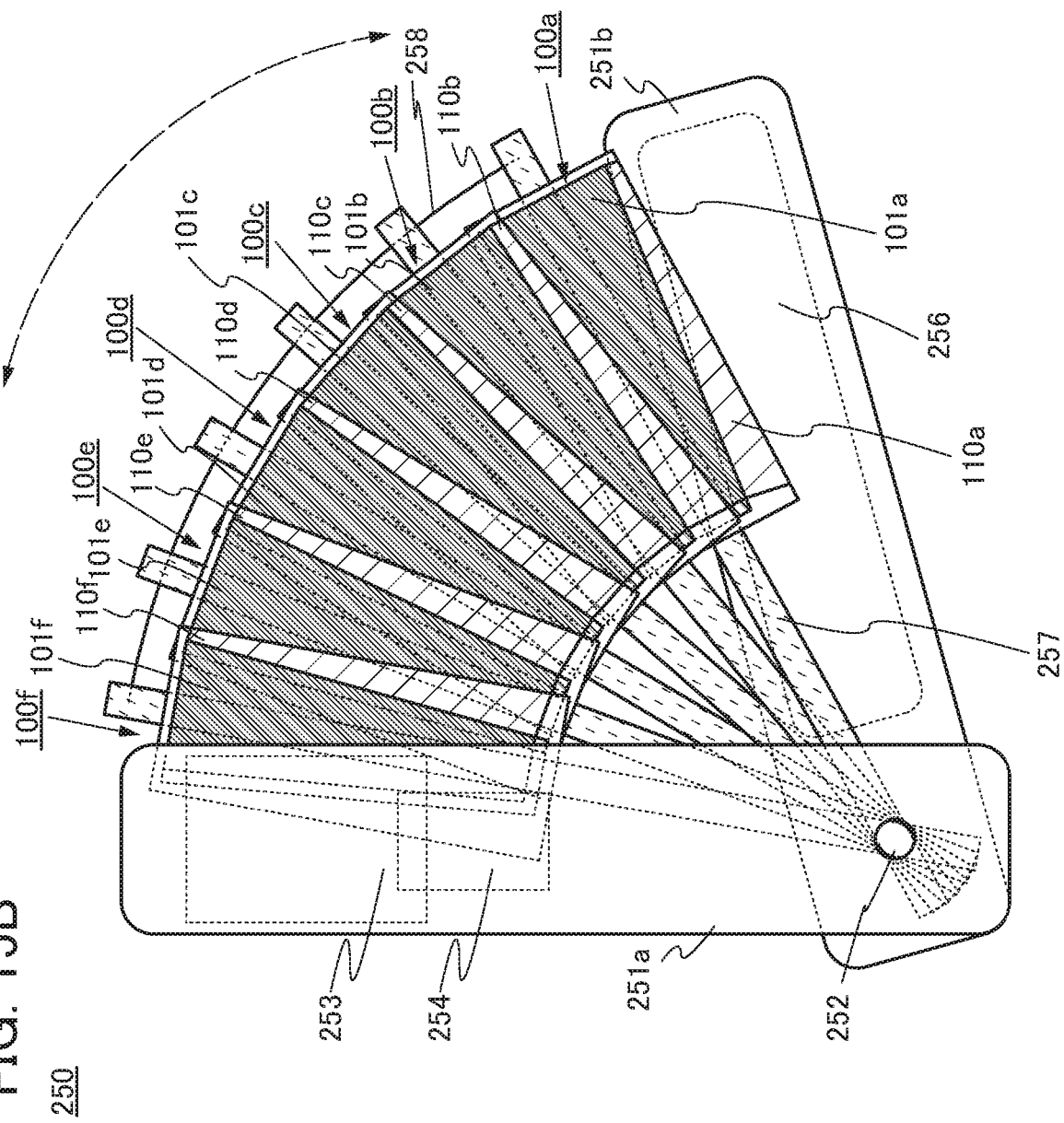
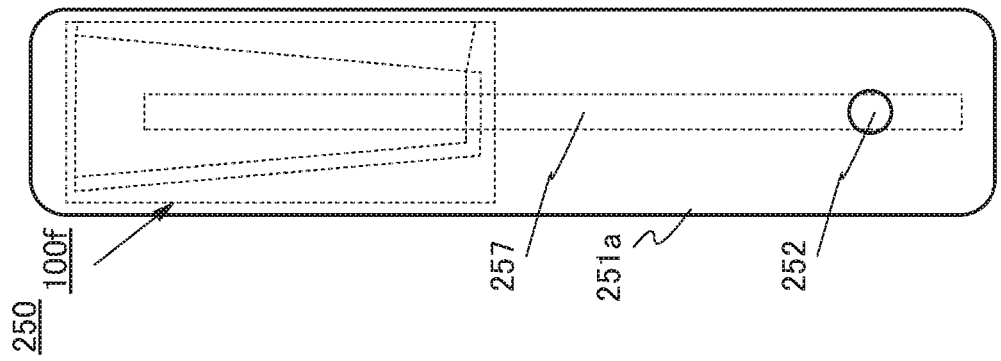
FIG. 15A
FIG. 15B

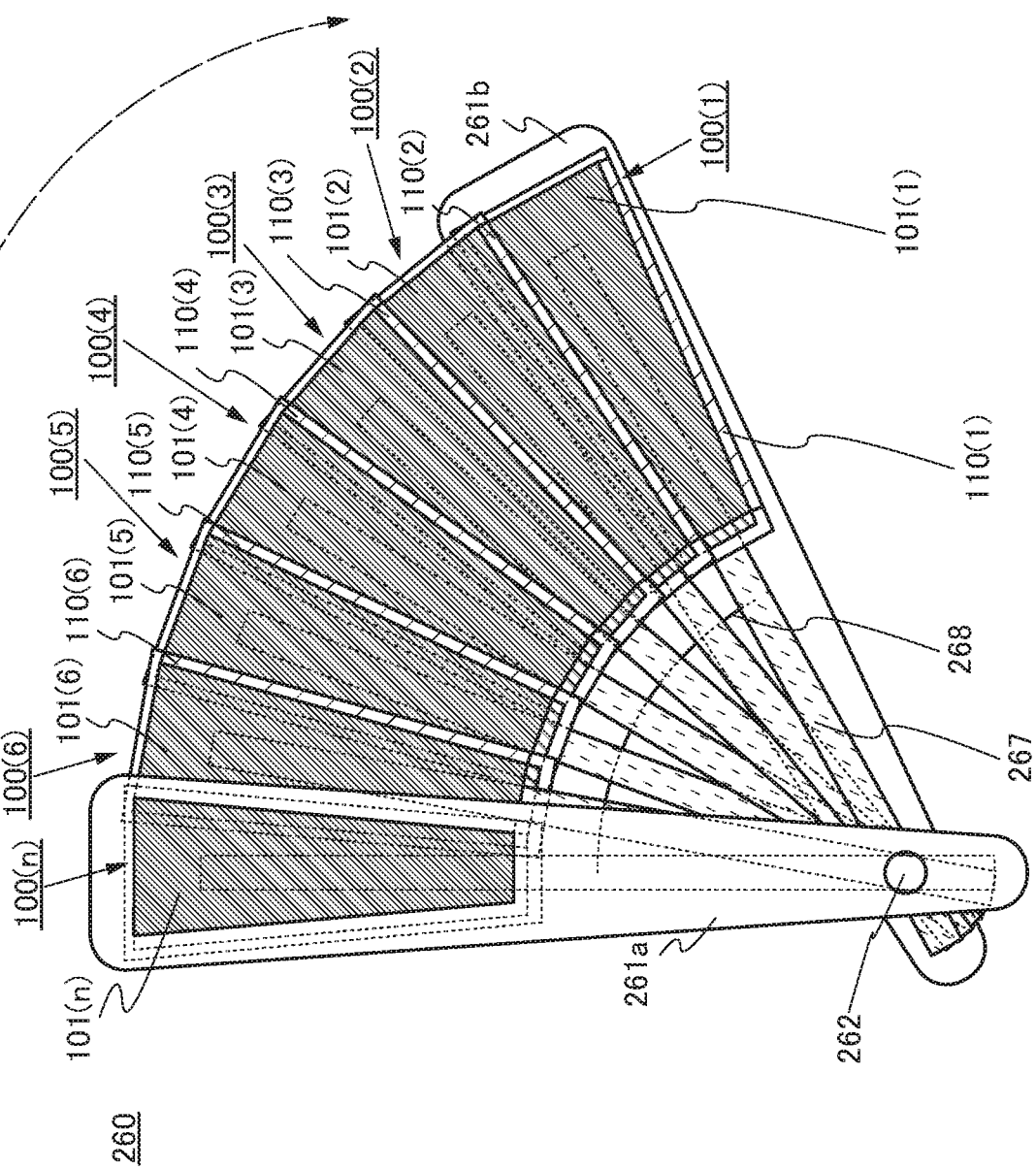
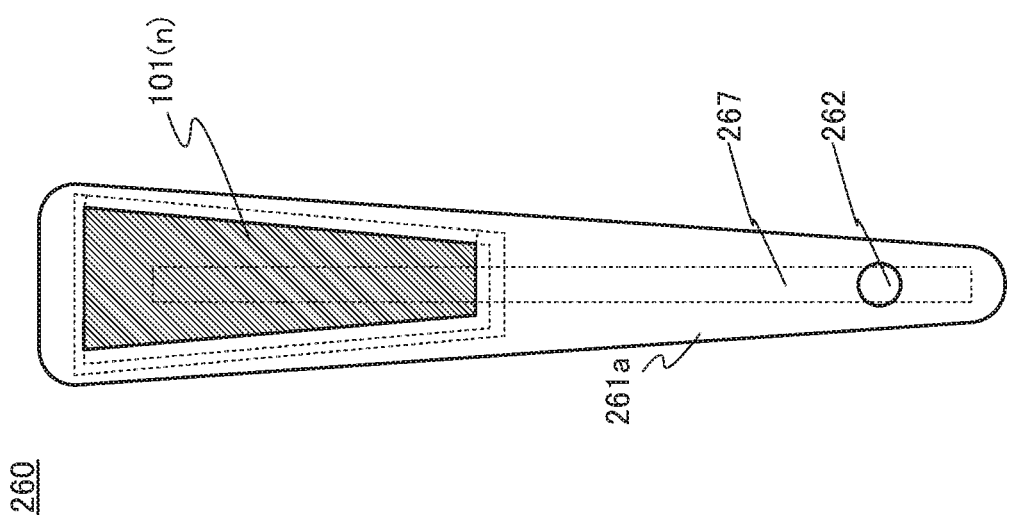

FIG. 18A2
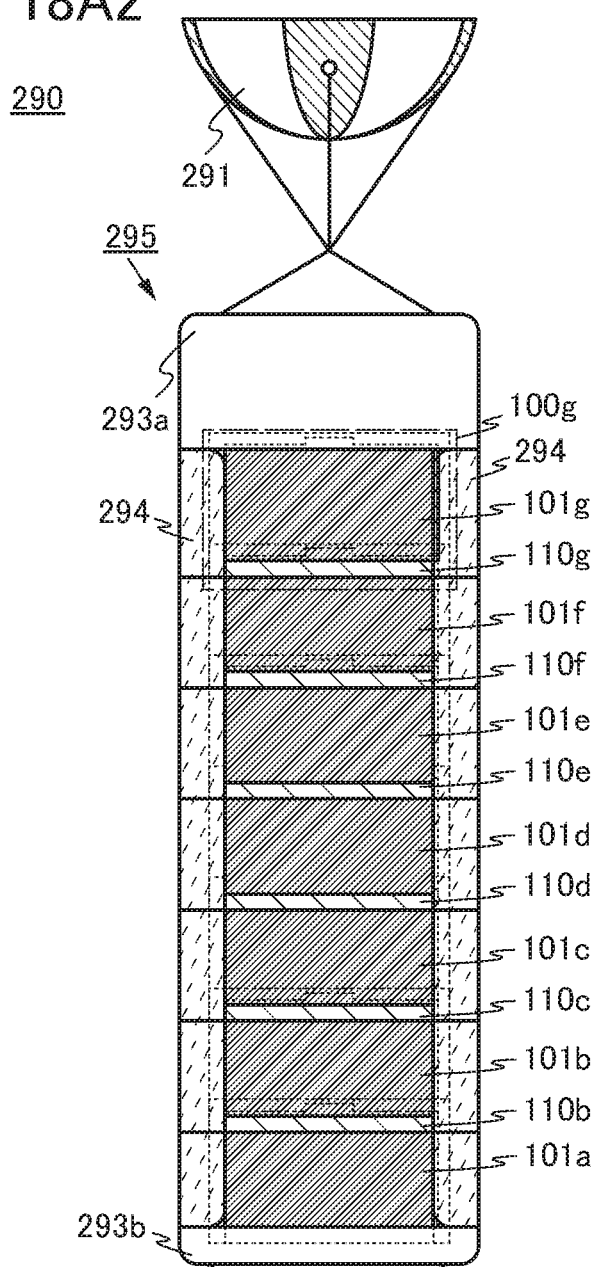
FIG. 18A1
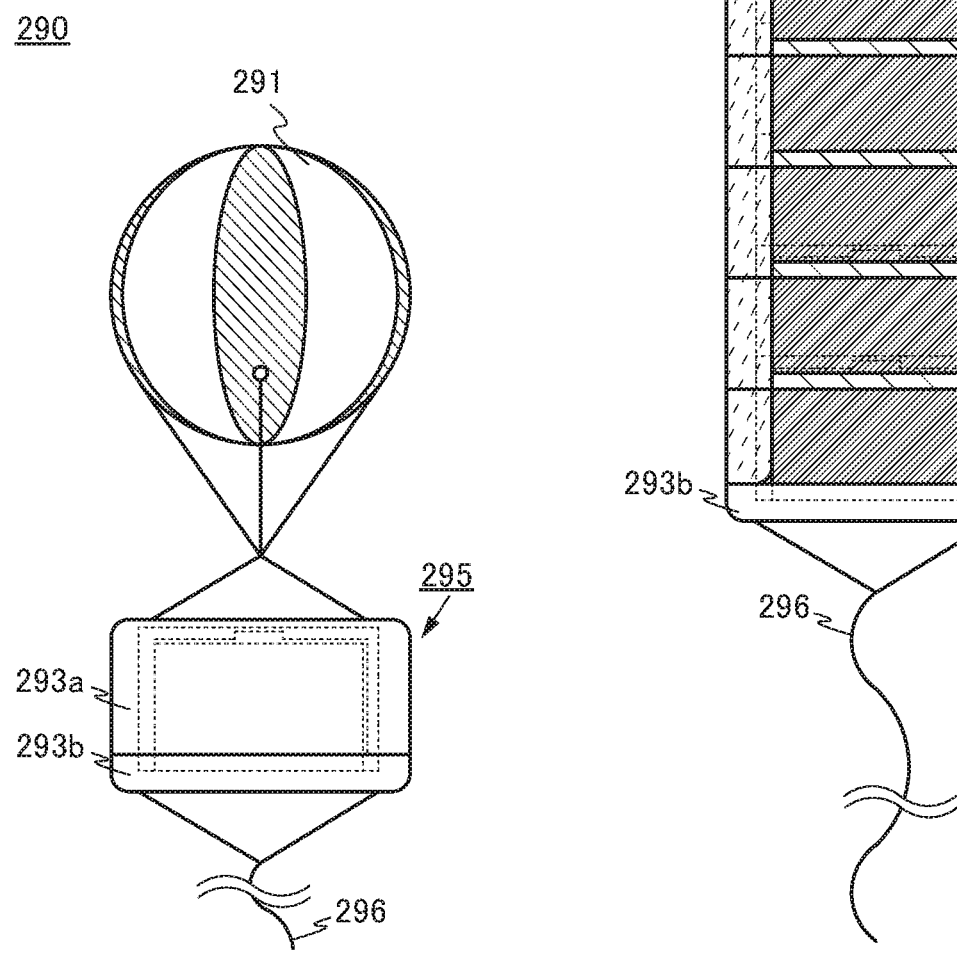

FIG. 19A1
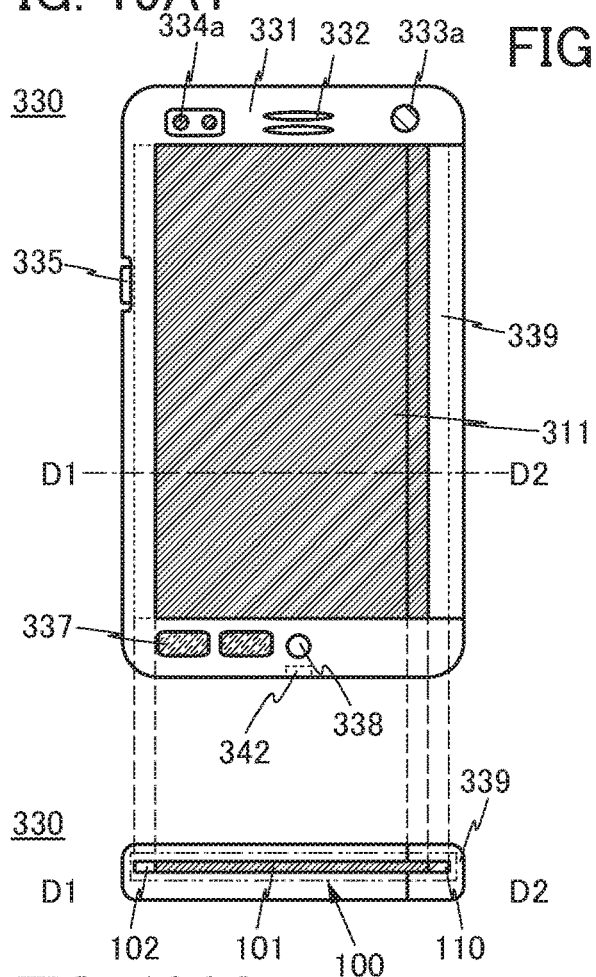
FIG. 19B
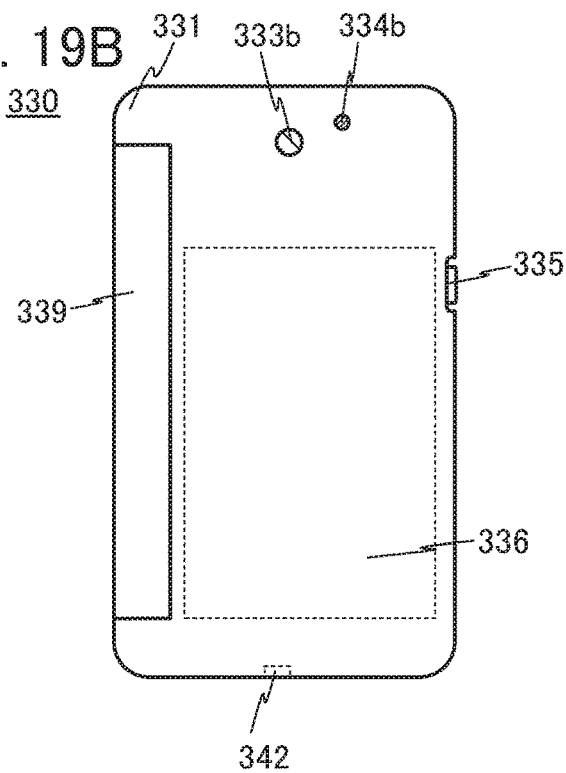
FIG. 19A2
FIG. 19C
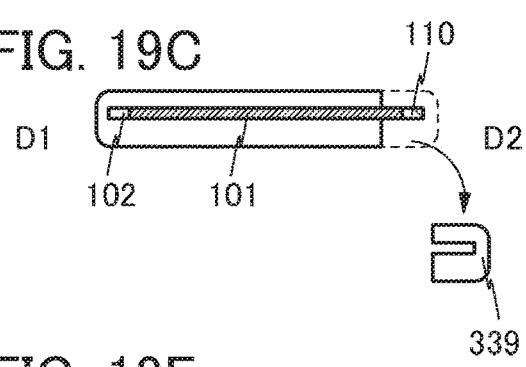
FIG. 19E
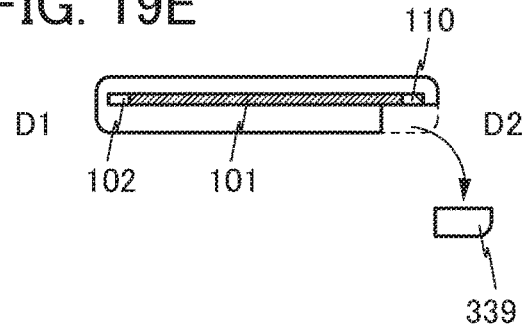
FIG. 19D
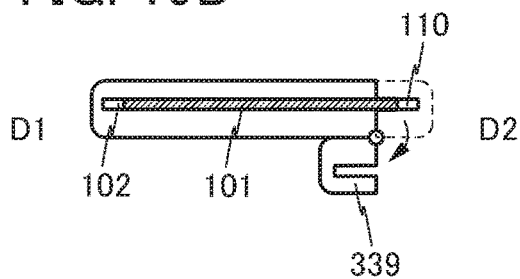
FIG. 19F
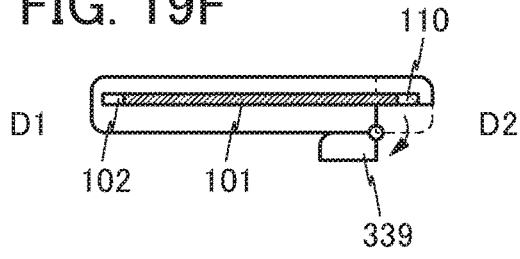

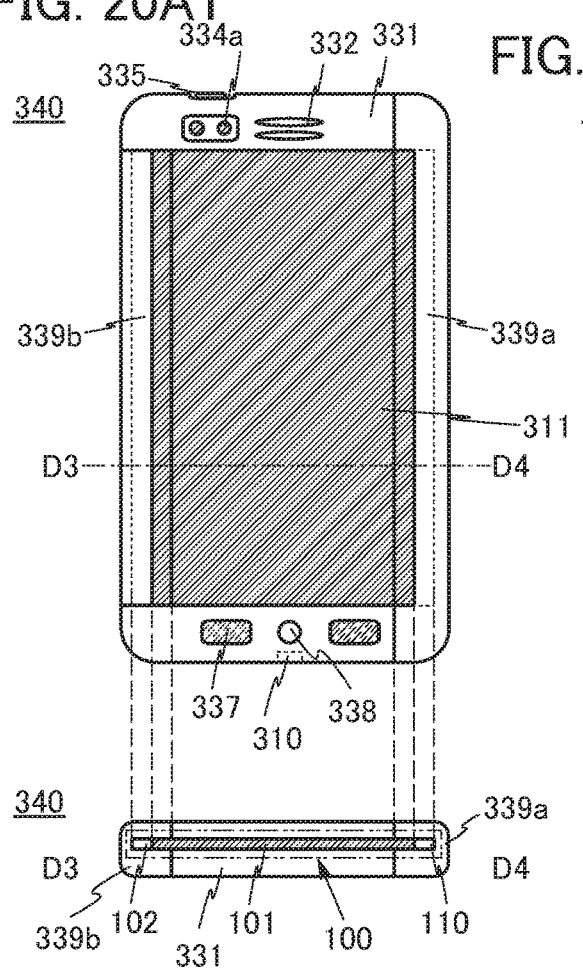
FIG. 20A1
FIG. 20A2
FIG. 20C
FIG. 20E
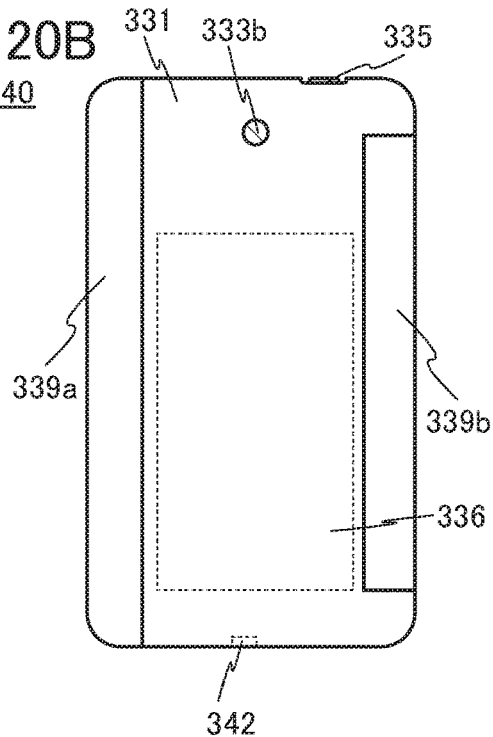
FIG. 20B
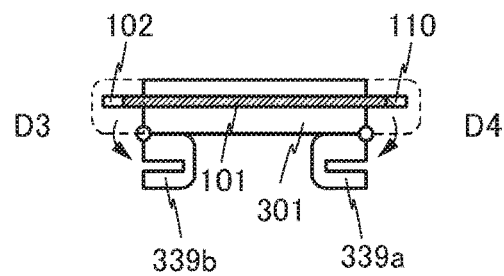
FIG. 20D
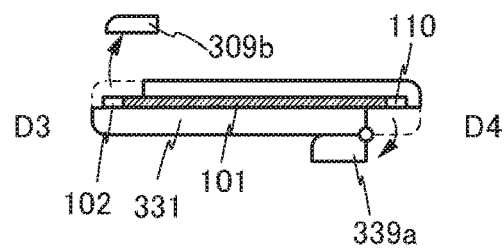
FIG. 20F
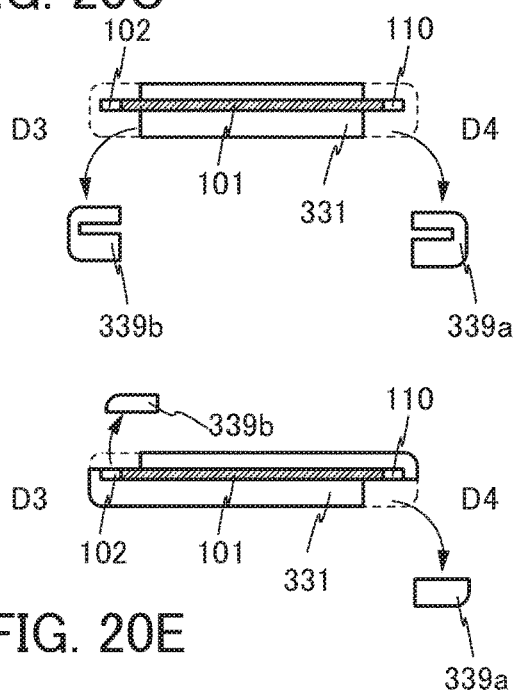

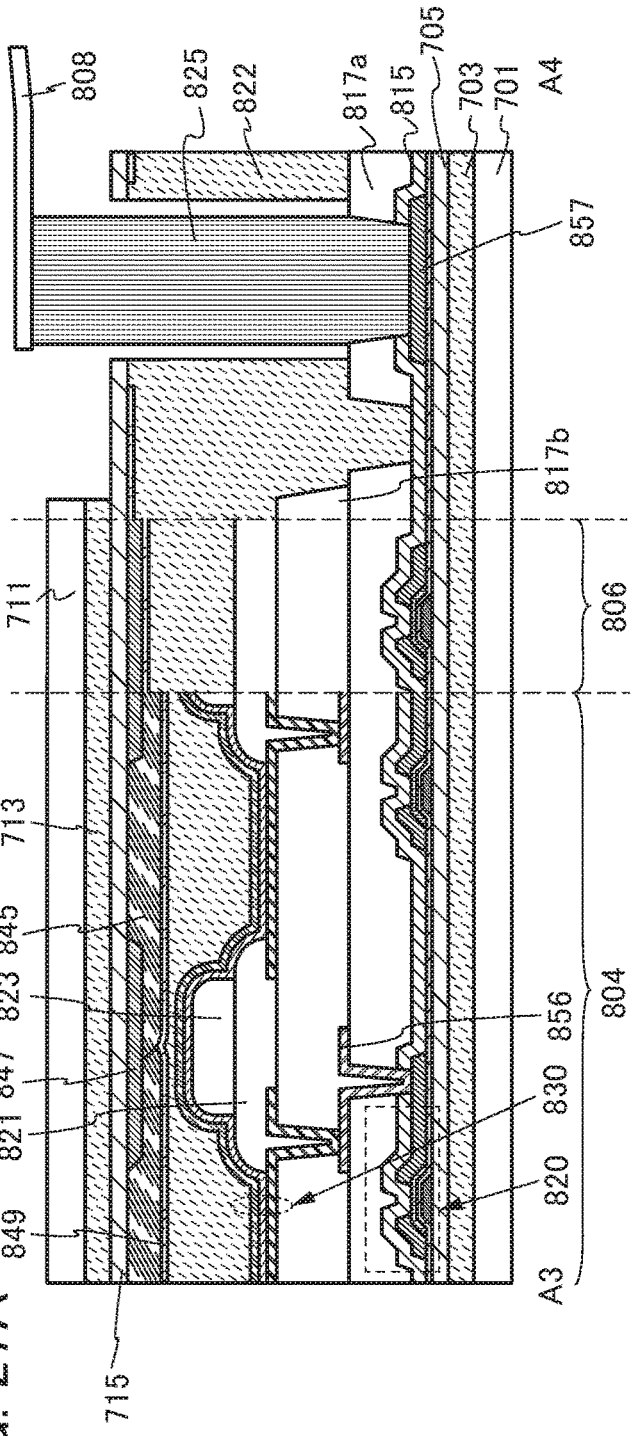
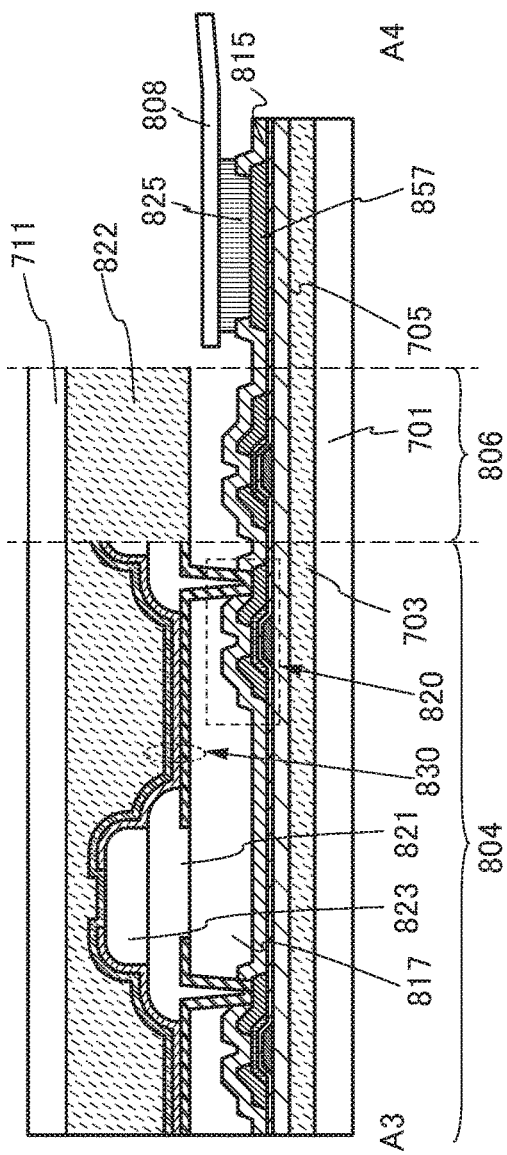
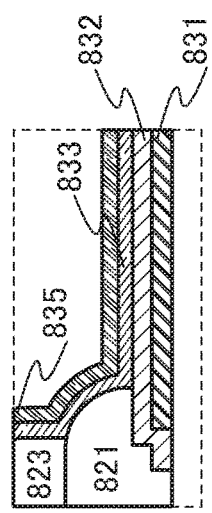
FIG. 27A
FIG. 27B
FIG. 27C

DISPLAY DEVICE AND ELECTRONIC DEVICE

TECHNICAL FIELD

One embodiment of the present invention relates to a display device and an electronic device.

Note that one embodiment of the present invention is not limited to the above technical field. As examples of the technical field of one embodiment of the present invention, a semiconductor device, a display device, a light-emitting device, a power storage device, a memory device, an electronic device, a lighting device, an input device (e.g., a touch sensor), an input-output device (e.g., a touch panel), a driving method of them, and a manufacturing method of them can be given.

BACKGROUND ART

In recent years, light-emitting devices and display devices are expected to be applied to a variety of uses and required to be diversified.

Increase in the size of display devices has been required for uses in a television device for home use (also referred to as a TV or a television receiver), digital signage (Digital Signage: electronic signboard), PID (a public information display), and the like, for example. A larger display region of a display device can provide more information at a time. In addition, a larger display region is likely to attract more attention of people, so that the effectiveness of the advertisement is expected to be increased, for example.

In addition, for uses in mobile devices, the increase in the size of a display device has been required. Increasing the amount of information to be displayed at a time by making a display region large to improve browsability has been considered. In contrast, for uses in mobile devices, reduction in the size of a display device has also been required to increase the portability.

Light-emitting elements (also referred to as EL elements) utilizing electroluminescence (electroluminescence, hereinafter, also referred to as EL) phenomenon have features such as ease of thinning and lightening, high-speed response to an input signal, and driving with a direct-current low voltage power source; thus, application to display devices has been considered.

For example, Patent Document 1 discloses a flexible light-emitting device to which an organic EL element is applied.

PRIOR ART DOCUMENT

Patent Document

[Patent Document 1] Japanese Published Patent Application No. 2014-197522

SUMMARY OF THE INVENTION

Problems to be Solved by the Invention

An object of one embodiment of the present invention is to provide a display device or an electronic device having high portability. Alternatively, another object of one embodiment of the present invention is to provide a display device or an electronic device having high browsability. Alternatively, another object of one embodiment of the present invention is to provide a display device or an electronic device that can perform display along a curved surface.

Alternatively, another object of one embodiment of the present invention is to provide a display device or an electronic device that is less likely to be broken. Alternatively, another object of one embodiment of the present invention is to provide a display device or an electronic device having high reliability. Alternatively, another object of one embodiment of the present invention is to provide a display device or an electronic device with low power consumption. Alternatively, another object of one embodiment of the present invention is to provide a novel light-emitting device, display device, input/output device, electronic device, lighting device, or the like.

Alternatively, another object of one embodiment of the present invention is to provide a lightweight display device or the like. Alternatively, another object of one embodiment of the present invention is to provide a display device with a small thickness or the like. Alternatively, another object of one embodiment of the present invention is to provide a flexible display device or the like. Alternatively, another object of one embodiment of the present invention is to provide a light-emitting device or lighting device with a seamless large light-emitting region or a display device, input/output device, or electronic device with a seamless large display region.

Note that the descriptions of these objects do not disturb the existence of other objects. Note that in one embodiment of the present invention, there is no need to achieve all the objects. Note that objects other than them can be derived from the description of the specification, the drawings, and the claims.

Means for Solving the Problems

One embodiment of the present invention is a display device including a first display panel and a second display panel. The first display panel includes a first region. The first region has a function of performing display. The second display panel includes a second region and a third region. The second region has a function of performing display. The third region is adjacent to the second region and has a function of transmitting visible light. Furthermore, the display device includes a first portion. In the first portion, the first display panel and at least the third region of the second display panel overlap with each other. The area of the first portion is variable.

In the display device with the above structure, it is preferable that at least parts of end portions of the first display panel and the second display panel be able to overlap with each other. In the case where one display panel is a tetragon, for example, it is preferable that the end portions be able to overlap with each other in a state of being aligned at three or more sides.

It is preferable that the display device with each of the above structures have a function of fixing the positions of the first display panel and the second display panel in a first state. In the first state, a surface of the first region where display is performed (also referred to as a display surface) overlaps with the third region.

Alternatively, one embodiment of the present invention is a display device including a first display panel, a second display panel, a first support panel, a second support panel, and a hinge portion. The first display panel includes a first region. The first region has a function of performing display. The second display panel includes a second region and a third region. The second region has a function of performing display. The third region is adjacent to the second region and has a function of transmitting visible light. The first support panel supports the first display panel. The second support panel supports the second display panel. The hinge portion connects the first support panel and the second support panel such that the relative positional relationship between the first support panel and the second support panel is variable. Furthermore, the display device includes a first portion. In the first portion, the first display panel and at least the third region of the second display panel overlap with each other. The area of the first portion is variable. That is, it can also be said that the hinge portion connects the first support panel and the second support panel such that the area of the first portion is variable.

In the display device with the above structure, it is preferable that the hinge portion include a first unit and a second unit; the first unit and the second unit each include a first shaft, a second shaft, and an arm; the arm be connected to be rotatable about the first shaft; and the arm be connected to be rotatable about the second shaft.

Alternatively, in the display device with the above structure, it is preferable that the hinge portion include the first unit and the second unit; that the first unit and the second unit each include a first shaft, a second shaft, a third shaft, a first arm, and a second arm; that the first arm be connected to be rotatable about the first shaft; that the first arm be connected to be rotatable about the third shaft; that the second arm be connected to be rotatable about the second shaft; and that the second arm be connected to be rotatable about the third shaft.

In the display device with each of the above structures, it is preferable that an angle formed by a pixel included in the first region and a long side of the third region be greater than 0° and less than 50°. Alternatively, in the display device with each of the above structures, it is preferable that a region where the pixel included in the first region and the third region overlap with each other have an angle greater than 0° and less than 50°.

Alternatively, the display device with each of the above structures may include a module such as a module in which a connector such as an FPC (flexible printed circuit) or a TCP (tape carrier package) is attached to each of the first display panel and the second display panel; or a module in which an IC is mounted thereon by a COG (chip on glass) method, a COF (chip on film) method, or the like.

Alternatively, in one embodiment of the present invention, any of the above structures may be applied not to the display device but to a light-emitting device or an input/output device (a touch panel or the like).

Alternatively, one embodiment of the present invention is an electronic device including a first display panel, a housing, and a communication means. In the housing, the first display panel is positioned. The first display panel includes a first region and a second region. The first region has a function of performing display. The second region is adjacent to the first region and has a function of transmitting visible light. The housing has a mechanism which exposes the second region. The electronic device has a function of using the first display panel and a second display panel included in another electronic device as one display region in such a manner that the second region overlaps with part of the second display panel, and communication with the other electronic device is performed using the communication means.

Alternatively, one embodiment of the present invention is an electronic device including a first display panel, a housing, and a communication means. In the housing, the first display panel is positioned. The first display panel includes a first region. The first region has a function of performing display. The housing has a mechanism which can expose the first region. The electronic device has a function of using the first display panel and a second display panel included in another electronic device as one display region in such a manner that the first region overlaps with a visible-light-transmitting portion of the second display panel, and communication with the other electronic device is performed using the communication means.

Alternatively, one embodiment of the present invention is an electronic device including a first display panel, a housing, and a communication means. In the housing, the first display panel is positioned. The first display panel includes a first region and a second region. The first region has a function of performing display. The second region is adjacent to the first region and has a function of transmitting visible light. The housing has a mechanism which can expose the first region and the second region on different sides of a display surface of the first display panel. The electronic device has a function of using the first display panel and a second display panel included in another electronic device as one display region in such a manner that the first region overlaps with part of the second display panel, and communication with the other electronic device is performed using the communication means. The electronic device has a function of using the first display panel and a third display panel included in another electronic device as one display region in such a manner that the second region overlaps with a visible-light-transmitting portion of the third display panel, and communication with the other electronic device is performed using the communication means.

In the electronic device having each of the above structures, it is preferable that at least one of the first region and the second region be able to be exposed by detachment or rotation of part of the housing.

Alternatively, one embodiment of the present invention is an electronic device including a first display panel, a housing, and a communication means. The first display panel is positioned in the housing. The first display panel includes a first region and a second region. The first region has a function of performing display. The second region is adjacent to the first region and has a function of transmitting visible light. The housing includes a portion which overlaps with the second region and transmits visible light. The electronic device has a function of using the first display panel and a second display panel included in another electronic device as one display region in such a manner that the visible-light-transmitting portion of the housing overlaps with part of the second display panel, and communication with the other electronic device is performed using the communication means.

It is preferable that the electronic device having each of the above structures include at least any one of an antenna, a battery, a speaker, a microphone, and an operation button.

In the display device and electronic device having each of the above structures, it is preferable that the first display panel have flexibility. Moreover, in the display device having each of the above structures, it is preferable that the second display panel have flexibility.

In the display device and electronic device having each of the above structures, it is preferable that the first display panel have a curved surface. In addition, in the display device having each of the above structures, it is preferable that the second display panel have a curved surface.

Effect of the Invention

According to one embodiment of the present invention, a display device or an electronic device having high portability can be provided. Alternatively, according to one embodiment of the present invention, a display device or an electronic device having high browsability can be provided. Alternatively, according to one embodiment of the present invention, a display device or an electronic device that can perform display along a curved surface can be provided.

Alternatively, according to one embodiment of the present invention, a display device or an electronic device which is less likely to be broken can be provided. Alternatively, according to one embodiment of the present invention, a display device or an electronic device having high reliability can be provided. Alternatively, according to one embodiment of the present invention, a display device or an electronic device with low power consumption can be provided. Alternatively, according to one embodiment of the present invention, a novel light-emitting device, display device, input/output device, electronic device, lighting device, or the like can be provided.

Alternatively, according to one embodiment of the present invention, a lightweight display device or the like can be provided. Alternatively, according to one embodiment of the present invention, a display device with a small thickness, or the like can be provided. Alternatively, according to one embodiment of the present invention, a flexible display device or the like can be provided. Alternatively, according to one embodiment of the present invention, a light-emitting device or lighting device with a seamless large light-emitting region or a display device, input/output device, or electronic device with a seamless large display region can be provided.

Note that the description of these effects does not preclude the existence of other effects. Note that one embodiment of the present invention does not necessarily have all the effects. Note that other effects can be derived from the description of the specification, the drawings, and the claims.

BRIEF DESCRIPTION OF DRAWINGS

FIG. 1 Diagrams illustrating an example of a display device.
FIG. 3 Diagrams illustrating an example of a display device.
FIG. 6 Diagrams illustrating an example of a display device.
FIG. 8 Diagrams illustrating examples of an electronic device.
FIG. 15 Diagrams illustrating an example of an electronic device.
FIG. 16 Diagrams illustrating an example of an electronic device.
FIG. 18 Diagrams illustrating an example of an electronic device.
FIG. 19 Diagrams illustrating examples of an electronic device.
FIG. 20 Diagrams illustrating examples of an electronic device.
FIG. 27 Diagrams illustrating examples of a light-emitting panel.

MODE FOR CARRYING OUT THE INVENTION

Figure 2A:
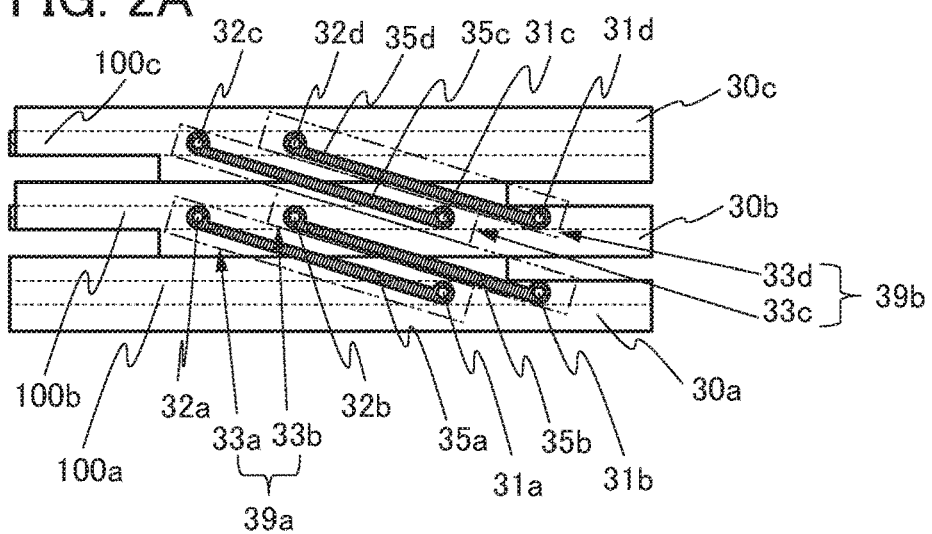
FIG. 2 Diagrams illustrating examples of a display device.

Embodiments will be described in detail with reference to the drawings. Note that the present invention is not limited to the following description. It will be readily appreciated by those skilled in the art that modes and details thereof can be modified in various ways without departing from the spirit and scope of the present invention. Therefore, the present invention should not be interpreted as being limited to the description of embodiments below.

Note that in structures of the present invention described below, the same portions or portions having similar functions are denoted by the same reference numerals in different drawings, and their repetitive description is omitted. Furthermore, the same hatching pattern is applied in the case of indicating similar functions, and they are not especially denoted by reference numerals in some cases.

Moreover, the position, size, range, or the like of each structure illustrated in drawings does not represent an actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". Also, the term "insulating film" can be changed into the term "insulating layer", for example.

(Embodiment 1)

In this embodiment, a display device and an electronic device of one embodiment of the present invention are described with reference to FIG. 1 to FIG. 18.

When a plurality of display panels are arranged in one or more directions (e.g., in one column or in matrix), a display device with a large display region can be manufactured.

In the case where a large display device is manufactured using a plurality of display panels, the size of one display panel is not required to be large. Thus, an apparatus for manufacturing the display panel does not need to be increased in size, whereby space-saving can be achieved. Furthermore, since an apparatus for manufacturing small- and medium-sized display panels can be used and a novel apparatus for manufacturing large display devices does not need to be used, manufacturing cost can be suppressed. In addition, a decrease in yield caused by an increase in the size of a display panel can be suppressed.

A display device including a plurality of display panels has a larger display region than a display device including one display panel when the display panels have the same size, and has an effect of being capable of displaying a large amount of information at a time, for example.

However, each of the display panels has a non-display region that surrounds a display region. Thus, for example, in the case where output images of a plurality of display panels are used to display one image, the one image is visually recognized by a user of the display device as being divided.

Making the non-display regions of the display panels small (using display panels with narrow frames) can prevent an image on the display panels from appearing divided; however, it is difficult to totally remove the non-display region of the display panel.

A small non-display region of the display panel leads to a decrease in the distance between an edge of the display panel and an element in the display panel, in which case the element easily deteriorates by impurities entering from outside the display panel in some cases.

Thus, in a display device of one embodiment of the present invention, a plurality of display panels are provided to overlap with each other. In two display panels overlapping with each other, at least a display panel positioned on the display surface side (upper side) includes a visible-light-transmitting region and a display region adjacent to each other. In one embodiment of the present invention, a display region of a display panel positioned on a lower side and the visible-light-transmitting region of the display panel positioned on the upper side overlap with each other. Thus, a non-display region between the display regions of the two overlapping display panels can be reduced and even removed. As a result, a large-sized display device in which a joint portion of the display panels is hardly seen by the user can be achieved.

At least part of a non-display region of the display panel positioned on the upper side is a visible-light-transmitting region and can overlap with the display region of the display panel positioned on the lower side. Furthermore, at least part of a non-display region of the display panel positioned on the lower side can overlap with the display region of the display panel positioned on the upper side or a visible-light-blocking region thereof. It is not necessary to reduce the areas because a reduction in the area of the frame of the display device (a reduction in area except in the display regions) is not affected by these regions.

A large non-display region of the display panel leads to an increase in the distance between the edge of the display panel and an element in the display panel, in which case the deterioration of the element due to impurities entering from outside the display panel can be suppressed. For example, in the case where an organic EL element is used as a display element, impurities such as moisture or oxygen are less likely to enter (or less likely to reach) the organic EL element from outside the display panel as the distance between the edge of the display panel and the organic EL element increases. Since a sufficient area of the non-display region of the display panel can be secured in the display device of one embodiment of the present invention, a highly reliable large display device can be achieved even when a display panel including an organic EL element or the like is used.

On the other hand, a large display device has difficulty in being carried around in some cases. Furthermore, a large storage space is necessary in some cases.

Moreover, an appropriate size of the display region varies depending on the use, and thus when the size of the display region of one display device is variable, the display device can be used in a variety of situations.

Thus, in the display device of one embodiment of the present invention, the area of a portion where two display panels overlap with each other is variable. As the area where the two display panels overlap with each other is increased, the display device has a smaller size, so that higher portability can be obtained. Furthermore, since the area of the portion where the two display panels overlap with each other is variable, the area of the display region of the display device can also be variable. For example, the area of the display region of the display device is the largest when it is equal to the sum of the areas of the display regions of the plurality of display panels included in the display device, and as the area of a portion where two or more display panels overlap with each other is increased, the area of the display region of the display device becomes smaller.

<Example 1 of Display Device>

First, a display device of one embodiment of the present invention is described.

FIGS. 1(A1), (B1), and (C1) each illustrate a top view of a display device 10.

The display device 10 includes a display panel 100a, a display panel 100b, and a display panel 100c.

FIGS. 1(A2) and (A3) each illustrate a side view of the display device 10 illustrated in FIG. 1(A1). FIG. 1(A2) is a side view of the display panels on the long side, and FIG. 1(A3) is a side view of the display panels on the short side. FIG. 1(B2) illustrates a side view of the display device 10 illustrated in FIG. 1(B1). FIG. 1(C2) illustrates a side view of the display device 10 illustrated in FIG. 1(C1). FIG. 1(B2) and FIG. 1(C2) are each a side view of the display panels on the short side.

The display panel 10 illustrated in FIGS. 1(C1) and (C2) includes the display panel 100b over the display panel 100a, and the display panel 100c over the display panel 100b.

The display device 10 can be changed from one of a state in FIG. 1(A1) and a state in FIG. 1(B1) to the other. Moreover, the display device 10 can be changed from one of the state in FIG. 1(B1) and a state in FIG. 1(C1) to the other. That is, the display device 10 can be changed from one of the state in FIG. 1(A1) and the state in FIG. 1(C1) to the other.

When the display device 10 is used, for example, display can be performed using a large display region 11 as indicated by a thick line in FIG. 1(A1). Furthermore, when the display device 10 is not used, as illustrated in FIGS. 1(B1) and (C1), the area where the two or more display panels overlap with each other is increased, so that the display device 10 can be reduced in size. Thus, the portability of the display device 10 can be increased. In addition, the storage space for the display device 10 can be made small.

Moreover, the display device 10 is a device in which the area of the display region 11 can be changed freely. As illustrated in FIGS. 1(A1) and (B1), display can be performed not only using the plurality of display panels, as illustrated in FIG. 1(C1), but display can be performed using only the display panel positioned on the top side. Note that in the case where display using the display device 10 is performed, one or more of the plurality of display panels may be used, and not all the display panels are necessarily used.

Furthermore, in the case where display using the display device 10 is performed, display using the entire display region of the respective display panels is not necessarily performed. As illustrated in FIG. 1(B1), for example, a region composed of the entire display region 101c, part of the display region 101b, and part of the display region 101a may be used as the display region 11 of the display device. In one embodiment of the present invention, it is preferable to obtain information such as the area of the region where the upper and lower display panels overlap with each other or coordinates at a boundary between the display region of the upper display panel and the display region of the lower display panel in the display region 11. For example, a support panel, a hinge portion, a housing, or the like, which is described later, preferably includes a sensor. As the sensor, an optical sensor such as an infrared ray sensor, an ultrasonic wave sensor, a switch, or the like can be given. With this, the display device can determine a region of the display regions of the display panels, which is used as the display region 11. For example, one image can be displayed on the display region 11. Moreover, when a portion of the display regions of the display panels, which is not used as the display region 11, does not perform display, the power consumption of the display device 10 can be reduced.

Note that although a display device including smooth display panels is mainly described as an example in this embodiment, in one embodiment of the present invention, the display panel may have a curved surface. One embodiment of the present invention is a display device which includes a plurality of curved display panels and in which the area where two display panels overlap with each other is variable. For example, a structure which includes the display panel 100a, the display panel 100b, and the display panel 100c, each of which is curved, and can be changed from one of a state in FIG. 1(A4) and a state in FIG. 1(C3) to the other can be given. Note that the display device may include both a curved display panel and a smooth display panel.

Furthermore, in one embodiment of the present invention, the display panel may have flexibility. For example, a structure which can be changed from one of the state in FIG. 1(A3) and the state in FIG. 1(A4) to the other is also one embodiment of the present invention. Note that in the case where the display panel is curved, curving may be performed such that the display surface faces inward (the display surface becomes a concave curved surface), or curving may be performed such that the display surface faces outward (the display surface becomes a convex curved surface).

Note that in this embodiment, to distinguish the display panels from each other, components included in the display panels from each other, or components relating to the display panels from each other, description is made with letters added to reference numerals. As long as there is no particular description, "a" is added to reference numerals for a display panel and components placed on the lowest side (the side opposite to the display surface side), and to one or more display panels and components placed thereover, "b", "c", and the like are added in alphabetical order from the lower side. Furthermore, as long as there is no particular description, even in the case of describing a structure in which a plurality of display panels is included, letters are omitted and description is made in the case where a common part of the display panels or the components is described.

In the case where the display panels included in the display device are individually detachable, when malfunction occurs in one of display panels, for example, only the defective display panel can be replaced with a new display panel. The continuous use of the other display panel enables the display device to be used longer and at lower cost.

Display panels 100 each include the display region 101 and a region 102. The display panel 100 may have flexibility.

The display region 101 includes a plurality of pixels arranged in matrix and can display an image. One or more display elements are provided in each pixel. As the display element, a light-emitting element such as an organic EL element, a liquid crystal element, or the like can be used, for example.

The region 102 is a region other than the display region 101 and can also be referred to as a non-display region. The region 102 includes a visible-light-transmitting region 110 and a visible-light-blocking region 120. The visible-light-transmitting region 110 and the visible-light-blocking region 120 are each adjacent to the display region 101. There is no limitation on the light-transmitting property of a portion of the region 102 excluding the visible-light-transmitting region 110 and the visible-light-blocking region 120.

A visible-light-transmitting material is used for the visible-light-transmitting region 110. A substrate, a bonding layer, or the like included in the display panel may also be included, for example. The visible-light-transmitting region 110 preferably has a higher transmittance of visible light because extraction efficiency of light from the display panel overlapped thereunder can be increased. For example, the visible-light-transmitting region 110 preferably has a light transmittance of higher than or equal to 70%, further preferably higher than or equal to 80%, and still further preferably higher than or equal to 90% on average at a wavelength longer than or equal to 450 nm and shorter than or equal to 700 nm. Note that in the display device, the display panel (here, the display panel 100a) placed on the lowest side (the side opposite to the display surface side) is not necessarily provided with the visible-light-transmitting region 110.

In the visible-light-blocking region 120, for example, a wiring electrically connected to the pixels (or display elements) included in the display region 101 is provided. Moreover, in addition to the wiring, driver circuits (such as a scan line driver circuit and a signal line driver circuit) for driving the pixels may be provided. Furthermore, the visible-light-blocking region 120 includes a terminal electrically connected to an FPC or the like (also referred to as a connection terminal), a wiring electrically connected to the terminal, and the like.

In FIG. 1(A1), the display panel 100b is placed so that part thereof overlaps an upper side (a display surface side) of the display panel 100a. Specifically, the visible-light-transmitting region 110b of the display panel 100b is provided to overlap the display region 101a of the display panel 100a. A visible-light-blocking region 120b of the display panel 100b is provided so as not to overlap the display region 101a of the display panel 100a. The display region 101b of the display panel 100b is provided to overlap the region 102a (including a visible-light-blocking region 120a) of the display panel 100a.

Similarly, in FIG. 1(A1), the display panel 100c is placed so that part thereof overlaps with an upper side (a display surface side) of the display panel 100b. Specifically, a visible-light-transmitting region 110c of the display panel 100c is provided to overlap the display region 101b of the display panel 100b. Furthermore, a visible-light-blocking region 120c of the display panel 100c is provided so as not to overlap the display region 101b of the display panel 100b. Moreover, a display region 101c of the display panel 100c is provided to overlap a region 102b of the display panel 100b (including the visible-light-blocking region 120b).

In FIG. 1(A1), the visible-light-transmitting region 110b overlaps the display region 101a; thus, a user of the display device 10 can visually recognize the entire display on the display region 101a even when the display panel 100b overlaps a display surface of the display panel 100a. Similarly, the visible-light-transmitting region 110c overlaps the display region 101b; thus, a user of the display device 10 can visually recognize the entire display on the display region 101b even when the display panel 100c overlaps a display surface of the display panel 100b.

Moreover, in FIG. 1(A1), the display region 101b of the display panel 100b overlaps the upper side of the region 102a (including the visible-light-blocking region 120a), whereby a non-display region is not visually recognized between the display region 101a and the display region 101b by a user. Similarly, the display region 101c of the display panel 100c overlaps the upper side of the region 102b (including the visible-light-blocking region 120b), whereby a non-display region is not visually recognized between the display region 101b and the display region 101c by the user. Therefore, a region where the display regions 101a, 101b, and 101c are placed seamlessly can serve as the display region 11 of the display device 10.

Furthermore, in the FIG. 1(B1), the visible-light-transmitting region 110b of the display panel 100b and the display region 101b are placed so as to overlap the display region 101a of the display panel 100a. Similarly, in FIG. 1(B1), the visible-light-transmitting region 110c of the display panel 100c and the display region 101c are placed so as to overlap the display region 101b of the display panel 100b. Thus, the display region 11 of the display device 10 in FIG. 1(B1) becomes small as compared to that in FIG. 1(A1), so that reduction in the size of the display device 10 can be achieved.

Moreover, in FIG. 1(C1), the display panel 100a, the display panel 100b, and the display panel 100c overlap with each other in a state where the four sides are aligned. The display regions 101 of the display panels overlap with each other, and the visible-light-transmitting regions 110 overlap with each other. Thus, it is particularly preferable that the plurality of display panels be able to overlap with each other in a state where end portions thereof are aligned at three or more sides because the display device can be reduced in size.

Note that the plurality of display panels does not necessarily have the same size. In the case where the display device includes display panels having a plurality of kinds of sizes, it is particularly preferable that the largest display panel overlap with end portions of the other display panels because the display device can be reduced in size.

Next, a mechanism in which the area of a portion where two display panels included in the display device of one embodiment of the present invention overlap with each other is variable is described.

The display device of one embodiment of the present invention includes support panels and a hinge portion. The support panels support display panels. The hinge portion connects the two support panels such that the relative positional relationship between two support panels is variable. Thus, the area of a portion where the two display panels overlap with each other can be variable. Furthermore, the area of a display region of the display device can be variable.

<Example 1 of Hinge Portion>

FIGS. 2(A) and (B) and FIG. 3(A) each illustrate a side view of the display device of one embodiment of the present invention. FIG. 3(B) illustrates a top view of the display device illustrated in FIG. 3(A).

The display device illustrated in FIG. 2(A) includes the display panel 100a, the display panel 100b, the display panel 100c, a support panel 30a, a support panel 30b, a support panel 30c, a first hinge portion 39a, and a second hinge portion 39b.

In FIG. 2(A), the display device includes the support panel 30a, the support panel 30b over the support panel 30a, and the support panel 30c over the support panel 30b. The support panel 30a supports the display panel 100a, the support panel 30b supports the display panel 100b, and the support panel 30c supports the display panel 100c. There is a possibility that the display panel 100a is damaged when the support panel 30b is moved and the display panel 100a is in contact with the support panel 30b, for example. Therefore, it is preferable that the display panel 100 not be in contact with the support panel 30 positioned on the upper side.

There is no particular limitation on the support panel as long as it has a structure capable of supporting the display panel. For example, an organic resin, a metal, wood, or the like may be used. As the support panel, a plate-like member may be used, and the display panel may be fixed and supported. For example, the display panel and the support panel may be bonded to each other. Moreover, the display panel may be attachable to and detachable from the support panel, e.g., the display panel and the support panel are fixed with a fastener or the like. Furthermore, as the support panel, two plate-like members may be used and sandwich the display panel. In the case where an electronic device or a display device has flexibility, a flexible member is also used for the support panel. In the case where a display region of the display panel overlaps with the support panel on the display surface side, it is preferable to use a visible-light-transmitting material for the support panel.

In this embodiment, the support panel 30 has a structure capable of sandwiching the region 102 which is a non-display region of the display panel 100. Note that the support panel 30 and the display panel 100 may be in contact with each other or may overlap with each other with another member interposed therebetween.

Each of the hinge portions includes two units parallel to each other. Specifically, the first hinge portion 39a includes a unit 33a and a unit 33b, and the second hinge portion 39b includes a unit 33c and a unit 33d.

The hinge portion may include at least one unit, but it is preferable that the hinge portion include two or more units parallel to each other because the movement of the support panel is limited and the relative positional relationship between the two support panels is easily controlled. Specifically, while display surfaces of two display panels are kept in a parallel state (kept facing the same direction), the relative position of one of the display panels with respect to the other of the display panels can be changed.

Each unit 33 includes a first shaft 31, a second shaft 32, and an arm 35. The arm 35 includes a bearing which supports the first shaft 31 and a bearing which supports the second shaft 32. The arm 35 is connected so as to be rotatable about the first shaft 31. Moreover, the arm 35 is connected so as to be rotatable about the second shaft 32. There is no particular limitation on a material for the arm 35, and a plate (a metal plate or the like), a spring, rubber, a thread, a wire (a metal wire or the like), or the like can be given. Not all the arms included in the display device are necessarily formed using the same material. The display device may include a plurality of kinds of arms, some of which are metal plates and others of which are springs, for example.

Figure 2B:
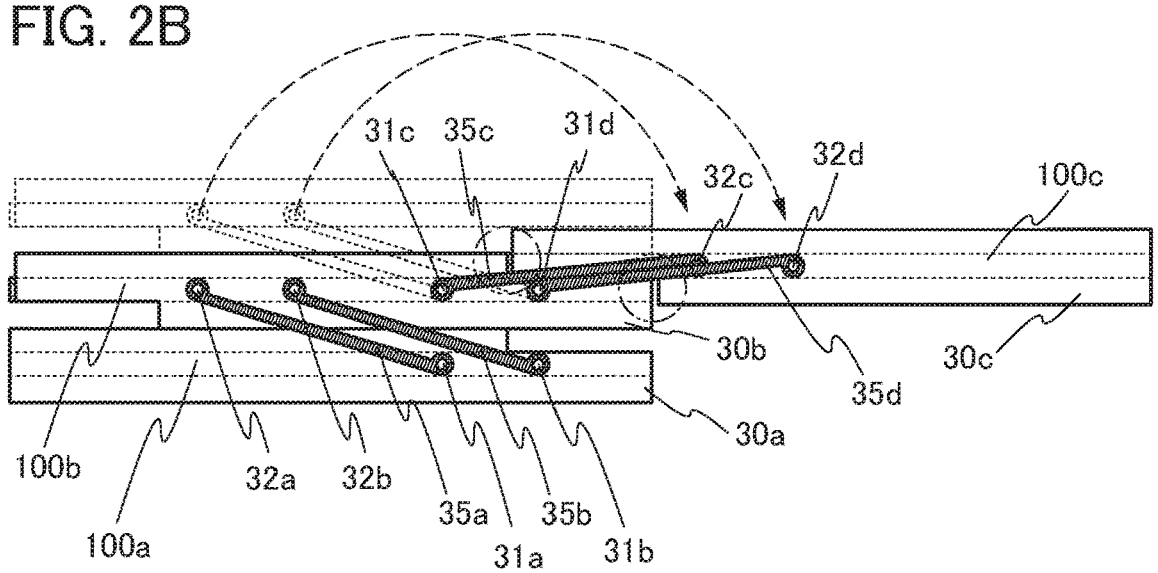

When the display device includes the hinge portion 39*b*, the display device can be changed from one of a state in FIG. 2(A) and a state in FIG. 2(B) to the other.

When the arm 35*c* is rotated about the first shaft 31*c* and the arm 35*d* is rotated about the first shaft 31*d* as indicated by dashed line arrows in FIG. 2(B), the area where the display panel 100*b* and the display panel 100*c* overlap with each other can be made small. It is preferable that the arm 35*c* and the arm 35*d* be capable of being rotated until the display panel 100*b* and the display panel 100*c* are in contact with each other. When the two display panels overlap so as to be in contact with each other, a step and a seam between the two display panels can be made inconspicuous.

Figure 2C:
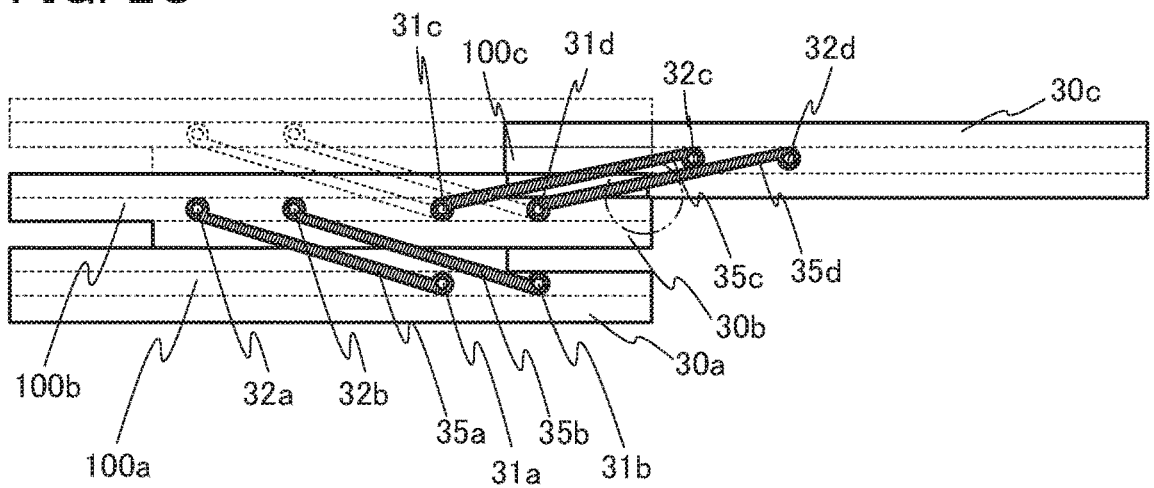

Here, in a display device of a comparative example illustrated in FIG. 2(C), as in a portion surrounded by a dashed-two dotted line, during rotation of the arms 35, the support panel 30*b* and the support panel 30*c*; the display panel 100*b* and the display panel 100*c*; and the like are in contact with each other to be rubbed in some cases. This causes damage to the display device, which is not preferable.

Therefore, as in portions surrounded by dashed-two dotted lines in FIG. 2(B), it is preferable to employ a structure in which a side surface of the support panel 30*c* on the support panel 30*b* side is not in contact with the support panel 30*b* when the display panel 100*b* and the display panel 100*c* are in contact with each other. Thus, when the relative positional relationship between the two support panels 30 is changed, the support panel 30 or the display panel 100 can be prevented from being rubbed and damaged, so that the reliability of the display device can be increased.

Similarly, when the display device includes the hinge portion 39*a*, the display device can be changed from one of the state in FIG. 2(B) and a state in FIG. 3(A) to the other.

When the arm 35*a* is rotated about the first shaft 31*a* and the arm 35*b* is rotated about the first shaft 31*b*, the area where the display panel 100*a* and the display panel 100*b* overlap with each other can be made small. It is preferable that the arm 35*a* and the arm 35*b* be capable of being rotated until the display panel 100*a* and the display panel 100*b* are in contact with each other.

In FIG. 3(B), the support panel 30 covers part of the display panel 100, and thus the region 102 which is a non-display region of the display panel 100 is prevented from being visually recognized by a user of the display device.

<Example 2 of Hinge Portion>

Figure 4A:
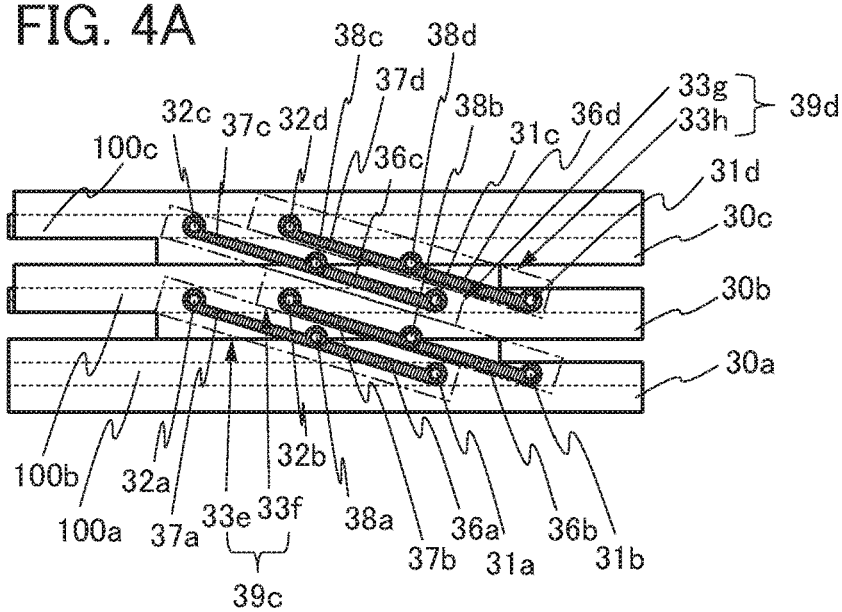
FIG. 4 Diagrams illustrating an example of the display device.
Figure 4B:
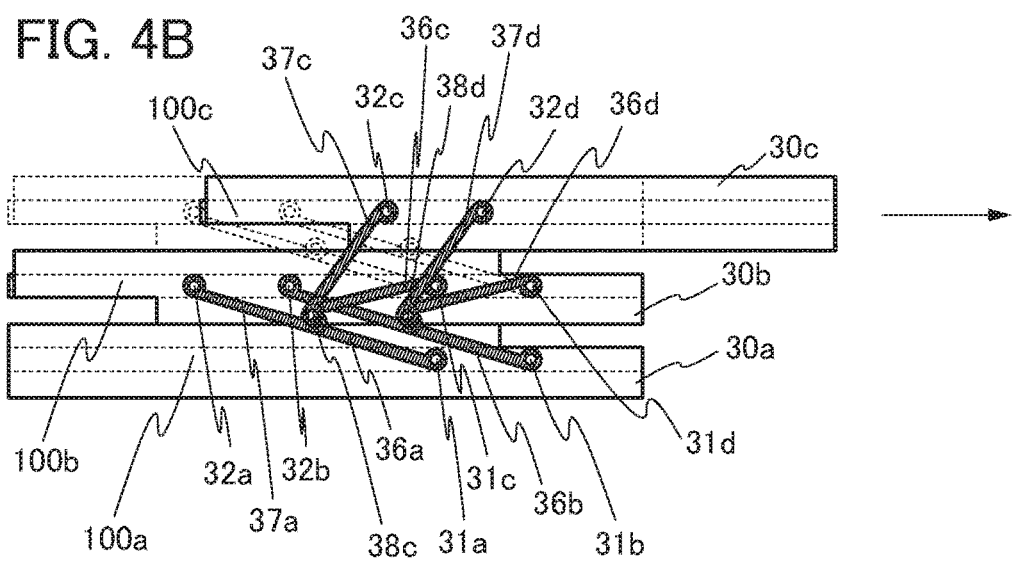
Figure 4C:
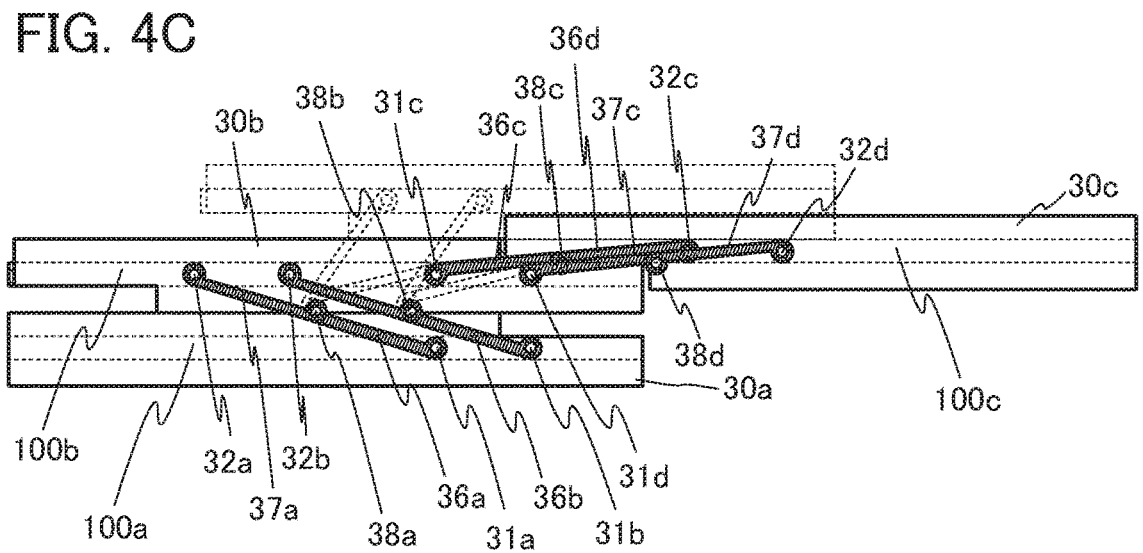

FIGS. 4(A)-(C) each illustrate a side view of the display device of one embodiment of the present invention.

The display device illustrated in FIG. 4(A) includes the display panel 100*a*, the display panel 100*b*, the display panel 100*c*, the support panel 30*a*, the support panel 30*b*, the support panel 30*c*, a first hinge portion 39*c*, and a second hinge portion 39*d*.

The first hinge portion 39*c* includes a unit 33*e* and a unit 33*f*, and the second hinge portion 39*d* includes a unit 33*g* and a unit 33*h*.

Each unit includes the first shaft 31, the second shaft 32, a third shaft 38, a first arm 36, and a second arm 37. The first arm 36 includes a bearing which supports the first shaft 31 and a bearing which supports the third shaft 38. The second arm 37 includes a bearing which supports the second shaft 32 and the bearing which supports the third shaft 38. The first arm 36 is connected so as to be rotatable about the first shaft 31. Moreover, the first arm 36 is connected so as to be rotatable about the third shaft 38. The second arm 37 is connected so as to be rotatable about the second shaft 32. Moreover, the second arm 37 is connected so as to be rotatable about the third shaft 38. Note that the value of an angle of rotation of the first arm 36 about the first shaft 31 and the value of an angle of rotation of the second arm 37 about the second shaft 32 may be the same or different.

When the display device includes the hinge portion 39*d*, the display device can be changed from one of a state in FIG. 4(A) and a state in FIG. 4(B) to the other.

In Example 1 of the hinge portion, as seen from tracks of the movement of the second shaft 32*c* and the second shaft 32*d* which are indicated by the dashed line arrows in FIG. 2(B), in order to rotate the arms, a large space is needed in a direction in which the display panels are stacked (a thickness direction of the display panels). Therefore, when the display panels are stored in a housing or the like, a space is needed in some cases.

In contrast, in Example 2 of the hinge portion, each unit includes two arms. Therefore, as for each unit, the first arm 36 can be rotated about the first shaft 31 by an angle $\theta$, and the second arm 37 can be rotated about the second shaft 32 by an angle $-\theta$. Thus, as illustrated in FIG. 4(B), without change in the relative positional relationship between the display panel 100*b* and the display panel 100*c* in the thickness direction of the display panels, the display panel 100*c* can be moved (slid) in a direction indicated by an arrow (also referred to as a horizontal direction or a direction parallel to a surface of the support panel which supports the display panel or a display surface of the display panel). Accordingly, the display device does not expand more in the thickness direction of the display panels than in the state illustrated in FIG. 4(A), and the display device or an electronic device can be reduced in size. As illustrated in FIG. 4(C), it is preferable that the first arms 36*c* and 36*d* and the second arms 37*c* and 37*d* each be capable of being rotated until the display panel 100*b* and the display panel 100*c* are in contact with each other.

Similarly, when the display device includes the hinge portion 39*c*, the area of a region where the display panel 100*a* and the display panel 100*b* overlap with each other can be variable.

<Example 3 of Hinge Portion>

FIGS. 5(A)-(C) and FIG. 6(A) each illustrate a side view of the display device of one embodiment of the present invention. FIG. 6(B) illustrates a top view of the display device illustrated in FIG. 6(A).

Figure 5A:
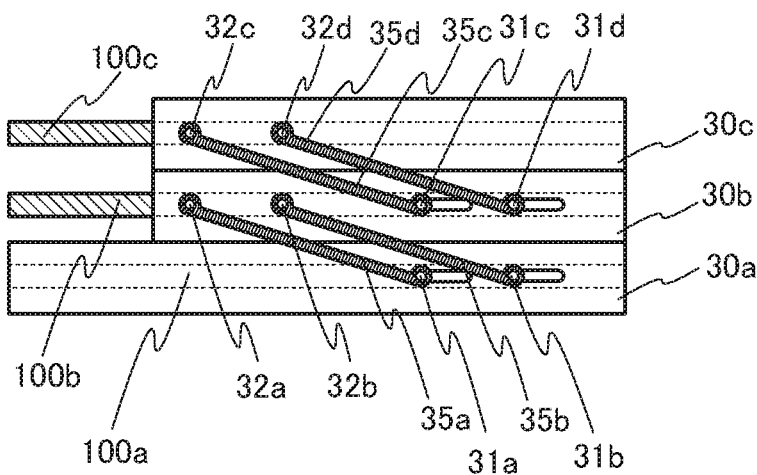
FIG. 5 Diagrams illustrating an example of a display device.
Figure 5B:
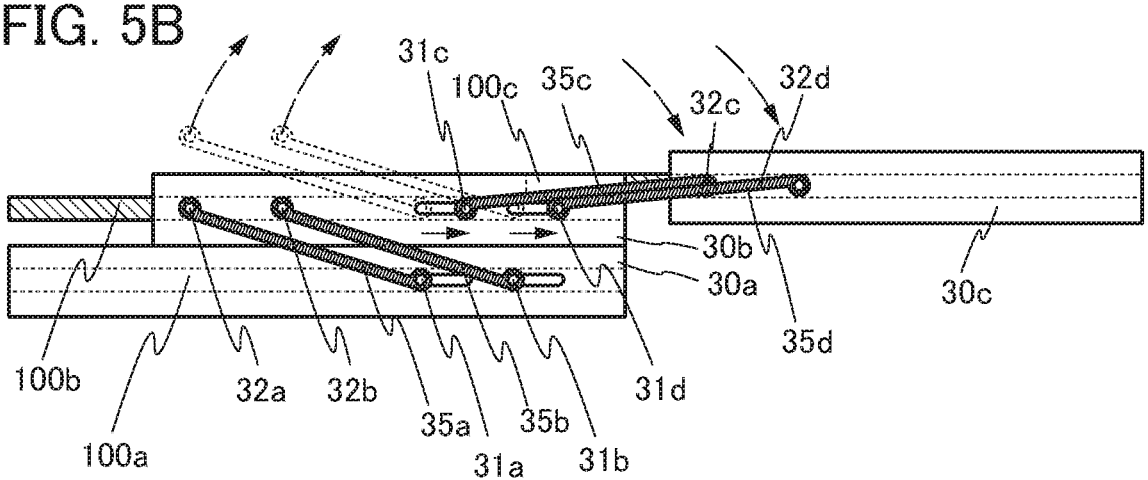
Figure 5C:
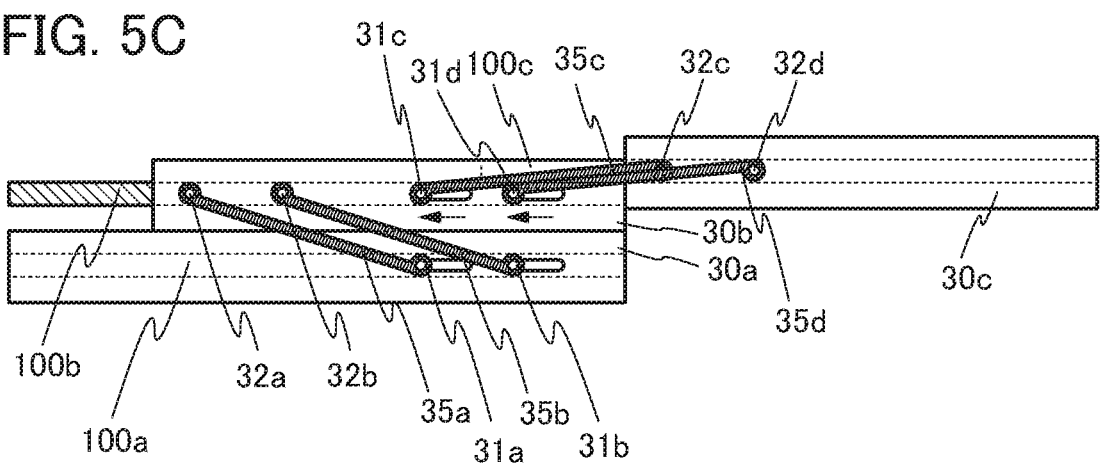

The display device illustrated in FIGS. 5(A)-(C) differs from the display device described in Example 1 of the hinge portion (see FIG. 2(A) and the like) in that the position of the first shaft 31 included in each unit is variable.

In Example 1 of the hinge portion, as in portions surrounded by dashed-two dotted lines in FIG. 3(A), when the two display panels 100 are in contact with each other, the side surface of the support panel 30 which supports the upper display panel 100 is not in contact with the support panel 30 which supports the lower display panel 100, resulting in generation of space in some cases. Therefore, a portion of each display panel 100 which is not supported by the support panel 30 is generated. Furthermore, as in portions surrounded by dashed-two dotted lines in FIG. 3(B), the regions 102 which are non-display regions of the display panel 100 are visually recognized by the user of the display device in some cases.

In contrast, as in portions surrounded by dashed-two dotted lines in FIG. 6(A), Example 3 of the hinge portion is a structure in which when two display panels 100 are in contact with each other, side surfaces of the support panels 30 supporting the two display panels 100 are in contact with each other. Accordingly, entire rear surfaces of the display panels 100 (surfaces opposite to the display surfaces) can be supported by the support panels 30, so that the display panels 100 can be protected. Moreover, as illustrated in FIG. 6(B), the support panels 30 can cover larger areas of the display panels 100 such that the regions 102 which are non-display regions of the display panels 100 are not visually recognized by the user of the display device.

In addition, in Example 3 of the hinge portion, when the relative positional relationship between the two support panels 30 is changed, the support panel 30 and the display panel 100 can be prevented from being contact with each other and damaged.

As described above, Example 3 of the hinge portion is a structure with which the reliability of the display device can be increased.

Specifically, when the first shaft 31 is moved as illustrated in FIG. 5(B), a rotation center of the arm 35 can be moved. For example, in the case where the display panel 100c is moved to the right side of the display panel 100b as illustrated in FIG. 5(B), the first shaft 31 is also moved to the right side. Then, the support panel 30c can be moved while the rotation center of the arm 35 is moved. Thus, the support panel 30c is more apart from the support panel 30b in the horizontal direction in FIG. 5(B) than in FIG. 2(B), so that the display panel 100b and the display panel 100c, the support panel 30b and the support panel 30c, or the like can be prevented from being rubbed.

Next, the first shaft 31 is moved in a direction opposite (here, to the left side) to the direction in which it has been moved previously, whereby the display panel 100c is closer to the display panel 100b. Then, as illustrated in FIG. 5(C), the display panel 100b and the display panel 100c can be in contact with each other. Here, an example in which part of the display panel 100c can be sandwiched using the support panel 30b is described. Accordingly, a portion where the two display panels 100 overlap with each other can also be supported by the support panel 30, and thus the display panels 100 can be protected.

Similarly, the display device can be changed from a state in FIG. 5(C) to a state in FIG. 6(A).

As illustrated in FIG. 6(B), it is preferable to employ a structure in which the support panels 30 cover the regions 102 which are non-display regions of the display panels 100 because the display panels 100 can be protected. Note that one embodiment of the present invention is not limited thereto, and part of the region 102 may be exposed.

<Example 4 of Hinge Portion>

Figure 7A:
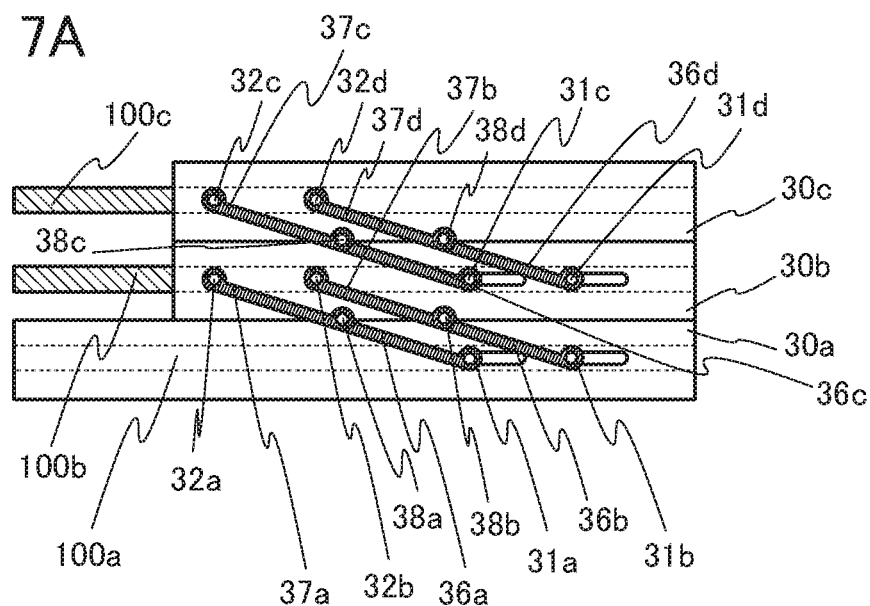
FIG. 7 Diagrams illustrating examples of a display device.

FIG. 7(A) illustrates a side view of the display device of one embodiment of the present invention.

A unit to which the structure in which the first shaft 31 is moved is applied is not limited to the unit which includes the first shaft 31, the second shaft 32, and the first arm 35 and is described in Example 1 of the hinge portion. For example, as illustrated in FIG. 7(A), application to the unit which includes the first shaft 31, the second shaft 32, the third shaft 38, the first arm 36, and the second arm 37 and is described in Example 2 of the hinge portion is also possible.

Thus, the display panel 100 can be moved in the horizontal direction, and the display panel 100 and the support panel 30 can be prevented from being rubbed. In addition, a portion where the two display panels 100 overlap with each other can be supported by the support panel 30. Furthermore, the regions 102 which are non-display regions of the display panels can be prevented from being visually recognized by the user of the display device.

<Example 5 of Hinge Portion>

Figure 7B:
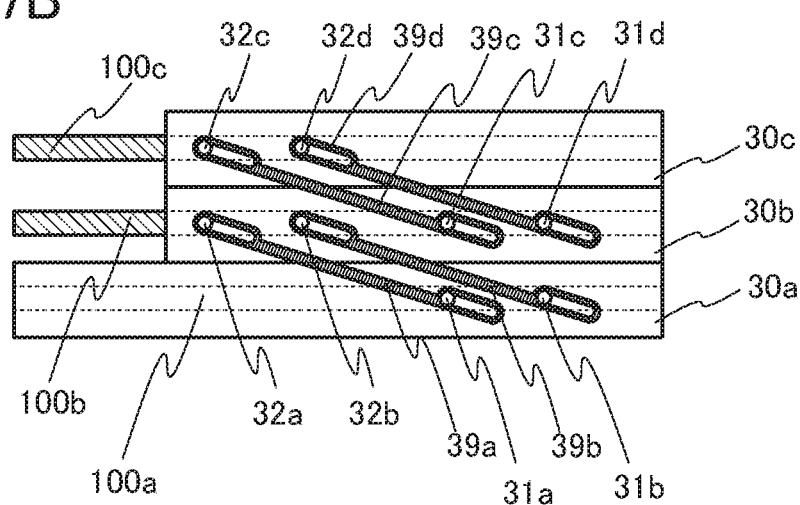

FIG. 7(B) illustrates a side view of the display device of one embodiment of the present invention.

Although an example in which the rotation center of the arm 35 can be moved is described in Example 3 of the hinge portion (FIG. 5(A) and the like), even with a structure in which the rotational radius of the arm 39 can be changed as illustrated in FIG. 7(B), an effect similar to that in Example 3 of the hinge portion can be obtained.

Specifically, when the support panel 30 is moved, the display panel 100 and the support panel 30 can be prevented from being rubbed. In addition, a portion where the two display panels 100 overlap with each other can be supported by the support panel 30. Furthermore, the regions 102 which are non-display regions of the display panels can be prevented from being visually recognized by the user of the display device.

Note that application to the unit which includes the first shaft 31, the second shaft 32, the third shaft 38, the first arm 36, and the second arm 37 and is described in Example 2 of the hinge portion is also possible. Specifically, a structure in which the rotational radius of each of the first arm 36 and the second arm 37 can be changed may also be employed.

Although the case in which the display device includes the hinge portion is described as an example of the mechanism in which the area of a portion where the two display panels overlap with each other is variable in the above, one embodiment of the present invention is not limited thereto.

For example, the display device of one embodiment of the present invention does not necessarily include a hinge portion. For example, a structure in which one of support panels has a projected portion and the other of the support panels has a depressed portion, the projected portion is made to slide in the depressed portion, and the relative positional relationship between the two support panels is variable may also be employed. Even with such a structure, the area of a portion where the two display panels overlap with each other can be variable. Moreover, the area of the display region of the display device can be variable. Electronic devices each including a display device using such a structure are described below.

As examples of electronic devices exemplified in this specification and the like, television devices (also referred to as TV or television receivers), monitors for computers and the like, digital cameras, digital video cameras, digital photo frames, cellular phones (also referred to as cell phones or cellular phone devices), portable game machines, portable information terminals, audio reproducing devices, large game machines such as pinball machines, and the like can be given.

<Example 1 of Electronic Device>

Figure 9A:
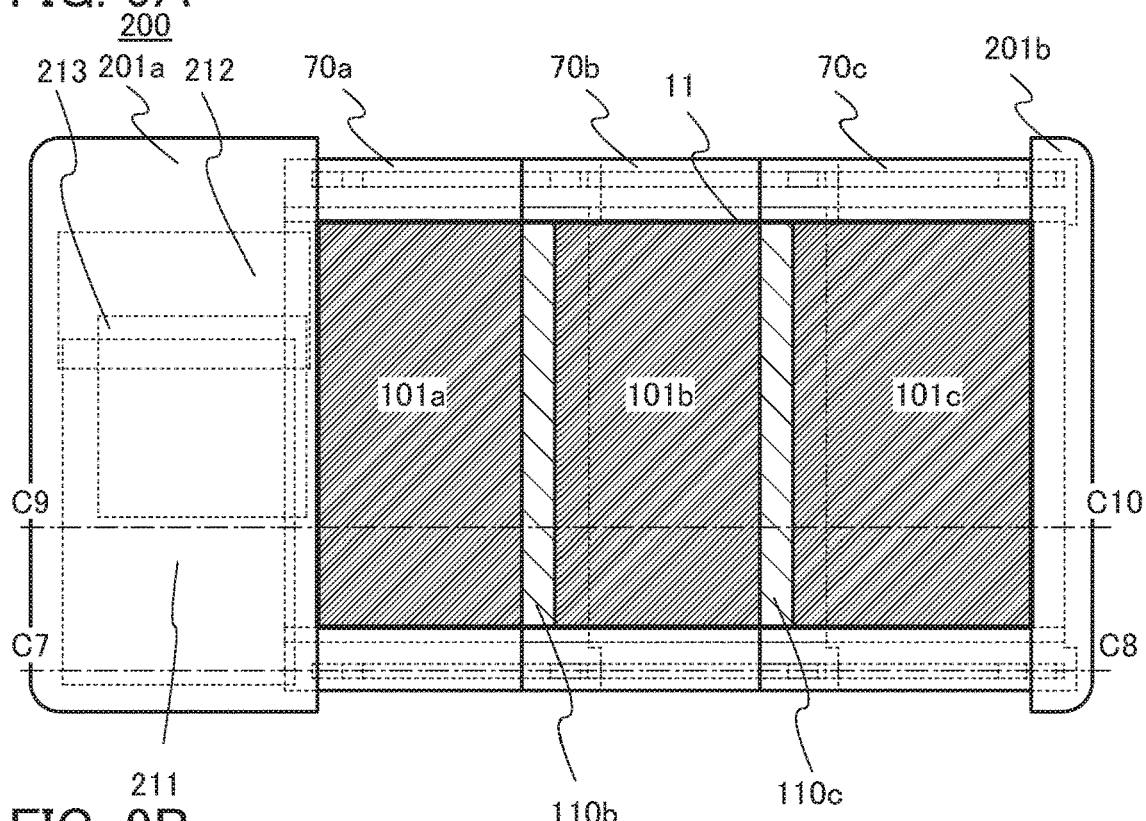
FIG. 9 Diagrams illustrating an example of an electronic device.
Figure 9B:
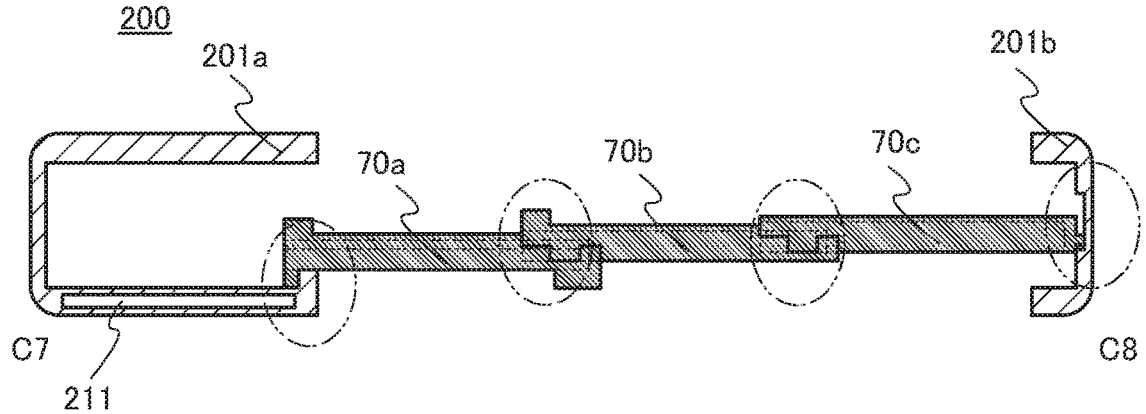

FIG. 8(A1) and FIG. 9(A) each illustrate a top view of an electronic device 200. FIG. 8(A2) illustrates a cross-sectional view taken along dashed-dotted line C1-C2 in FIG. 8(A1), and FIG. 8(A3) illustrates a cross-sectional view taken along dashed-dotted line C3-C4 in FIG. 8(A1). FIG. 9(B) illustrates a cross-sectional view taken along dashed-dotted line C7-C8 in FIG. 9(A), and FIG. 9(C) illustrates a cross-sectional view taken along dashed-dotted line C9-C10 in FIG. 9(A).

FIGS. 8(A1)-(A3) are each a diagram showing a state where a display device is stored in the electronic device 200.

Figure 9C:
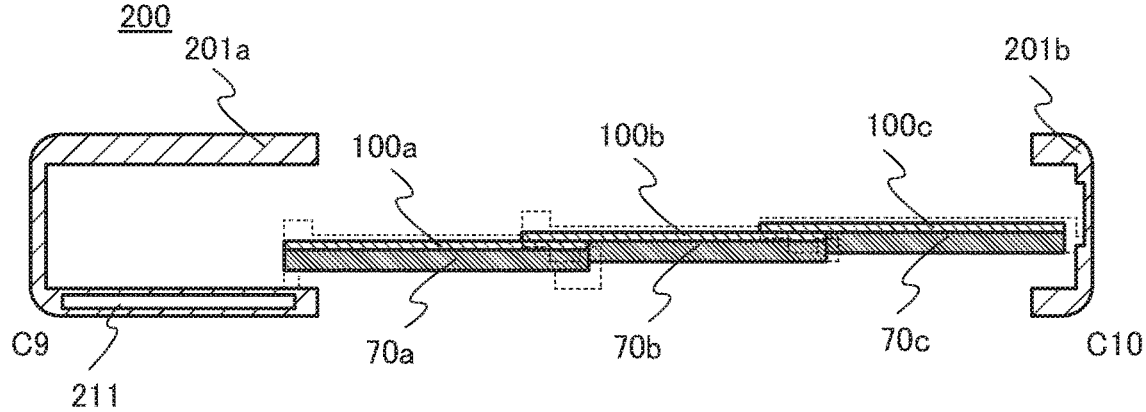

FIGS. 9(A)-(C) are each a diagram showing a state where the display device is extended from the inside of the electronic device 200.

The electronic device 200 includes a housing 201a and a housing 201b. The electronic device 200 includes a display device, a battery 211, a circuit board 212, and an antenna 213 in the housings.

The display device includes a support panel 70a, a support panel 70b, a support panel 70c, the display panel 100a, the display panel 100b, and the display panel 100c.

The electronic device 200 illustrated in FIGS. 8(A1)-(A3) includes the support panel 70a, the support panel 70b over the support panel 70a, and the support panel 70c over the support panel 70b in the housings. The support panel 70a supports the display panel 100a, the support panel 70b supports the display panel 100b, and the support panel 70c supports the display panel 100c.

The circuit board 212 includes a CPU, a variety of memories, a wireless module, and the like, for example.

The electronic device 200 can be changed from one of a state in FIG. 8(A1) and a state in FIG. 9(A) to the other. When the electronic device 200 is used, for example, display can be performed using the large display region 11 as illustrated in FIG. 9(A). Furthermore, when the electronic device 200 is not used, as illustrated in FIG. 8(A1), the area where the three display panels overlap with each other is increased, so that the electronic device 200 can be reduced in size. Thus, the portability of the electronic device 200 can be increased. In addition, the storage space for the electronic device 200 can be made small. Furthermore, when the display panels are provided inside the housings, the display surfaces of the display panels can be prevented from being damaged and stained.

FIG. 8(A2) and FIG. 9(B) each correspond to a cross-sectional view of a portion of each support panel including at least one of a projected portion and a depressed portion.

The housing 201a includes a projected portion on its surface on the support panel 70a side.

The support panel 70a includes depressed portions on the two surface sides opposite to each other. Specifically, a first depressed portion is included on a battery 211 side, and a second depressed portion is included on the support panel 70b side.

The support panel 70b includes a projected portion on one surface side (the support panel 70a side) of the two surfaces opposite to each other and includes a depressed portion on the other surface side (the support panel 70c side).

The support panel 70c includes a projected portion on the support panel 70b side.

The width of the first depressed portion of the support panel 70a is larger than that of the projected portion of the housing 201a. The support panel 70a can be relatively moved with respect to the housing 201a. The projected portion of the housing 201a can be slid in the first depressed portion of the support panel 70a. Note that a depressed portion may be provided in the housing 201a, and a projected portion may be provided in the support panel 70a. With such a structure, when the display device placed in the housing is pulled out, the display device can be prevented from being separated from the housing (see a region indicated by a dashed-two dotted line on the rightmost side in FIG. 9(B)).

The width of the second depressed portion of the support panel 70a is larger than that of the projected portion of the support panel 70b. The second depressed portion of the support panel 70a is deeper than the other portion and includes a portion into which the projected portion of the support panel 70b is fitted. The support panel 70b can be relatively moved with respect to the support panel 70a. The projected portion of the support panel 70b can be slid in the second depressed portion of the support panel 70a. Furthermore, when the projected portion of the support panel 70b is fitted into the second depressed portion of the support panel 70a, the relative positions of the support panel 70a and the support panel 70b can be fixed. Note that the support panel 70b may be provided with a depressed portion, and the support panel 70a may be provided with a projected portion.

Similarly, the width of the depressed portion of the support panel 70b is larger than that of the projected portion of the support panel 70c. The depressed portion of the support panel 70b is deeper than the other portion and includes a portion into which the projected portion of the support panel 70c is fitted. The support panel 70c can be relatively moved with respect to the support panel 70b. The projected portion of the support panel 70c is slid in the depressed portion of the support panel 70b. Furthermore, when the projected portion of the support panel 70c is fitted into the depressed portion of the support panel 70b, the relative position of the support panel 70b and the support panel 70c can be fixed. Note that the support panel 70c may be provided with a depressed portion, and the support panel 70b may be provided with a projected portion.

More specifically, the support panels 70 can be relatively moved with respect to the housing 201a and extended from a state illustrated in FIGS. 8(A1) and (A2) to a state illustrated in FIGS. 9(A) and (B). At this time, as in two regions indicated by dashed-two dotted lines at the center of FIG. 9(B), when the projected portion and the depressed portion of the two support panels 70 facing each other are fitted, the support panels 70 can be fixed in an unfolded state.

Note that as illustrated in FIG. 9(C), it is preferable that the two display panels be capable of overlapping in contact with each other because a step or a seam between the two display panels is less likely to be visually recognized. As illustrated in FIG. 8(A2) and FIG. 9(B), a side surface of the support panel 70c is provided with a projected portion capable of moving in a depressed portion provided in the housing 201b (see the region indicated by the dashed-two dotted line on the rightmost side in FIG. 9(B)). Thus, the position of the support panel 70c relative to the other support panels can be changed in a direction in which the display panels are stacked (the thickness direction of the display panels).

Note that although an example in which the battery 211, the circuit board 212, and the antenna 213 are included in the housing is described here, one embodiment of the present invention is not limited thereto. For example, the display device may include at least any one of a battery, a circuit board, an antenna, and the like in addition to the display panel and the support panel. For example, at least any one of a battery, a circuit board, an antenna, and the like may be included inside the support panel. The display device itself may has a function as an electronic device, and in this case, the housing has at least a function of storing and protecting the display device. Moreover, an electronic device of one embodiment of the present invention includes any one of a battery, a circuit board, an antenna, a speaker, a microphone, an operation button, and the like.

A secondary battery may be included as a battery, and it is preferable that the secondary battery be capable of being charged using non-contact power transmission.

As the secondary battery, for example, a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, a silver-zinc battery, or the like can be given.

When a signal is received by the antenna, display of an image, data, or the like on a display panel can be performed. Furthermore, the antenna may be used for non-contact power transmission.

<Example 2 of Electronic Device>

Figure 10A:
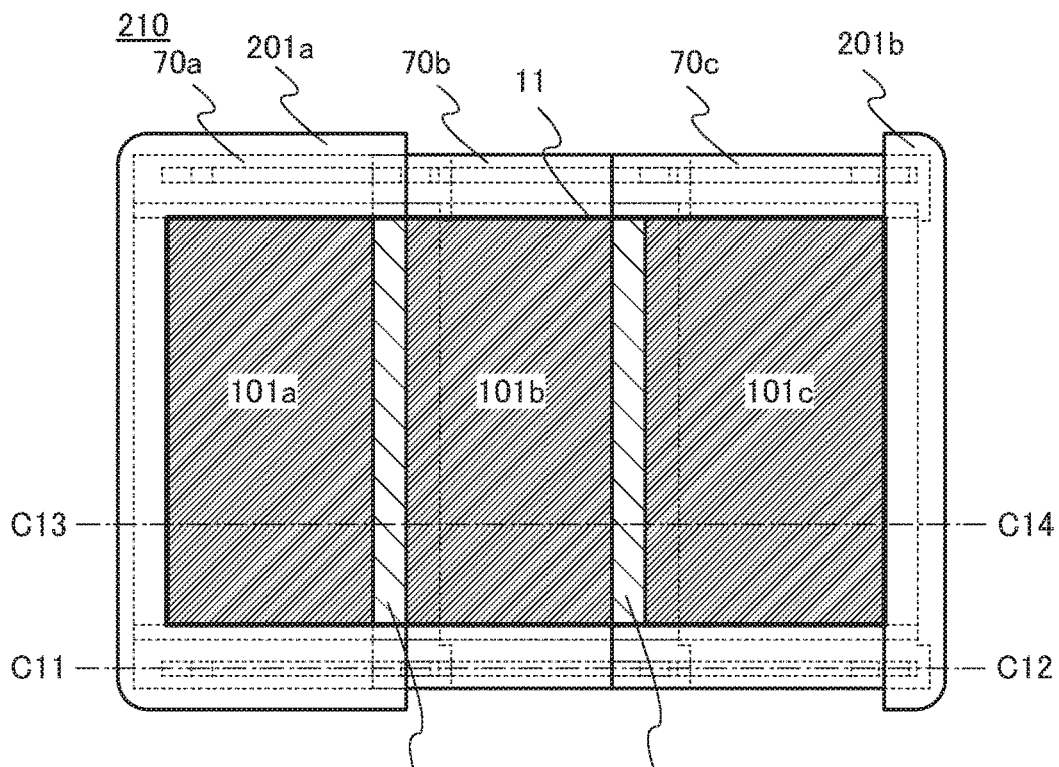
FIG. 10 Diagrams illustrating an example of an electronic device.
Figure 10B:
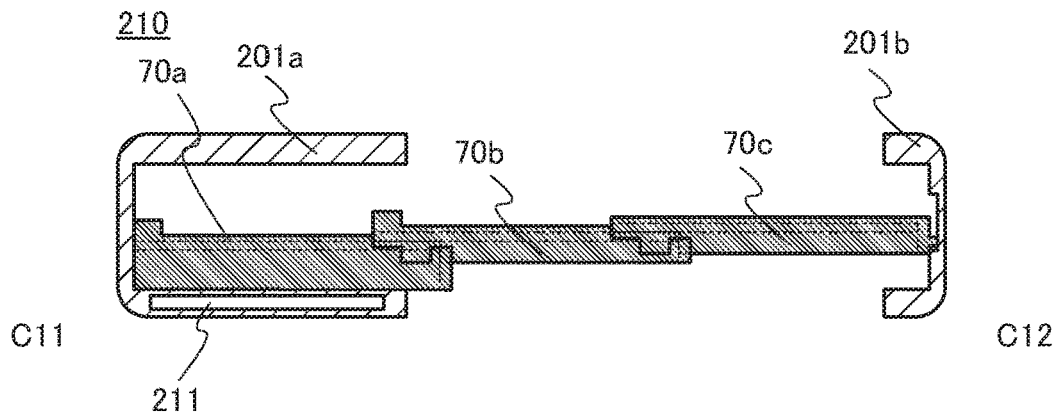
Figure 10C:
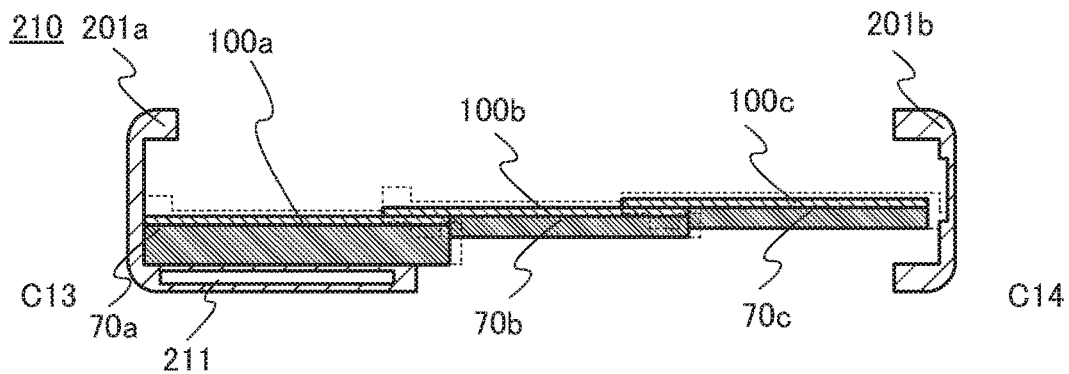

FIG. 8(B1) and FIG. 10(A) each illustrate a top view of an electronic device 210. FIGS. 8(B2) and (B3) each illustrate an example of a cross-sectional view taken along dashed-dotted line C5-C6 in FIG. 8(B1). FIG. 10(B) illustrates a cross-sectional view taken along dashed-dotted line C11-C12 in FIG. 10(A). FIG. 10(C) illustrates a cross-sectional view taken along dashed-dotted line C13-C14 in FIG. 10(A).

FIGS. 8(B1)-(B3) are each a diagram showing a state where a display device is stored in the electronic device 210.

FIGS. 10(A)-(C) each illustrate a diagram showing a state where the display device is extended from the inside of the electronic device 210.

The electronic device 210 illustrated in FIG. 8(B1) differs from the electronic device 200 illustrated in FIG. 8(A1) in that a user can visually recognize the display region 101c of the display panel 100c even in a state where the display device is stored in the electronic device 210. The electronic device 210 can perform display not only in a state where the display device is unfolded as illustrated in FIGS. 10(A)-(C) but can perform display in a state where the display device is stored as illustrated in FIG. 8(B1). In FIG. 8(B1), only the uppermost display panel may perform display.

As illustrated in FIG. 8(B2), a structure in which the display panel 100c does not overlap with the housing 201a on the display surface side may be employed. Alternatively, as illustrated in FIG. 8(B3), a structure in which the housing 201a includes a visible-light-transmitting region 205 and the display panel 100c overlaps with the visible-light-transmitting region 205 on the display surface side may be employed. In FIG. 8(B3), the display surface of the display panel 100c is protected by the housing 201a and thus can be prevented from being damaged and stained, which is preferable.

FIG. 10(B) corresponds to a cross-sectional view of a portion of each support panel including at least one of a projected portion and a depressed portion.

The support panel 70a includes a depressed portion on a side overlapping with the support panel 70b.

The support panel 70b includes a projected portion on one surface side (the support panel 70a side) of the two surfaces opposite to each other and includes a depressed portion on the other surface side (the support panel 70c side).

The support panel 70c includes a projected portion on a side overlapping with the support panel 70b.

The width of a depressed portion of the support panel 70a is larger than that of the projected portion of the support panel 70b. The depressed portion of the support panel 70a is deeper than the other portion and includes a portion into which the projected portion of the support panel 70b is fitted. The support panel 70b can be relatively moved with respect to the support panel 70a. The projected portion of the support panel 70b can be slid in the depressed portion of the support panel 70a. Furthermore, when the projected portion of the support panel 70b is fitted into the depressed portion of the support panel 70a, the relative positions of the support panel 70a and the support panel 70b can be fixed. Note that the support panel 70b may be provided with a depressed portion, and the support panel 70a may be provided with a projected portion.

Similarly, the width of the depressed portion of the support panel 70b is larger than that of the projected portion of the support panel 70c. The depressed portion of the support panel 70b is deeper than the other portion and includes a portion into which the projected portion of the support panel 70c is fitted. The support panel 70c can be relatively moved with respect to the support panel 70b. The projected portion of the support panel 70c can be slid in the depressed portion of the support panel 70b. Furthermore, when the projected portion of the support panel 70c is fitted into the depressed portion of the support panel 70b, the relative positions of the support panel 70b and the support panel 70c can be fixed. Note that the support panel 70c may be provided with a depressed portion, and the support panel 70b may be provided with a projected portion.

More specifically, each of the support panels 70 can be relatively moved with respect to the housing 201a and extended from a state illustrated in FIGS. 8(B1) and (B2) to a state illustrated in FIGS. 10(A) and (B).

Note that as illustrated in FIG. 10(C), it is preferable that the two display panels be capable of overlapping in contact with each other because a step or a seam between the two display panels is less likely to be visually recognized. As illustrated in FIG. 8(B2) and FIG. 10(B), a side surface of the support panel 70c is provided with a projected portion capable of moving in a depressed portion provided in the housing 201b. Thus, the position of the support panel 70c relative to the other support panels can be changed in a height direction (the thickness direction of the display panels).

<Example 2 of Display Device>

Although an example of the display device in which the plurality of display panels overlapping with each other can be unfolded in a direction along a straight line is described up to here, one embodiment of the present invention is not limited thereto. For example, unfolding may be performed in a direction along a curved line. Alternatively, the plurality of display panels may be unfolded in two or more directions.

Figure 11A:
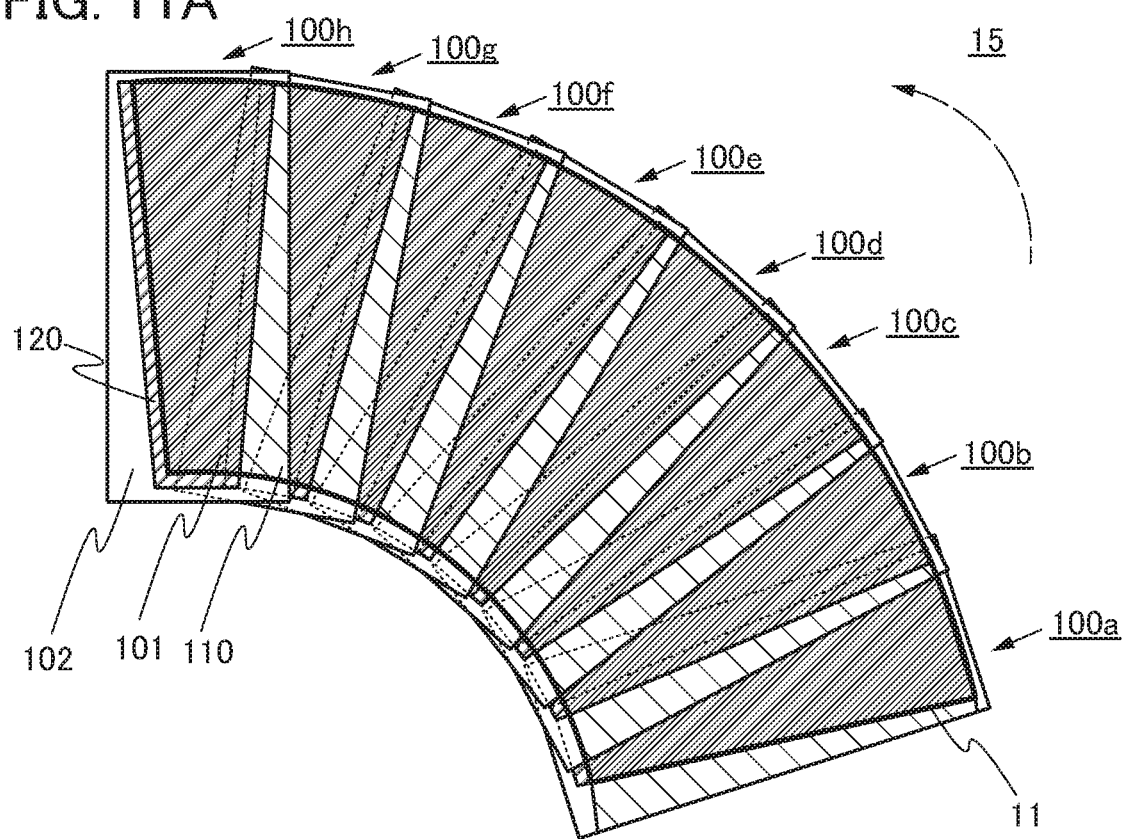
FIG. 11 Diagrams illustrating an example of a display device.

FIGS. 11(A) and (B) each illustrate a top view of a display device 15.

The display device 15 includes eight display panels (the display panel 100a-a display panel 100h). In the display device 15, the eight display panels can be unfolded in a direction along a curved line. There is no limitation on the number of display panels included in the display device. The display device 15 can be unfolded in a given range of greater than 0° and less than or equal to 360°.

Figure 11B:
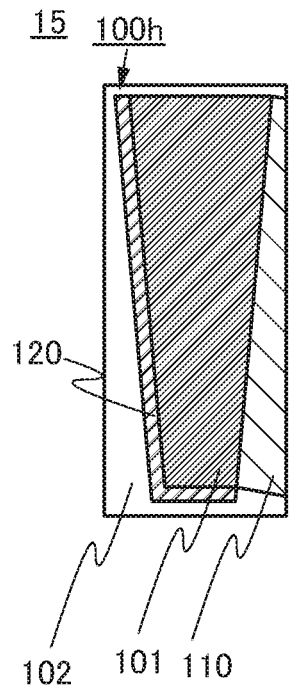
Figures 11C, 11D:
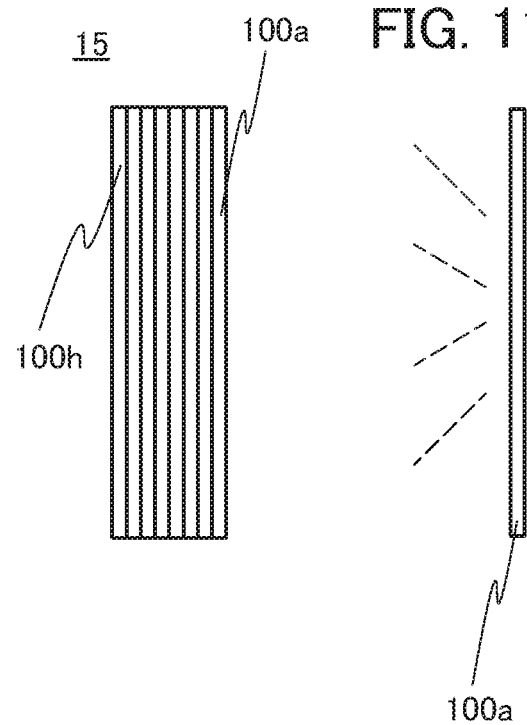

FIG. 11(C) illustrates a side view of the display device 15 illustrated in FIG. 11(B), and FIG. 11(D) illustrates a side view of the display panel 100a. FIGS. 11(C) and (D) are each a side view on the long side of the display panel 100a.

The display device 15 can be changed from one of a state in FIG. 11(A) and a state in FIG. 11(B) to the other.

For example, as illustrated in FIG. 11(D), a display panel including a display surface on one surface can be used. Alternatively, a display panel including display surfaces on the two surfaces opposite to each other may be used.

Note that in a portion where the display region 101 of the display panel 100 positioned on the lower side and the visible-light-transmitting region 110 of the display panel 100 positioned on the upper side overlap with each other, interference of light is generated at an end portion of the visible-light-transmitting region 110 in some cases.

Figure 12A:
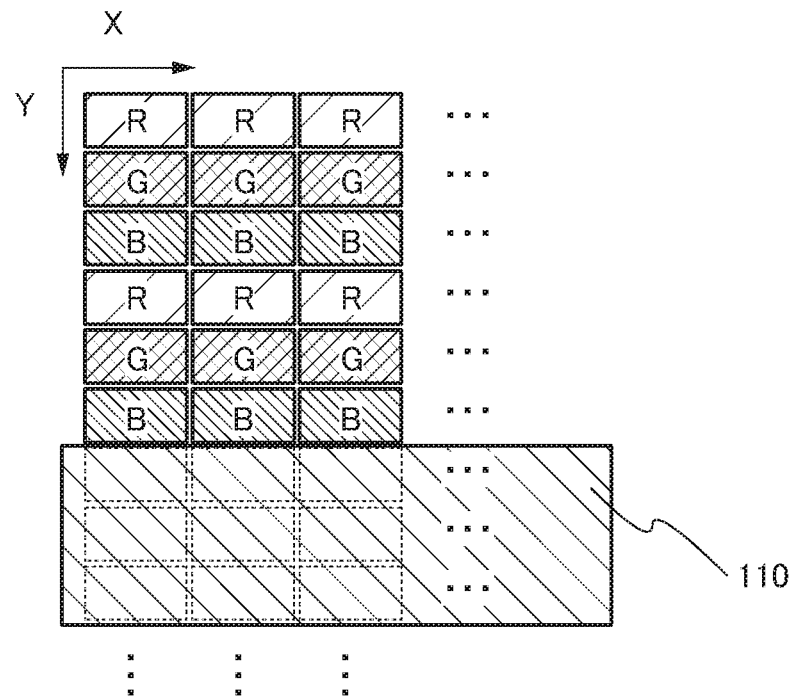
FIG. 12 Diagrams illustrating examples of an arrangement of pixels and a visible-light-transmitting region.

Here, the case where the display region 101 includes a red pixel R, a green pixel G, and a blue pixel B is considered. In FIG. 12(A), pixels for the same color are arranged in an X direction. Here, when one side of the visible-light-transmitting region 110 is parallel to the X direction, light of a single color of red, green, or blue is likely to be visually recognized regularly on the one side. This is because pixels arranged regularly exist at the end portion of the visible-light-transmitting region 110. When the user of the display device visually recognizes light of a single color, the end portion of the visible-light-transmitting region 110 is likely to be perceived.

Figure 12B:
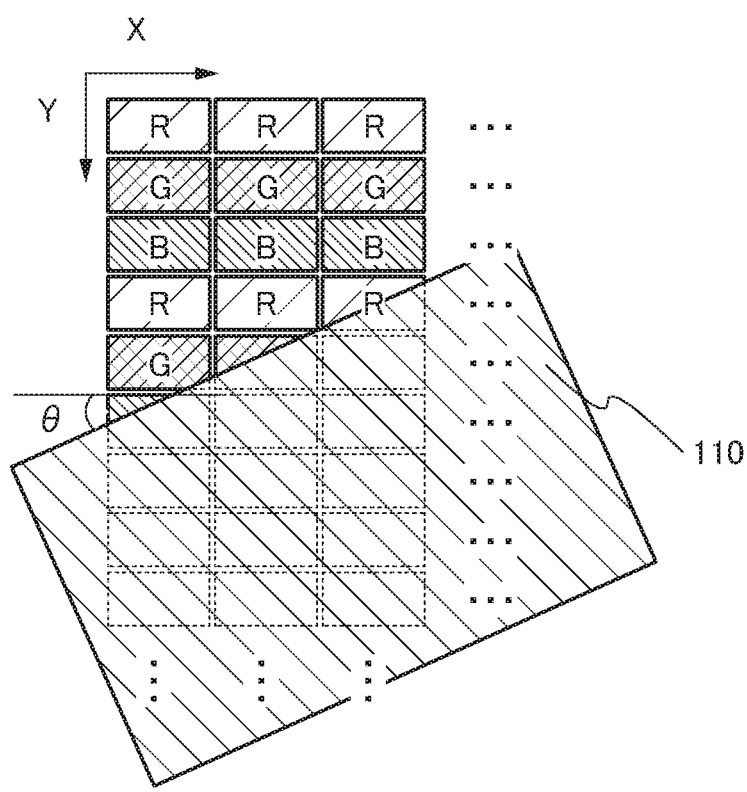

Here, as illustrated in FIG. 12(B), it is preferable that an angle θ formed by the X direction (the direction in which pixels for the same color are arranged) and one side of the visible-light-transmitting region 110 be greater than 0° and less than 50°, further preferably greater than or equal to 10° and less than 50°. When the angle θ is made greater than 0°, the cycle of light of a single color of red, green, and blue can be made short. When the cycle is shorter, white color is viewed by the user of the display device due to mixture of red, green, and blue, and thus the end portion of the visible-light-transmitting region 110 becomes inconspicuous. Alternatively, it can be said that the angle of a region where the pixels and the visible-light-transmitting region 110 overlap with each other is preferably greater than 0° and less than 50°, further preferably greater than or equal to 10° and less than 50°. Note that when the angle θ is greater than or equal to 50°, another interference of light is generated in some cases.

It is preferable that the display panels 100 be unfolded in the direction along the curved line as in the display device 15 illustrated in FIG. 11(A) because the angle θ formed by the direction in which the pixels for the same color are arranged and the one side of the visible-light-transmitting region 110 is easily controlled.

<Example 3 of Display Device>

Figure 13A:
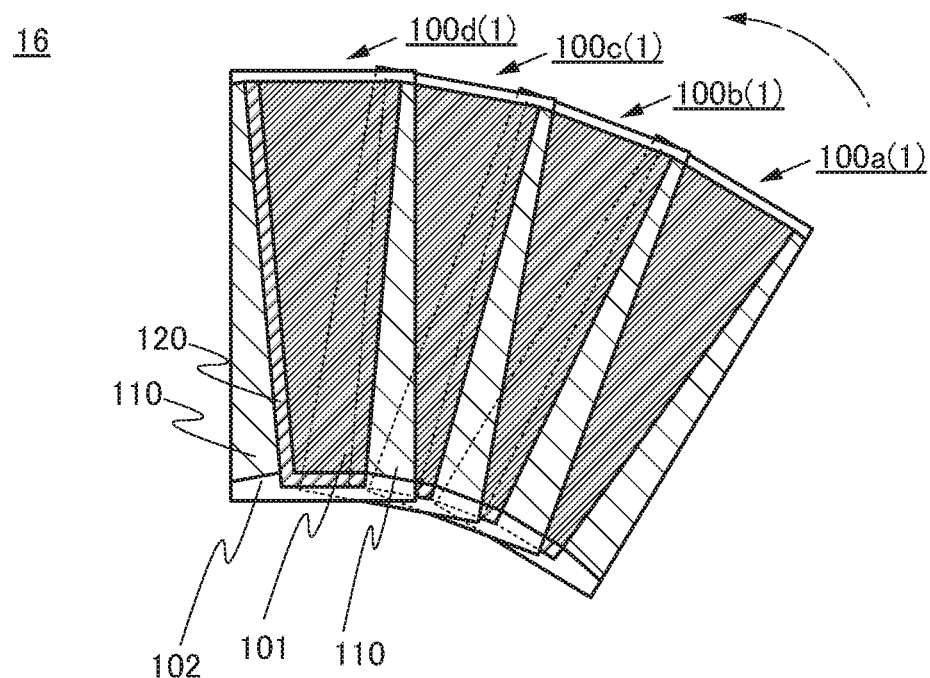
FIG. 13 Diagrams illustrating an example of a display device.
Figure 13B:
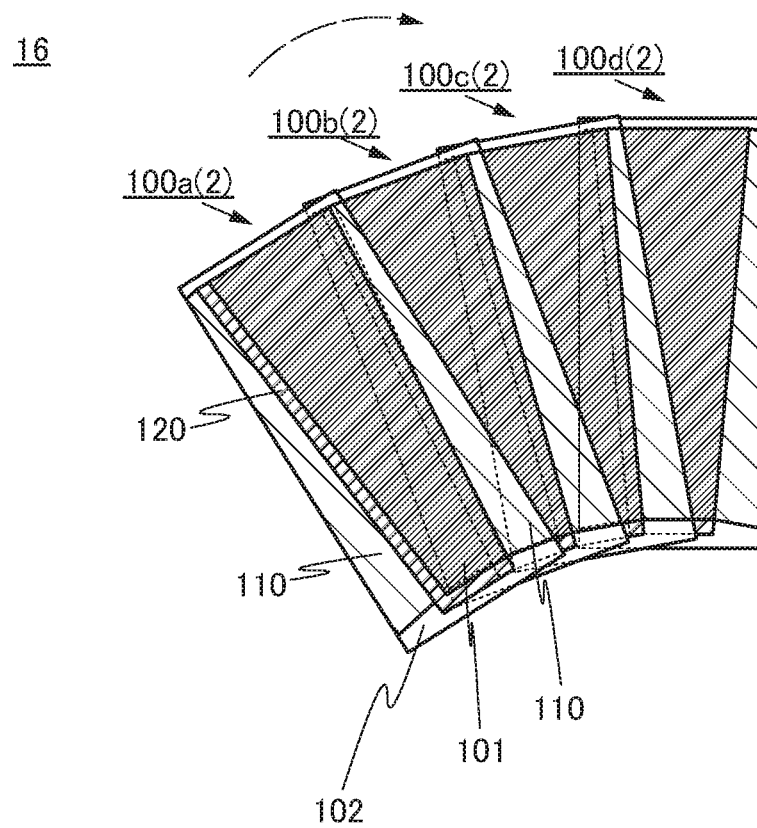
Figure 14A:
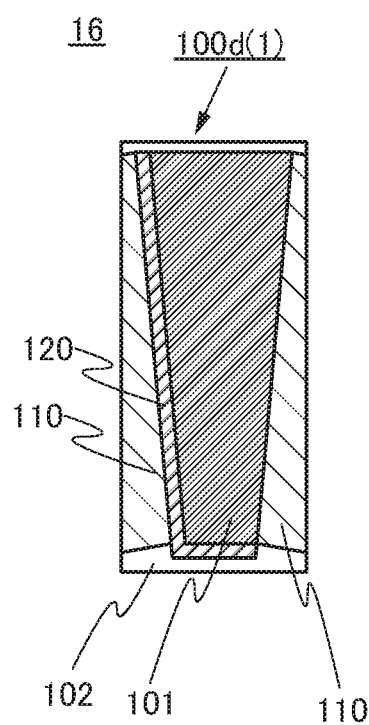
FIG. 14 Diagrams illustrating an example of a display device.
Figure 14B:
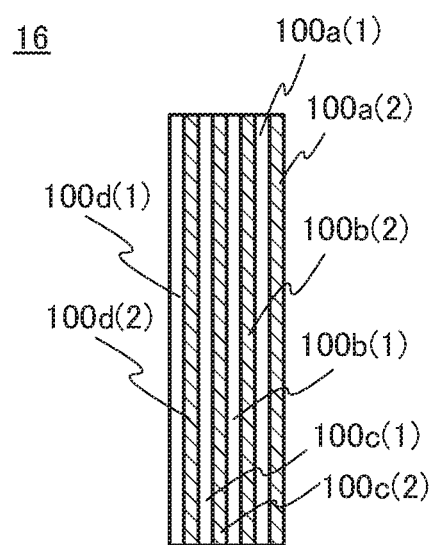
Figure 14C:
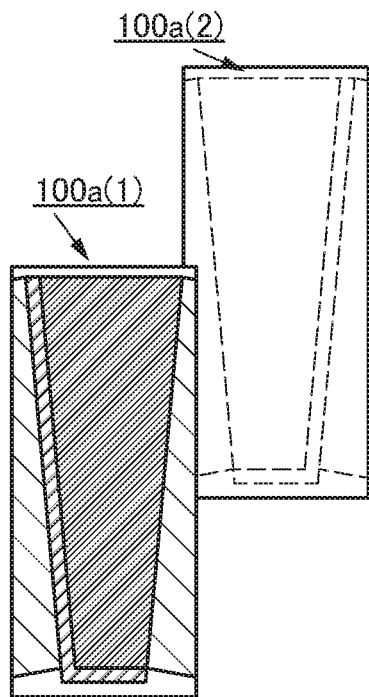
Figures 14D, 14E:
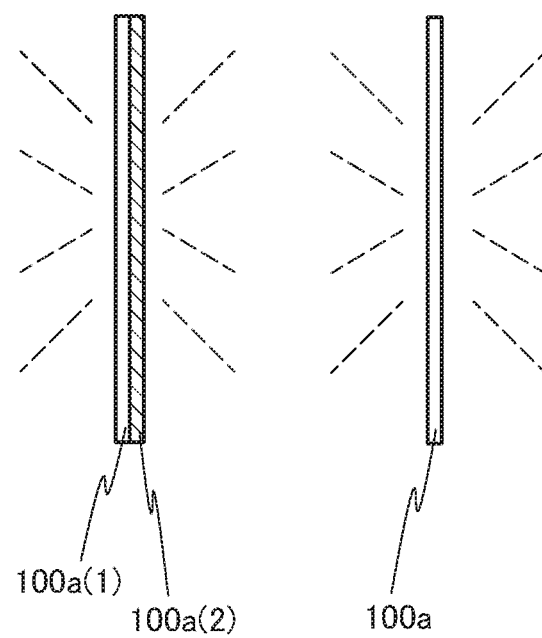

FIG. 13(A) illustrates a front view of a display device 16, and FIG. 13(B) illustrates a rear view of the display device 16. In addition, FIG. 14(A) illustrates a front view of the display device 16, and FIG. 14(B) illustrates a side view of the display device 16 illustrated in FIG. 14(A). Furthermore, FIG. 14(C) illustrates a diagram for explaining how two display panels overlap with each other. Moreover, FIG. 14(D) illustrates a side view of a display panel 100a(1) and a display panel 100a(2), and FIG. 14(D) illustrates a side view of the display panel 100a. FIGS. 14(B), (D), and (E) are each a side view of the display panel on the long side.

The display device 16 can be changed from one of a state in FIG. 13(A) and a state in FIG. 14(A) to the other.

As illustrated in FIG. 14(B), the display device 16 includes eight display panels (the display panel 100a(1)-a display panel 100d(1) and a display panel 100a(2)-a display panel 100d(2)). In the display device 16, the eight display panels can be unfolded in a direction along a curved line.

As illustrated in FIGS. 14(C) and (D), the display panel 100a(1) and the display panel 100a(2) overlap with each other such that the display surfaces face outward.

Accordingly, as illustrated in FIG. 13(A), on one surface (here, a front surface) of the display device 16, display using the display panel 100a(1)-the display panel 100d(1) can be performed. In addition, as illustrated in FIG. 13(B), on the other surface (here, a rear surface) of the display device 16, display using the display panel 100a(2)-the display panel 100d(2) can be performed.

As illustrated in FIG. 14(C), a region of the display panel 100a(1) including the display region 101 and the visible-light-blocking region 120 and a region of the display panel 100a(2) including the display region 101 and the visible-light-blocking region 120 are placed so as to overlap with each other. Furthermore, the visible-light-transmitting regions 110 of the display panel 100a(1) and the display panel 100a(2) are provided so as to overlap with each other. Thus, it is possible to obtain a structure in which on each of the front surface and the rear surface of the display device 16, the visible-light-transmitting region 110 of the display panel positioned on the upper side and the display region 101 of the display panel positioned on the lower side overlap with each other, and the visible-light-blocking region 120 of the display panel positioned on the upper side and the display region 101 of the display panel positioned on the lower side do not overlap with each other. Accordingly, the user of the display device can visually recognize the display region 101 of the display panel positioned on the lower side through the visible-light-transmitting region 110 of the display panel positioned on the upper side.

When the display device 16 is seen from the front surface as illustrated in FIG. 13(A), the display panel 100d(1) is positioned on the uppermost side, and the display panel 100a(1) is positioned on the lowermost side. On the other hand, when the display device 16 is seen from the rear surface as illustrated in FIG. 13(B), the display panel 100a(2) is positioned on the uppermost side, and the display panel 100d(2) is positioned on the lowermost side.

Each of the display panels 100 includes the visible-light-transmitting regions 110 on its two sides, and each of the different visible-light-transmitting regions 110 on the front surface and the rear surface overlaps with the display region 101 of the adjacent display panel 100. For example, as illustrated in FIG. 13(A), one of the visible-light-transmitting regions 110 of the display panel 100b(1) overlaps the display region 101 of the display panel 100a(1). Moreover, the other of the visible-light-transmitting regions 110 of the display panel 100b(1) overlaps the display region 101 of the display panel 100c(2). In addition, part of the display region 101 of the display panel 100b(1) overlaps with the visible-light-transmitting regions 110 of the display panel 100c(1) and the display panel 100c(2). That is, the user of the display device can visually recognize the display region 101 of the display panel 100b(1) through the visible-light-transmitting regions 110 of the two display panels.

Note that although an example in which a display panel including a display surface on one surface is used is shown in FIGS. 13(A) and (B) and FIGS. 14(A)-(D), as illustrated in FIG. 14(E), the display panel 100a including display surfaces on two surfaces opposite to each other may also be used.

Furthermore, in one embodiment of the present invention, using a structure in which a plurality of display panels can be unfolded in the direction along a curved line makes it possible to manufacture a display device or an electronic device having a fan shape (substantially fan shape).

In the case where a fan-like display device is manufactured using one display panel, when the display panel is folded, a display defect may be caused due to peeling of part of a layer included in the display panel, for example. Moreover, when curving is performed with a curvature with a degree which does not adversely affect display of the display panel, the thickness is increased in folding the fan, and thus the portability or the storage property of the display device becomes worse in some cases.

In contrast, in one embodiment of the present invention, a display region of a display device can be formed using a plurality of display panels. Since each of the display panels does not need to be bent in folding the fan, a reduction in the reliability of the display panels due to the bending can be suppressed. An example of a substantially fan-shaped electronic device is described below.

<Example 3 of Electronic Device>

An example of an electronic device using the display device 15 illustrated in FIGS. 11(A)-(C) is described. FIGS. 15(A) and (B) each illustrate a top view of an electronic device 250.

FIG. 15(A) is a diagram showing a state in which a plurality of display panels is stored in the electronic device 250.

FIG. 15(B) is a diagram showing a state in which the plurality of display panels is extended from the electronic device 250.

The electronic device 250 includes a housing 251a and a housing 251b. The electronic device 250 includes six display panels (the display panel 100a-a display panel 1000, a battery 256, a circuit board 253, and an antenna 254 in the housings. FIG. 15(B) illustrates an example in which the housing 251a includes the circuit board 253 and the antenna 254, and the housing 251b includes the battery 256. Note that the battery 256, the circuit board 253, and the antenna 254 may be collectively provided in one of the housing 251a and the housing 251b. Alternatively, the battery and the like may be included in both of the housing 251a and the housing 251b.

One display panel 100 is connected to one stick 257. The plurality of sticks 257 is bound by a pin 252. Furthermore, the plurality of sticks 257 is also connected by a string 258 passing through openings. A member passing through the openings of the sticks 257 is not limited to a string, and a thread, a rope, a wire, a ribbon, cloth, or the like may be used. Alternatively, a member passing through the openings has flexibility and has a fiber shape or a belt shape. For example, a material such as a natural fiber, a synthetic fiber, paper, a synthetic resin, rubber, a metal, or an alloy can be used. The stick 257 is provided with a wiring with which the circuit board 253 included in the housing 251a and the display panel 100 are electrically connected, and the like. Portions of the sticks 257 which are bound by the pin 252 are preferably more distant from portions thereof through which the string 258 passes because the movement of the stick 257 and the display panel 100 is more easily controlled and they are more easily integrated.

The electronic device 250 can be changed from one of a state in FIG. 15(A) and a state in FIG. 15(B) to the other. When the electronic device 250 is used, for example, display can be performed using the display regions 101 of the plurality of display panels as illustrated in FIG. 15(B). When the electronic device 250 is not used, as illustrated in FIG. 15(A), the area where the plurality of display panels overlaps with each other is increased, so that the electronic device 250 can be reduced in size. Thus, the portability of the electronic device 250 can be increased. In addition, the storage space for the electronic device 250 can be made small. Furthermore, when the display panels are provided inside the housings, the display surfaces of the display panels can be prevented from being damaged and stained.

The electronic device 250 unfolded in a fan-like shape may be used as a fan, a folding fan, or a round fan.

<Example 4 of Electronic Device>

FIGS. 16(A) and (B) each illustrate a top view of an electronic device 260.

FIG. 16(A) is a diagram showing a state in which a plurality of display panels is stored in the electronic device 260.

FIG. 16(B) is a diagram showing a state in which the plurality of display panels is extended from the electronic device 260.

The electronic device 260 includes a housing 261a and a housing 261b. The electronic device 260 includes n display panels (a display panel 100(1)-a display panel 100(n); n is a natural number of 2 or more in one embodiment of the present invention, and n is a natural number of 7 or more in FIG. 16(B)) in the housings. The electronic device 260 preferably includes a battery, a circuit board, and an antenna.

On display panel 100 is connected to one stick 267. The plurality of sticks 267 is bound by a pin 262. Furthermore, the plurality of sticks 267 is also connected by a string 268 passing through openings.

The electronic device 260 illustrated in FIG. 16(A) differs from the electronic device 250 illustrated in FIG. 15(A) in that a user can visually recognize a display region 101(n) of the display panel 100(n) even in a state where the display panels 100 are stored in the electronic device 260. Therefore, the electronic device 260 can perform display not only in a state where the display device is unfolded as illustrated in FIG. 16(B) but can perform display in a state where the display device is stored as illustrated in FIG. 6(A). In FIG. 16(A), only the display panel positioned on the uppermost side needs to perform display.

Furthermore, the display panel 100 is not limited to a rectangular shape as illustrated in FIG. 15(A) or the like and may have a quadrangular shape such as a trapezoidal shape as illustrated in FIG. 16(A) and the like or may have a polygonal shape other than a quadrangular shape, a circular shape, a fan shape, or the like.

As described above, in one embodiment of the present invention, a fan-shaped electronic device can be achieved.

<Example 5 of Electronic Device>

Although the electronic device 250 or the electronic device 260 has a structure including the plurality of display panels 100, one embodiment of the present invention is not limited thereto. For example, the plurality of display panels 100 included in the electronic device 250 or the electronic device 260 may each individually include a battery, an antenna, a circuit board, or the like and may be configured to enable only one display panel 100 to be used.

Figure 17A:
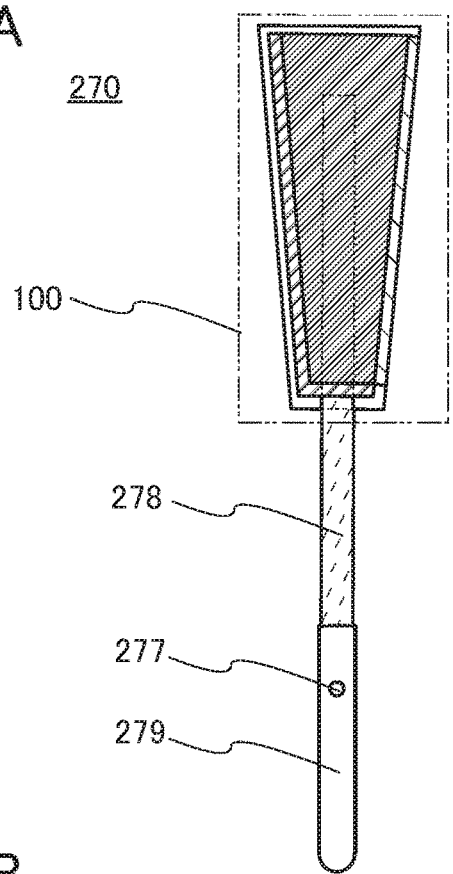
FIG. 17 Diagrams illustrating examples of an electronic device.

FIG. 17(A) illustrates an electronic device 270 including one display panel 100.

The electronic device 270 includes a wiring, a circuit board, a battery, and the like in a stick 278. The wiring is electrically connected to the display panel 100. The circuit board or the like is electrically connected to the display panel 100 through the wiring. Furthermore, the stick 278 or a holder 279 may be provided with an operation button 277 or the like.

For example, the electronic device 270 can be used alone and can also be used as part of the electronic device 260. Specifically, the stick 278 can be pulled out of the holder 279 and bound by the pin 262 together with other sticks.

Figure 17B:
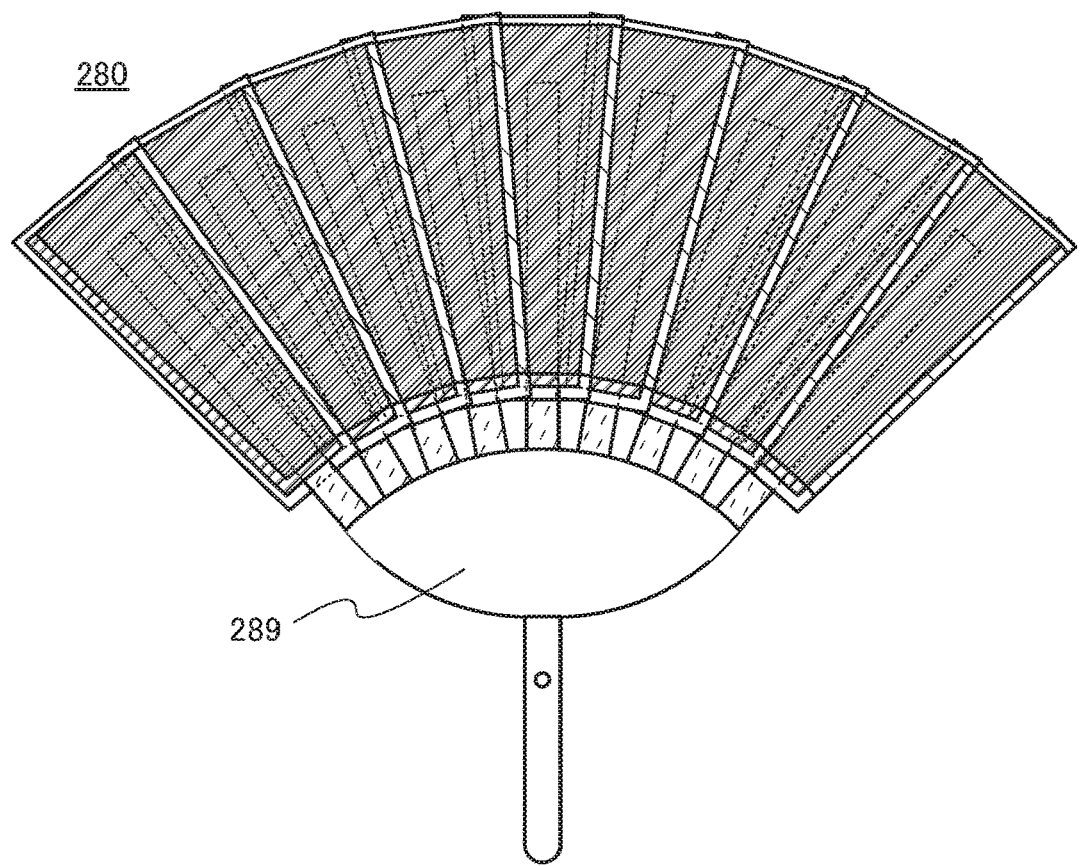

Alternatively, the electronic device 270 can be used as part of a round fan-shaped electronic device 280 as illustrated in FIG. 17(B). Specifically, the stick 278 can be pulled out of the holder 279 and inserted into a holder 289.

Each holder preferably has a function of protecting the stick 278 or a function of connecting a plurality of sticks. Alternatively, each holder may be provided with a battery, a circuit board, or the like.

In one embodiment of the present invention, the electronic device 270 which can be used alone as an electronic device can be used in a variety of uses such as being used alone and being used as part of a fan-shaped or round fan-shaped electronic device. Such an electronic device is also described in detail in Embodiment 2.

<Application Example>

As one of application examples, a structure in which the display device or the electronic device of one embodiment of the present invention is suspended in the air with an advertising balloon (all blimps or balloons used in uses for advertisement) can be given.

FIGS. 18(A) and (B) illustrate an advertising balloon 290. FIG. 18(A) illustrates the advertising balloon 290 before being flown, and FIG. 18(B) illustrates the advertising balloon 290 in a state of being flown.

The advertising balloon 290 includes a sphere 291, an electronic device 295, and a rope 296. The electronic device 295 is connected between the sphere 291 and the rope 296.

As the sphere 291, a blimp or a balloon can be used. The advertising balloon 290 is flown with the rope 296 attached to a structure such as a handrail of a building, or a portion to which the rope 296 is fixed is additionally prepared such that the advertising balloon 290 is not blown away.

The electronic device 295 of one embodiment of the present invention can be manufactured using a flexible, thin, and lightweight display panel, so that the weight can be reduced. Accordingly, the size of the sphere 291 can be made small, and thus the area of a flying position can be reduced, and the amount of a gas such as a helium gas to fill the sphere 291 can be made small, which is preferable.

Furthermore, the electronic device 295 can change letters for advertisement easily by changing display. Accordingly, the durability is high as compared with letters for advertisement using glassine paper or vinyl, and repeated use is possible, which is preferable. Moreover, the range of choices for a material of a housing 293*a* and a housing 293*b* is wide, and therefore, a high water-resistance property or a high antifouling property can be obtained, so that it is preferable for repeated use. For example, a thin plastic case, a film, or the like may be used for the housing 293*a* and the housing 293*b*.

The electronic device 295 can perform display with high visibility regardless of outdoors, indoors, the daytime, or the night time and thus can display letters for advertisement in a variety of places and uses.

Furthermore, as illustrated in FIG. 18(A), display panels of the electronic device 295 can be stored in the housing 293*a* and the housing 293*b*, and thus a reduction in the size can be achieved, and the storage place is less likely to be limited. Moreover, the display panels can be prevented from being damaged and stained when being stored.

In addition, when the display device is extended from the inside of the electronic device 295 in flying the advertising balloon 290 as illustrated in FIG. 18(B), letters for advertisement can be displayed.

A support panel 294 is preferably thin and lightweight. Furthermore, it preferably has a high water-resistance property and a high antifouling property.

Although FIG. 18(B) illustrates an example of the electronic device 295 including seven display panels, there is no limitation on the number of display panels. The visible-light-transmitting region 110 of an upper display panel overlaps with the display region 101 of a lower display panel, whereby the electronic device 295 can perform display using a wide display region where a seam is less likely to be visually recognized.

Furthermore, in the electronic device 295, the area of the display region can be changed as appropriate in accordance with the number of letters for advertisement <Example of Display System>

Note that in addition to the display device of one embodiment of the present invention, a display system including a driving device and an output device or an electronic device including the display system is also one embodiment of the present invention.

The driving device has a function of supplying a signal or a potential for driving a display panel to the display panel.

The driving device may have a structure including one or more of an antenna, a wireless receiver, a wireless transmitter, a battery, a printed board (a circuit board) on which ICs such as an arithmetic device and a memory device are mounted, and the like.

The output device has a function of outputting an image signal to the driving device.

The driving device and the output device may be electrically connected by a cable. Furthermore, it is preferable that the driving device and the output device have a structure capable of transmitting and receiving a signal by wireless communication because a cable becomes unnecessary, and thus the structure can be further simplified.

For example, a reproducing device or a recording/reproducing device for a memory medium such as a Blu-ray Disc, a DVD (digital versatile disk), or a flash memory, or a recording/reproducing device including a memory device such as a HDD (hard disk drive) or a SSD (solid state drive), or the like can be used as the output device. Image data stored in the output device is output to each display panel as an image signal. Alternatively, the output device preferably has a function of outputting image data obtained through a network to each display panel as an image signal. Thus, the latest information can be displayed easily. In addition, it is preferable that a structure capable of temporarily storing data in a memory means included in the output device be employed at this time because an image can be displayed even in a state without network connection (an offline state).

Furthermore, an uncompressed disk recorder (UDR: Uncompressed Disk Recorder) capable of outputting an image with high resolution, e.g., full high-definition image quality (1920×1080 pixels), 4K (3840×2160 pixels), or 8K (7680×4320 pixels), without compression is preferably used as the output device.

Moreover, the output device preferably has a function of dividing and converting one image data into a plurality of image signals to output them. Thus, one large image can be displayed in a display region of a display device including display regions of a plurality of display panels. In addition, there is no need to divide input image data in advance, leading to excellent versatility.

As described above, in one embodiment of the present invention, it is possible to provide a display device or an electronic device in which the area of a portion where two display panels overlap with each other is variable and the area of a display region is variable.

This embodiment can be combined with any of other embodiments as appropriate.

(Embodiment 2)

In this embodiment, electronic devices of one embodiment of the present invention are described with reference to FIG. 19 to FIG. 21.

Although an example in which one large display region is formed using a plurality of display panels is described in Embodiment 1, one large display region may be formed using a plurality of electronic devices. For example, a plurality of portable information terminals or cellular phones may be used.

<Example 6 of Electronic Device>

FIG. 19(A1) illustrates a front view of an electronic device 330, and FIG. 19(B) illustrates a rear view of the electronic device 330. Furthermore, FIG. 19(A2) illustrates a cross-sectional view taken along dashed-dotted line D1-D2 in FIG. 19(A1).

The electronic device 330 includes a housing 331 and the display panel 100. Moreover, the electronic device 330 preferably includes a communication means. As the communication means, a wireless module, an antenna, and the like can be given. Furthermore, wired communication may be able to be performed using a connector or the like.

In addition, the electronic device 330 may include a speaker 332, a camera 333a, a camera 333b, a light 334a, a light 334b, an operation button 335, a battery 336, an operation button 337, a microphone 338, an external connection port 342, and the like. Note that although the electronic device 330 has a structure including a camera and a light on each of two surfaces of a front surface and a rear surface thereof, one embodiment of the present invention is not limited thereto.

As illustrated in FIG. 19(A2), the electronic device 330 includes the display panel 100. As the display panel 100, for example, the display panel described in Embodiment 1 can be applied.

The display panel 100 includes the display region 101 and the region 102, which is a non-display region.

Part of the region 102, which is a non-display region, is the visible-light-transmitting region 110. The electronic device 330 includes a mechanism capable of exposing the visible-light-transmitting region 110 from the housing. Thus, a display portion of another electronic device and the visible-light-transmitting region 110 can overlap with each other. In addition, by communication with the other electronic device using the communication means, the display region 101 and a display region of the other electronic device can be used as one display region where a seam is less likely to be visually recognized.

An example of the mechanism capable of exposing the visible-light-transmitting region 110 is described with reference to FIGS. 19(C)-(F). FIGS. 19(C)-(F) are each an example of a cross-sectional view taken along dashed-dotted line D1-D2 in FIG. 19(A1).

For example, as illustrated in FIG. 19(C), a region 339 which is part of the housing 331 may be attachable and detachable. By detaching the region 339, the visible-light-transmitting region 110 can be exposed. Furthermore, not only the visible-light-transmitting region 110 but also part of the display region 101 may be exposed.

Alternatively, as illustrated in FIG. 19(D), the region 339 may be rotatable. When the region 339 is rotated, the visible-light-transmitting region 110 can be exposed.

Note that as illustrated in FIGS. 19(E) and (F), a structure may be employed in which the visible-light-transmitting region 110 is exposed only on the rear surface side of the electronic device 330. For example, in the case where a region in a portion of the housing 331 which overlaps with the display surface side of the display panel 100 and overlaps with the visible-light-transmitting region 110 transmits visible light, display of a display panel of another electronic device can be visually recognized through the housing 331 and the visible-light-transmitting region 110.

Furthermore, FIG. 20(A1) illustrates a front view of an electronic device 340, and FIG. 20(B) illustrates a rear view of the electronic device 340. Moreover, FIG. 20(A2) illustrates a cross-sectional view taken along dashed-dotted line D3-D4 in FIG. 20(A1).

The electronic device 340 includes the housing 331 and the display panel 100. Moreover, the electronic device 330 preferably includes a communication means. As the communication means, a wireless module, an antenna, and the like can be given. Furthermore, wired communication may be able to be performed using a connector or the like.

In addition, the electronic device 340 may include the speaker 332, the camera 333b, the light 334a, the operation button 335, the battery 336, the operation button 337, the microphone 338, the external connection port 342, and the like.

As illustrated in FIG. 20(A2), the electronic device 340 includes the display panel 100. As the display panel 100, for example, the display panel described in Embodiment 1 can be applied.

The display panel 100 includes the display region 101 and the region 102, which is a non-display region.

Part of the region 102, which is a non-display region, is the visible-light-transmitting region 110. The electronic device 340 includes a mechanism capable of exposing the visible-light-transmitting region 110 from the housing. Thus, a display portion of another electronic device and the visible-light-transmitting region 110 can overlap with each other. Furthermore, the electronic device 340 includes a mechanism capable of exposing part of the display region 101 from the housing. Thus, a visible-light-transmitting region of another electronic device and the display region 101 can overlap with each other.

In addition, by communication with the other electronic device using the communication means, the display region 101 and a display region of the other electronic device can be used as one display region where a seam is less likely to be visually recognized.

An example of the mechanism capable of exposing the visible-light-transmitting region 110 and the display region 101 is described with reference to FIGS. 20(C)-(F). FIGS. 20(C)-(F) are each an example of a cross-sectional view taken along dashed-dotted line D3-D4 in FIG. 20(A1).

For example, as illustrated in FIG. 20(C), a region 339a and a region 339b each of which is part of the housing 331 may be attachable and detachable. By detaching the region 339a and the region 339b, the visible-light-transmitting region 110 and the display region 101 can be exposed on one side of the display surface of the electronic device 340 and on the other opposite side, respectively.

Alternatively, as illustrated in FIG. 20(D), the region 339a and the region 339b may be rotatable. When the region 339a and the region 339b are rotated, the visible-light-transmitting region 110 and the display region 101 can be exposed.

Note that as illustrated in FIG. 20(E), a structure may be employed in which the visible-light-transmitting region 110 is exposed only on the rear surface side of the electronic device 340. For example, in the case where a region in a portion of the housing 331 which overlaps with the display surface side of the display panel 100 and overlaps with the visible-light-transmitting region 110 transmits visible light, display of a display panel of another electronic device can be visually recognized through the housing 331 and the visible-light-transmitting region 110.

Furthermore, as illustrated in FIG. 20(E), a structure in which the display region 101 is exposed only on the front surface side of the electronic device 340 may be employed. Note that a portion of the region 339b which overlaps with the display surface side of the display panel 100 and overlaps with the display region 101 transmits visible light. Therefore, without detachment or rotation of the region 339b, display on the display region 101 can be visually recognized through a visible-light-transmitting region of another electronic device and the region 339b. However, a step may be generated between the display region 101 and a display region of the other electronic device, and thus there is a possibility of a reduction in the display quality, such as a seam which is more likely to be visually recognized. Therefore, a distance between the display region 101 and the display region of the other electronic device in a thickness direction is preferably smaller.

Furthermore, as illustrated in FIG. 20(F), in the region 339a and the region 339b, mechanisms capable of exposing the visible-light-transmitting region 110 or the display region 101 may have different structures.

Figure 21A:
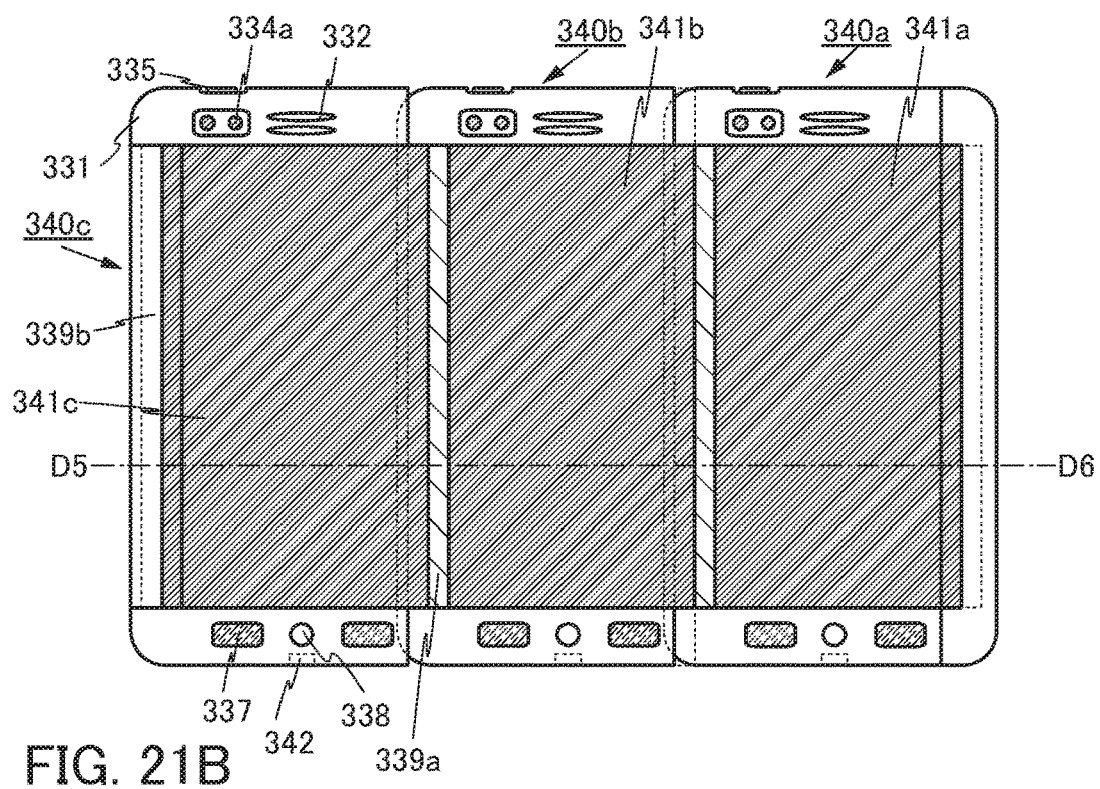
FIG. 21 Diagrams illustrating examples of an electronic device.
Figure 21B:
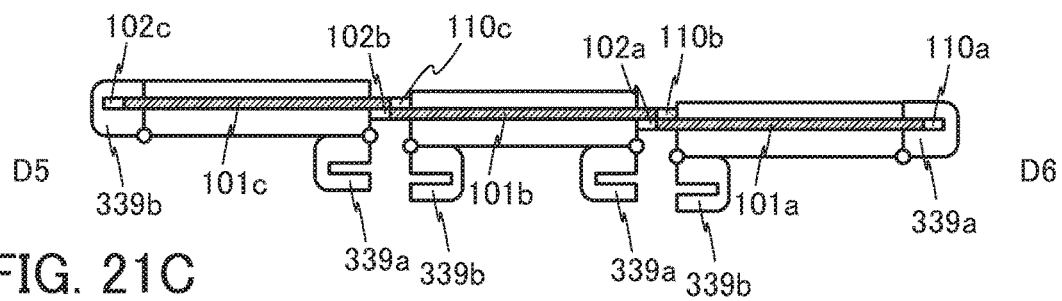

FIG. 21(A) illustrates an example in which one display region is formed using three electronic devices 340. FIG. 21(B) is a cross-sectional view taken along dashed-dotted line D5-D6 in FIG. 21(A).

With use of an electronic device in which the visible-light-transmitting region 110 and the display region 101 can be exposed on one side of a display surface and on the other opposite side, respectively, a large display region can be formed without limitation. Specifically, as for the two adjacent electronic devices, when the visible-light-transmitting region 110 and is included the upper electronic device overlaps with the display region 101 included in the lower electronic device, display on the entire display region 101 included in the lower electronic device can be visually recognized. In addition, a seam between the display region of the upper electronic device and the display region of the lower electronic device can be less likely to be visually recognized, so that the display regions of the upper electronic device and the lower electronic device can be used as one display region.

Figure 21C:
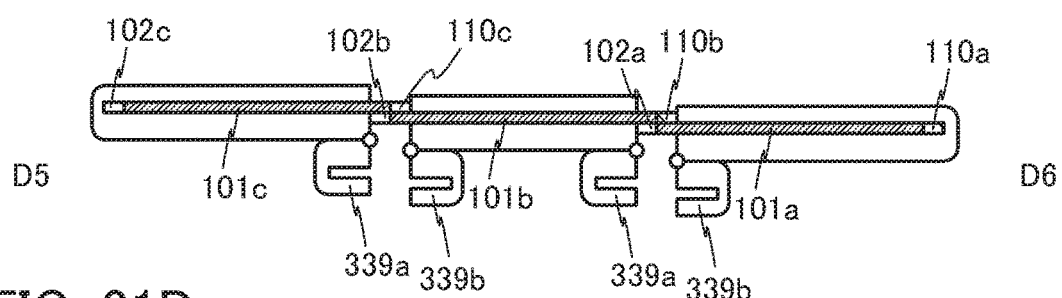

Note that as illustrated in FIG. 21(C), the electronic device positioned on the uppermost side may include only a mechanism capable of exposing the visible-light-transmitting region 110 and does not necessarily include a mechanism capable of exposing the display region 101. Moreover, the electronic device positioned on the lowermost side may include only a mechanism capable of exposing the display region 101 and does not necessarily include a mechanism capable of exposing the visible-light-transmitting region 110.

Note that although an example in which the mechanism capable of exposing the visible-light-transmitting region 110 and the mechanism capable of exposing the display region 101 are provided on the opposite sides of the display surface of the electronic device is described in this embodiment, one embodiment of the present invention is not limited thereto. For example, the electronic device may include one mechanism on the short side of the display surface and may include the other mechanism on the long side.

Figure 21D:
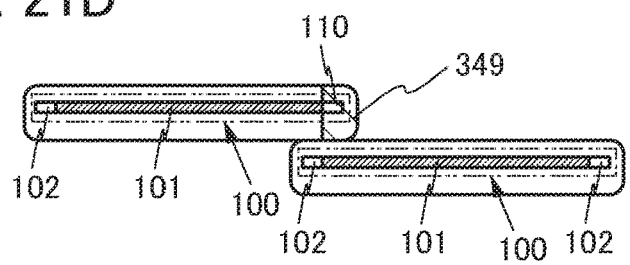

Alternatively, an electronic device not including the mechanisms capable of exposing the visible-light-transmitting region 110 and the display region 101 may overlap. Specifically, as illustrated in FIG. 21(D), the display region 101 included in the lower electronic device may be able to be visually recognized through the visible-light-transmitting region 110 and a visible-light-transmitting housing 349, which are included in the upper electronic device.

Note that in the electronic device in this embodiment, the display panel preferably has flexibility. Furthermore, the display panel may include a curved surface.

As described above, the electronic device in this embodiment can be used alone and can also be used as part of an electronic device having a larger display region by overlapping with another electronic device This embodiment can be combined with any of other embodiments as appropriate.

(Embodiment 3)

In this embodiment, usage examples of a display device and an electronic device of one embodiment of the present invention are described with reference to FIG. 22.

The display device or the electronic device of one embodiment of the present invention has characteristics of having flexibility and being thin and lightweight. Therefore, like a device 81 illustrated in FIGS. 22(A)-(D), the device can be used while being attached to clothes.

There is no particular limitation on the position to which the device 81 is attached, and the front, the back, a collar, a sleeve, a hood, and the like can be given, for example.

Furthermore, there is no limitation on clothes to which it is to be attached, and a top such as a shirt or a blouse; a bottom such as trousers or a skirt; a dress; overalls; and the like can be given, for example. Moreover, it may be attached to a scarf, a necktie, or the like.

FIG. 22(A), FIG. 22(B), FIG. 22(C), and FIG. 22(D) illustrate examples in which the devices 81 are attached to the front of a shirt; the front of a polo shirt; the collar and the sleeve of a shirt; and the back and the food of a top and a bottom.

The device 81 may be attached to be attachable to and detachable from clothes. For example, in the case where there is a possibility that the device 81 is damaged by washing, it is preferably detachable from clothes.

As the device 81, for example, the display device which is exemplified in Embodiment 1 and has a display region with a variable size or any of the electronic devices which are exemplified in Embodiment 2, have a function of being capable of executing at least any one of variety of applications such as mobile phone calls, e-mailing, viewing and editing texts, Internet communication, and computer games, and are capable of touch operation can be applied. Furthermore, the device 81 may be a lighting device and may be used for security reasons, for example.

Furthermore, the electronic device or the lighting device of one embodiment of the present invention has flexibility and therefore can be incorporated along a curved inside/outside wall surface of a house or a building or a curved interior/exterior surface of a car.

In the display device or the electronic device of one embodiment of the present invention, by increasing the number of display panels, the area of the display region can be increased unlimitedly. Thus, the display device or the electronic device of one embodiment of the present invention can be favorably used for digital signage, a PID, or the like. Furthermore, the external shape of the display region in the display device or the electronic device of one embodiment of the present invention can be any of various shapes when the arrangement of the display panels is changed.

Figure 22A:
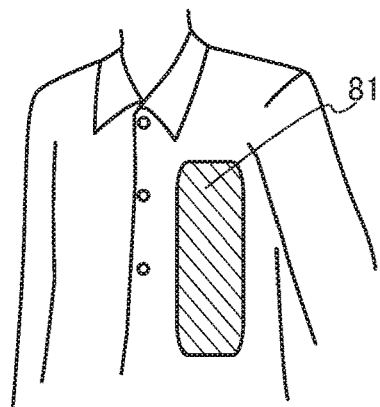
FIG. 22 Diagrams illustrating usage examples of a display device and an electronic device.
Figure 22B:
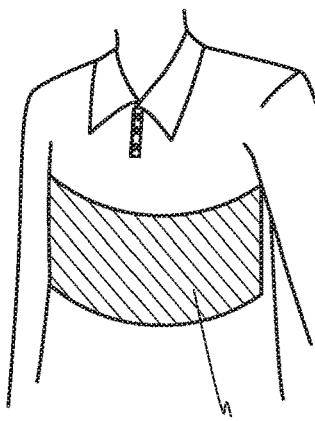
Figure 22C:
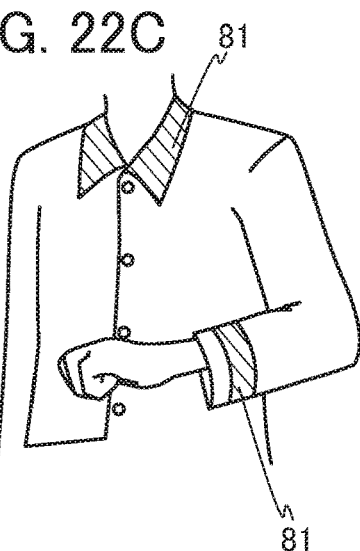
Figure 22D:
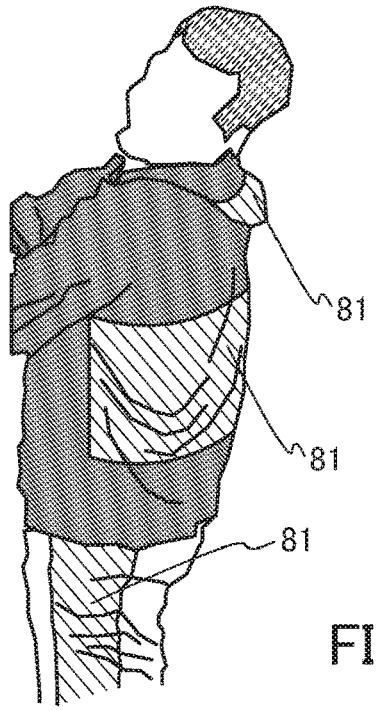
Figure 22E:
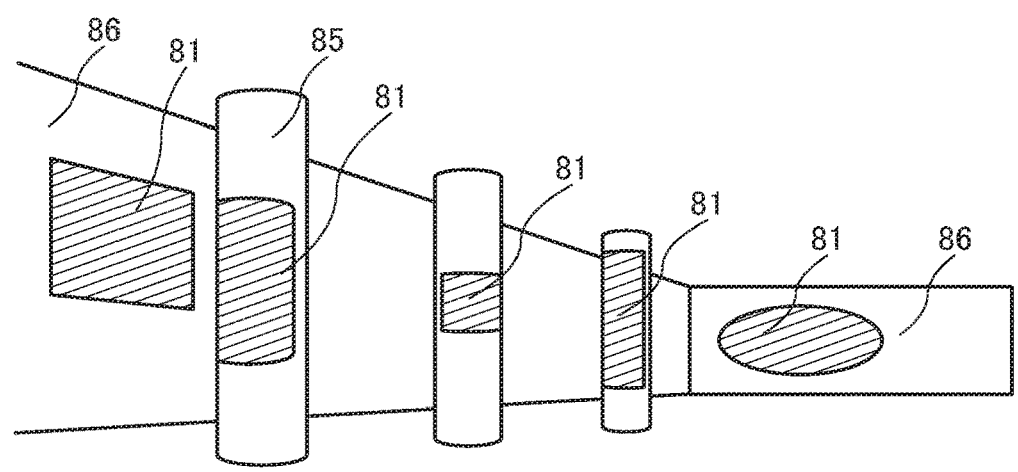

FIG. 22(E) illustrates an example in which the devices 81 are applied to pillars 85 and walls 86. A flexible display panel is used as a display panel used for the device 81, whereby the device 81 can be placed along a curved surface.

Here, in particular, in the case where the display device or the electronic device of one embodiment of the present invention is used in digital signage or a PID, it is preferable to use a touch panel in a display panel because a device with such a structure does not just display an image (a still image, a moving image, or the like) on a display region, but can be operated by viewers intuitively. Alternatively, in the case of use in an application for providing information such as route information or traffic information, usability can be enhanced by intuitive operation. In the case of providing the display device on the walls of buildings, public facilities, or the like, a touch panel does not need to be used in the display panel.

This embodiment can be combined with any of other embodiments as appropriate.

(Embodiment 4)

In this embodiment, examples in which two display panels are stacked are described with reference to FIG. 23 and FIG. 24.

FIG. 23 and FIG. 24 are each an example of a cross-sectional view when two display panels are stacked.

In each diagram of FIGS. 23(A)-(E), a lower display panel includes the display region 101a, a visible-light-transmitting region 110a, and the visible-light-blocking region 120a. The lower display panel is electrically connected to the FPC 112a. An upper display panel (on the display surface side) includes the display region 101b, the visible-light-transmitting region 110b, and the visible-light-blocking region 120b. The upper display panel is electrically connected to an FPC 112b.

Figure 23A:
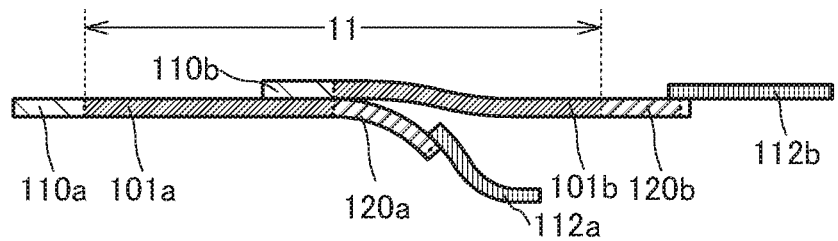
FIG. 23 Diagrams illustrating examples of a display device.

FIG. 23(A) illustrates an example in which the FPC 112a and the FPC 112b are connected to the display surface side (front surface side) of the lower display panel and the display surface side of the upper display panel, respectively.

When air exists between the visible-light-transmitting region of the upper display panel and the display region of the lower display panel here, part of light extracted from the display region is reflected at the interface between the display region and air and the interface between air and the visible-light-transmitting region, which may result in a decrease in luminance of the display. As a result, the light extraction efficiency of a region in which a plurality of display panels overlap with each other might be decreased. In addition, a difference in luminance of the display region of the lower display panel might occur between a portion overlapping with the visible-light-transmitting region of the upper display panel and a portion not overlapping with the visible-light-transmitting region of the upper display panel, so that a seam between the display panels is easily recognized by a user in some cases.

Figure 23B:
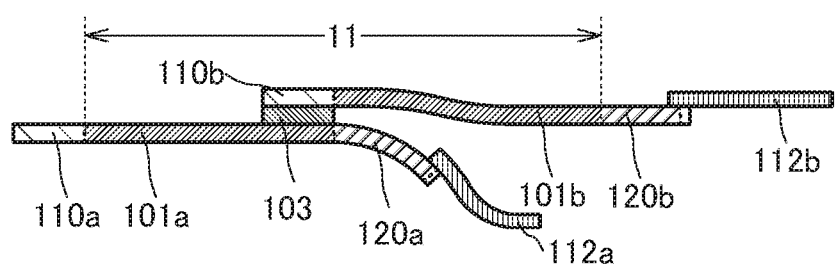

Therefore, as illustrated in FIG. 23(B), the display device preferably includes a light-transmitting layer 103 having a refractive index higher than that of air and transmitting visible light between the display region and the visible-light-transmitting region. Thus, air can be prevented from entering between the display region and the visible-light-transmitting region, so that the interface reflection due to a difference in refractive index can be reduced. In addition, display unevenness or luminance unevenness of the display device can be suppressed.

Note that the transmittance of the light-transmitting layer with respect to visible light is preferably as high as possible because the light extraction efficiency of the display device can be increased. For example, the light-transmitting layer preferably has a light transmittance of higher than or equal to 80% and further preferably higher than or equal to 90% on average at a wavelength longer than or equal to 450 nm and shorter than or equal to 700 nm.

The difference in refractive index between the light-transmitting layer and a layer in contact with the light-transmitting layer is preferably as small as possible because the light reflection can be suppressed. For example, the refractive index of the light-transmitting layer is higher than that of air, preferably higher than or equal to 1.3 and lower than or equal to 1.8. The difference in the refractive index between the light-transmitting layer and the layer in contact with the light-transmitting layer (e.g., a substrate included in the display panel) is preferably lower than or equal to 0.30, further preferably lower than or equal to 0.20, and still further preferably lower than or equal to 0.15.

It is preferable that the light-transmitting layer be detachably in contact with at least one of the lower display panel and the upper display panel. For example, it is preferable that the light-transmitting layer be able to be separated from the lower display panel or the upper display panel when an electronic device of one embodiment of the present invention is folded and then be able to bond both of the lower display panel and the upper display panel again when the display panels are pulled out of the electronic device.

Note that when there is no need to attach and detach the display panels, the display panels are fixed to each other with the light-transmitting layer including a material having an adhesive property (adhesive or the like).

Either of an inorganic material and an organic material can be used for the light-transmitting layer. A liquid substance, a gelatinous substance, or a solid substance can be used for the light-transmitting layer.

For the light-transmitting layer, a liquid substance such as water, a solution, a fluorine-based inactive liquid, a refractive liquid, or silicone oil can be used, for example.

In the case where the display device is placed so as to be inclined to the horizontal plane (a plane perpendicular to a direction in which gravity acts) or in the case where the display device is placed so as to be perpendicular to the horizontal plane, for example, the viscosity of a liquid substance is preferably 1 mPa·s or more, further preferably 1 Pa·s or more, still further preferably 10 Pa·s or more, and yet still further preferably 100 Pa·s or more. Note that in the case where the display device is placed so as to be parallel to the horizontal plane, for example, the viscosity is not limited to the above.

The light-transmitting layer is preferably inactive because another layer included in the display device can be prevented from being damaged, for example.

A material contained in the light-transmitting layer is preferably nonvolatile. Accordingly, an entry of air into the interface due to volatilization of a material used for the light-transmitting layer can be prevented.

Furthermore, for the light-transmitting layer, a high molecular material can be used. For example, a resin such as an epoxy resin, an acrylic resin, a silicone resin, a phenol resin, a polyimide resin, an imide resin, a PVC (polyvinyl chloride) resin, a PVB (polyvinyl butyral) resin, or an EVA (ethylene vinyl acetate) resin can be given. Alternatively, a two-component type resin may be used. For example, an adhesive sheet or any of a variety of curable adhesives such as a reactive curable adhesive, a thermosetting adhesive, an anaerobic adhesive, and a photo-curable adhesive such as an ultraviolet curable adhesive containing at least one of these resins may be used. The adhesives does not need to be cured in the case where, for example, the display panels are not fixed to each other.

The light-transmitting layer is preferably a layer having high self-attachability to an object. In addition, the light-transmitting layer is preferably a layer having high separability against an object. After the light-transmitting layer attached to the display panel is separated from the display panel, it is preferable that the light-transmitting layer be able to be attached to the display panel again.

In addition, it is preferable that the light-transmitting layer have no adhesiveness or low adhesiveness. In that case, attachment and separation of the light-transmitting layer to and from an object can be repeated without damaging or contaminating a surface of the object.

As the light-transmitting layer, a film having attachability or a film having adhesiveness can be used, for example. Moreover, in the case where an attachment film having a stacked-layer structure of an attachment layer or an adhesive layer and a base material is used, the attachment layer or the adhesive layer may function as the light-transmitting layer of the display device, and the base material may function as a substrate included in the display panel. Note that the display device may have a substrate in addition to the base material in the attachment film. The attachment film may include an anchor layer between the attachment layer or the adhesive layer and the base material. The anchor layer has a function of enhancing the adhesiveness between the attachment layer or the adhesive layer and the base material. In addition, the anchor layer has a function of smoothing a surface of the base material coated with the attachment layer or the adhesive layer. In this manner, bubbles can be made hardly generated between the object and the light-transmitting layer.

A film in which a silicone resin layer and a polyester film are stacked can be preferably used in the display device, for example. Here, the silicone resin layer has attachability and functions as the light-transmitting layer. Furthermore, the polyester film serves as a substrate included in the display panel. Note that another substrate forming the display panel may be provided in addition to the polyester film.

Note that in the case where a film in which an attachment layer, a base material, and an adhesive layer or a bonding layer are stacked is used, the attachment layer functions as a light-transmitting layer of the display device; the base material functions as a substrate included in the display panel; and the adhesive layer or the bonding layer functions as a layer for attaching an element layer of the display panel to the substrate.

The thickness of the light-transmitting layer is not particularly limited. For example, the thickness may be greater than or equal to 1 µm and less than or equal to 50 µm. The thickness of the light-transmitting layer can be greater than 50 µm; however, in the case of manufacturing a flexible display device, the thickness of the light-transmitting layer is preferably set such that the flexibility of the display device is not reduced. For example, the thickness of the light-transmitting layer is preferably greater than or equal to 10 µm and less than or equal to 30 µm. Alternatively, the thickness of the light-transmitting layer can be less than 1 µm.

The display region 101a overlaps with the visible-light-transmitting region 110b with the light-transmitting layer 103 provided therebetween. Thus, air can be prevented from entering between the display region 101a and the visible-light-transmitting region 110b, so that interface reflection due to a difference in refractive index can be reduced.

Accordingly, a difference in luminance of the display region 101a between a portion overlapping with the visible-light-transmitting region 110b and a portion not overlapping with the visible-light-transmitting region 110b can be suppressed, so that a seam between the display panels of the display device can be hardly recognized by a user of the display device. In addition, display unevenness or luminance unevenness of the display device can be suppressed.

The visible-light-blocking region 120a and the FPC 112a each overlap with the display region 101b. Thus, a sufficient area of a non-display region can be secured and a seamless display region can be increased in size, so that a highly reliable large display device can be achieved.

Figure 23C:
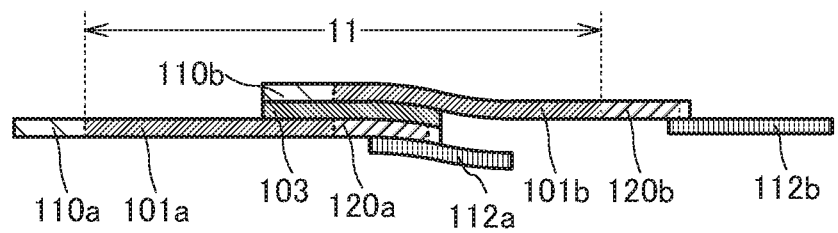

FIG. 23(C) illustrates an example in which the FPC 112a and the FPC 112b are connected to the side (rear surface side) opposite to the display surface of the lower display panel and the side (rear surface side) opposite to the display surface of the upper display panel, respectively.

As illustrated in FIG. 23(C), the light-transmitting layer 103 may also be provided between the visible-light-blocking region 120a of the lower display panel and the display region 101b of the upper display panel.

When a structure in which an FPC is connected to the rear surface side of a display panel is employed, an end portion of the lower display panel can be attached to the rear surface of an upper display panel; thus, the attachment area can be increased and the mechanical strength of the attached portion can be increased.

Figure 23D:
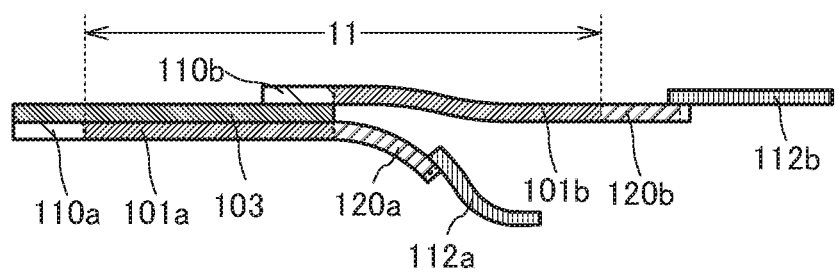

As illustrated in FIG. 23(D), the light-transmitting layer 103 may overlap with a region of the display region 101a not overlapping with the upper display panel. Furthermore, the visible-light-transmitting region 110a and the light-transmitting layer 103 may overlap with each other.

Figure 23E:
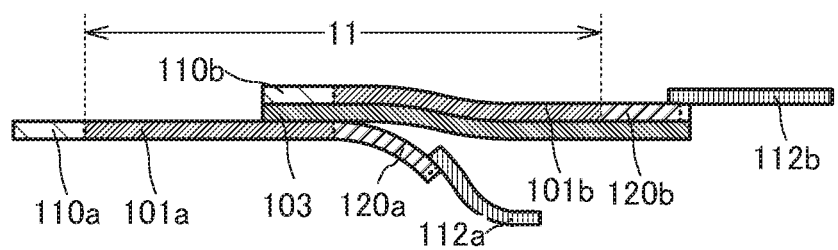

Furthermore, as illustrated in FIG. 23(E), the light-transmitting layer 103 may overlap with a region of the upper display panel not overlapping with the display region 101a.

Figure 24A:
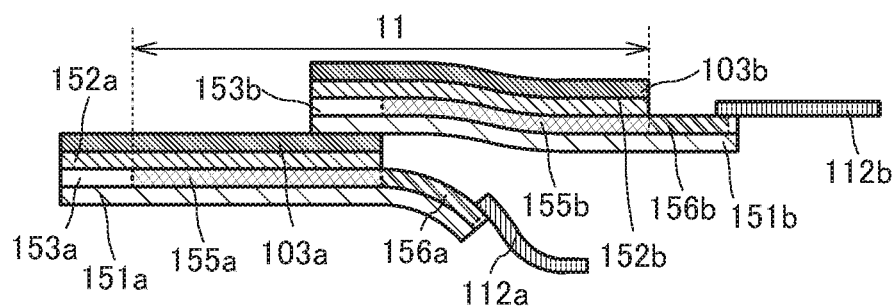
FIG. 24 Diagrams illustrating examples of a display device.

Moreover, as illustrated in FIG. 24(A), the lower display panel may include a substrate 151a, a substrate 152a, and an element layer 153a, and the upper display panel may include a substrate 151b, a substrate 152b, and an element layer 153b, for example.

The element layer 153a has a region 155a including a display element and a region 156a including a wiring electrically connected to the display element. The wiring included in the region 156a is electrically connected to the FPC 112a.

Similarly, the element layer 153b of the upper display panel has a region 155b including a display element and a region 156b including a wiring electrically connected to the display element. The wiring included in the region 156b is electrically connected to the FPC 112b.

A light-transmitting layer 103a is provided over the substrate 152a. For example, a stacked structure of the substrate 152a and the light-transmitting layer 103a can be formed using the above-described attachment film having a stack of an attachment layer and a base material. The substrate 152b and a light-transmitting layer 103b can have a similar structure.

Here, fine dirt such as dust in the air might be attached depending on a material of the light-transmitting layer. In such a case, it is preferable that the region of the display region 101a not overlapping with the upper display panel do not overlap with the light-transmitting layer 103. This makes it possible to prevent unclear display of the display device due to dirt or the like attached to the light-transmitting layer 103.

Figure 24B:
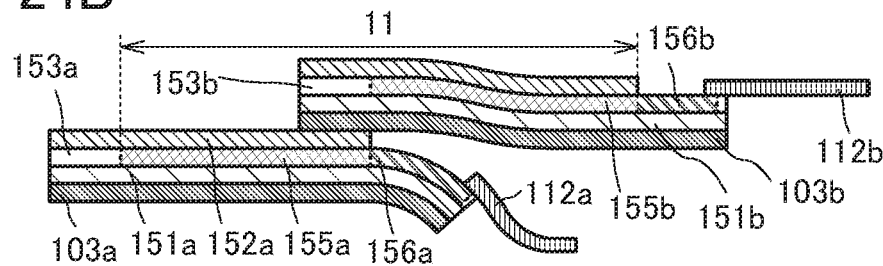

As illustrated in FIG. 24(B), the light-transmitting layer 103a may be provided in contact with the substrate 151a. For example, a stacked structure of the substrate 151a and the light-transmitting layer 103a can be formed using the above-described attachment film having a stack of an attachment layer and a base material. The substrate 151b and the light-transmitting layer 103b can have a similar structure.

In the structure illustrated in FIG. 24(B), the light-transmitting layer is not provided on the outermost surface of the display surface of the display device; thus, unclear display of the display device due to dirt or the like attached to the light-transmitting layer 103 can be prevented. In addition, when a light-transmitting layer having attachability is provided on the rear surface of the display device, the display device can be detachably attached to a desired portion with the use of a surface of the light-transmitting layer which is not in contact with the display panel.

This embodiment can be combined with any of other embodiments as appropriate.

(Embodiment 5)

In this embodiment, a light-emitting panel which is an example of a display panel is described with reference to drawings.

Although a light-emitting panel including an organic EL element is mainly described in this embodiment as an example, a panel that can be used for the display device or the electronic device of one embodiment of the present invention is not limited to this.

<Specific Example 1>

Figures 25A, 25B, 25C:
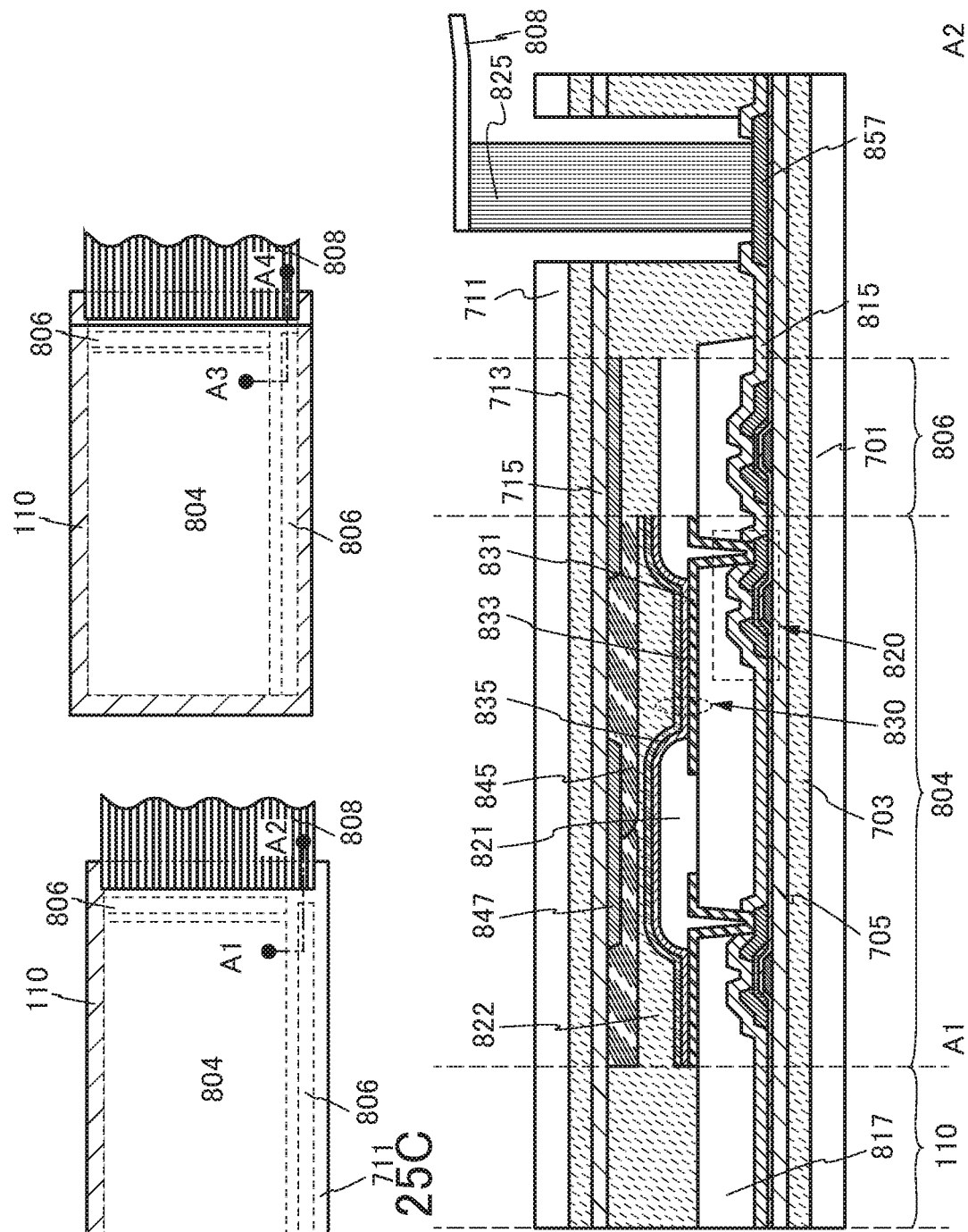
FIG. 25 Diagrams illustrating examples of a light-emitting panel.

FIG. 25(A) is a plan view of a light-emitting panel, and FIG. 25(C) is an example of a cross-sectional view taken along dashed-dotted line A1-A2 in FIG. 25(A). FIG. 25(C) also shows an example of a cross-sectional view of the visible-light-transmitting region 110. The light-emitting panel in Specific Example 1 is a top-emission light-emitting panel using a color filter method. In this embodiment, the light-emitting panel can have a structure in which sub-pixels of three colors of R (red), G (green), and B (blue) express one color, a structure in which sub-pixels of four colors of R, G, B, and W (white) express one color, a structure in which sub-pixels of four colors of R, G, B, and Y (yellow) express one color, or the like. There is no particular limitation on the color element and colors other than R, G, B, W, and Y may be used. For example, cyan, magenta, or the like may be used.

The light-emitting panel illustrated in FIG. 25(A) includes the visible-light-transmitting region 110, a light-emitting portion 804, a driver circuit portion 806, and an FPC 808. The visible-light-transmitting region 110 is adjacent to the light-emitting portion 804 and is provided along the two sides of the light-emitting portion 804.

The light-emitting panel illustrated in FIG. 25(C) includes a substrate 701, a bonding layer 703, an insulating layer 705, a plurality of transistors, a conductive layer 857, an insulating layer 815, an insulating layer 817, a plurality of light-emitting elements, an insulating layer 821, a bonding layer 822, a coloring layer 845, a light-blocking layer 847, an insulating layer 715, a bonding layer 713, and a substrate 711. The bonding layer 822, the insulating layer 715, the bonding layer 713, and the substrate 711 transmit visible light. The light-emitting elements and the transistors included in the light-emitting portion 804 and the driver circuit portion 806 are sealed with the substrate 701, the substrate 711, and the bonding layer 822.

The light-emitting portion 804 includes a transistor 820 and a light-emitting element 830 over the substrate 701 with the bonding layer 703 and the insulating layer 705 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. It is preferable that the lower electrode 831 reflect visible light. The upper electrode 835 transmits visible light.

In addition, the light-emitting portion 804 includes the coloring layer 845 overlapping with the light-emitting element 830 and the light-blocking layer 847 overlapping with the insulating layer 821. The space between the light-emitting element 830 and the coloring layer 845 is filled with the bonding layer 822.

The insulating layer 815 has an effect of inhibiting diffusion of impurities to a semiconductor included in the transistor. Furthermore, as the insulating layer 817, an insulating layer having a planarization function is preferably selected in order to reduce surface unevenness due to the transistor.

The driver circuit portion 806 includes a plurality of transistors over the substrate 701 with the bonding layer 703 and the insulating layer 705 provided therebetween. In FIG. 25(C), one of the transistors included in the driver circuit portion 806 is illustrated.

The insulating layer 705 and the substrate 701 are attached to each other with the bonding layer 703. Moreover, the insulating layer 715 and the substrate 711 are attached to each other with the bonding layer 713. A film highly resistant to moisture is preferably used for at least one of the insulating layer 705 and the insulating layer 715, in which case impurities such as water can be prevented from entering the light-emitting element 830 and the transistor 820, leading to higher reliability of the light-emitting panel.

The conductive layer 857 is electrically connected to an external input terminal through which a signal (e.g., a video signal, a clock signal, a start signal, or a reset signal) or a potential from the outside is transmitted to the driver circuit portion 806. Here, an example in which the FPC 808 is provided as the external input terminal is described. To prevent an increase in the number of manufacturing steps, the conductive layer 857 is preferably formed using the same material and the same step(s) as those of the electrode or the wiring in the light-emitting portion or the driver circuit portion. Here, an example is described in which the conductive layer 857 is formed using the same material and the same step(s) as those of the electrodes of the transistor 820.

In the light-emitting panel illustrated in FIG. 25(C), the FPC 808 is positioned over the substrate 711. A connector 825 is connected to the conductive layer 857 through an opening provided in the substrate 711, the bonding layer 713, the insulating layer 715, the bonding layer 822, the insulating layer 817, and the insulating layer 815. Moreover, the connector 825 is connected to the FPC 808. The FPC 808 and the conductive layer 857 are electrically connected to each other through the connector 825. In the case where the conductive layer 857 overlaps with the substrate 711, an opening in the substrate 711 (or the use of a substrate having an opening portion) allows the connector 825 to be electrically connected to the conductive layer 857 and the FPC 808.

Figure 26:
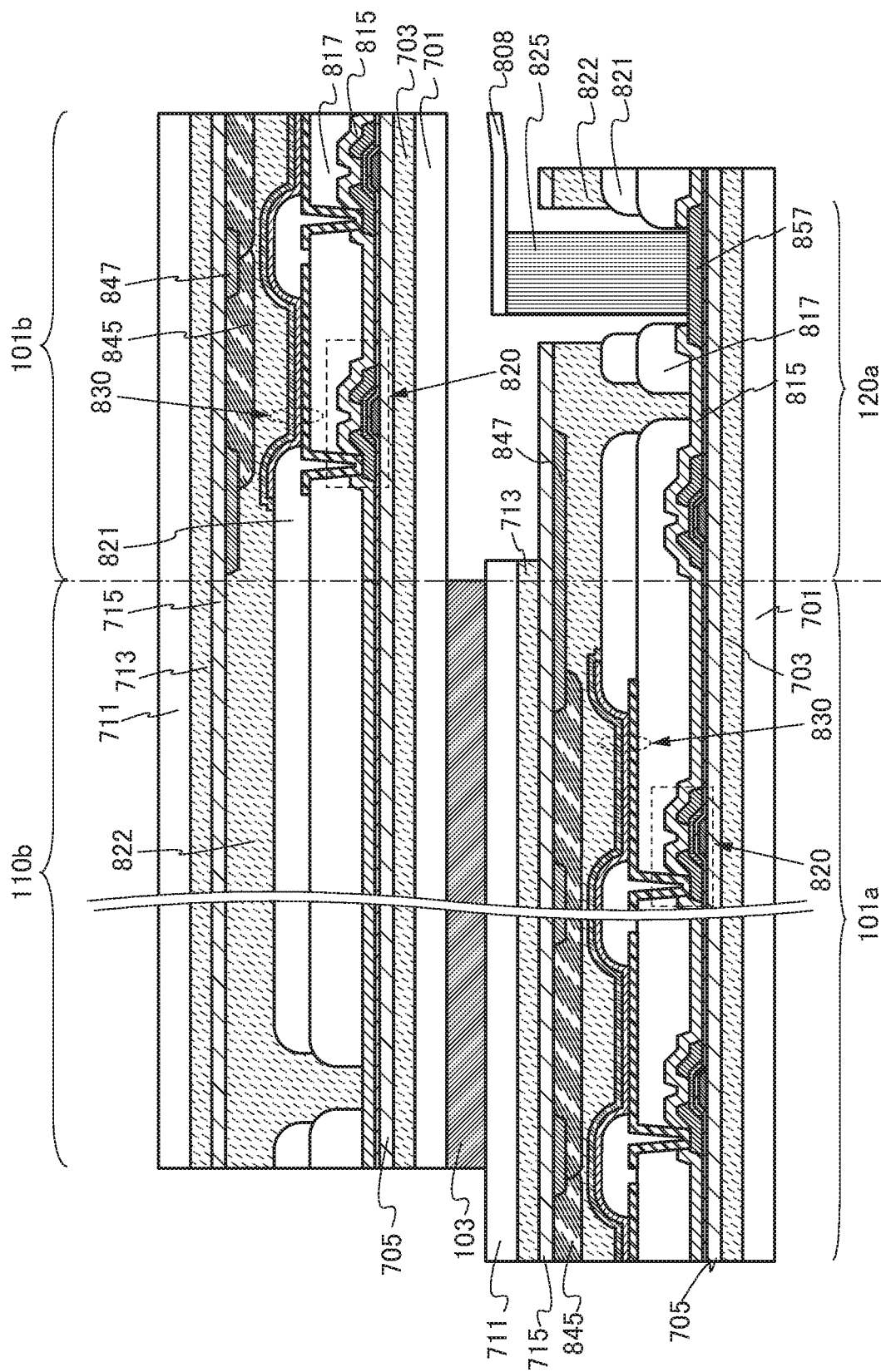
FIG. 26 A diagram illustrating an example of a display device.

FIG. 26 illustrates an example of a cross-sectional view of a display device including two light-emitting panels illustrated in FIG. 25(B) that overlap with each other. FIG. 26 illustrates the display region 101a (corresponding to the light-emitting portion 804 in FIG. 25(B)) and the visible-light-blocking region 120a (corresponding to the driver circuit portion 806 and the like in FIG. 25(B)) of a lower light-emitting panel, and the display region 101b (corresponding to the light-emitting portion 804 in FIG. 25(B)) and the visible-light-transmitting region 110*b* (corresponding to the visible-light-transmitting region 110 in FIG. 25(B)) of an upper light-emitting panel.

In the display device illustrated in FIG. 26, the light-emitting panel positioned on the display surface side (upper side) includes the visible-light-transmitting region 110*b* adjacent to the display region 101*b*. The display region 101*a* of the lower light-emitting panel and the visible-light-transmitting region 110*b* of the upper light-emitting panel overlap with each other. Thus, a non-display region between the display regions of the two light-emitting panels overlapping with each other can be reduced or even removed. Accordingly, a large display device in which a seam between light-emitting panels is hardly recognized by a user can be obtained.

Furthermore, the display device illustrated in FIG. 26 includes the light-transmitting layer 103 having a refractive index higher than that of air and transmitting visible light between the display region 101*a* and the visible-light-transmitting region 110*b*. As a result, entry of air between the display region 101*a* and the visible-light-transmitting region 110*b* can be inhibited and reflection at an interface due to the difference of refractive indices can be reduced. In addition, display unevenness or luminance unevenness of the display device can be suppressed.

The light-transmitting layer 103 may overlap with the entire surface of the substrate 711 of the lower light-emitting panel or that of the substrate 701 of the upper light-emitting panel, or may overlap with only the display region 101*a* and the visible-light-transmitting region 110*b*. In addition, the substrate 711 and the light-transmitting layer 103 may be included in the region visible-light-blocking 120*a*.

The stack structure of the substrate 701 of the upper light-emitting panel and the light-transmitting layer 103 can be formed using, for example, an attachment film having a stack of an attachment layer and a base material.

<Specific Example 2>

FIG. 25(B) illustrates a plan view of a light-emitting panel, and FIG. 27(A) illustrates an example of a cross-sectional view taken along dashed-dotted line A3-A4 in FIG. 25(B). The light-emitting panel described in Specific Example 2 is a top-emission light-emitting panel using a color filter method, which is different from that described in Specific Example 1. Here, only different points from those of Specific Example 1 are described and the description of the same points as Specific Example 1 is omitted.

FIG. 25(B) illustrates an example where the visible-light-transmitting region 110 is provided along three sides of the light-emitting panel. On two sides of them, the visible-light-transmitting region 110 is adjacent to the light-emitting portion 804.

The light-emitting panel illustrated in FIG. 27(A) is different from the light-emitting panel illustrated in FIG. 25(C) in the following aspects.

The light-emitting panel illustrated in FIG. 27(A) includes an insulating layer 817*a* and an insulating layer 817*b* and a conductive layer 856 over the insulating layer 817*a*. The source electrode or the drain electrode of the transistor 820 and the lower electrode of the light-emitting element 830 are electrically connected to each other through the conductive layer 856.

The light-emitting panel illustrated in FIG. 27(A) includes a spacer 823 over the insulating layer 821. Provision of the spacer 823 allows the distance between the substrate 701 and the substrate 711 to be adjusted.

The light-emitting panel illustrated in FIG. 27(A) includes an overcoat 849 covering the coloring layer 845 and the light-blocking layer 847. The space between the light-emitting element 830 and the overcoat 849 is filled with the bonding layer 822.

In the light-emitting panel illustrated in FIG. 27(A), the substrate 701 differs from the substrate 711 in size. The FPC 808 is located over the insulating layer 715 and does not overlap with the substrate 711. The connector 825 is connected to the conductive layer 857 through an opening provided in the insulating layer 715, the bonding layer 822, the insulating layer 817*a*, the insulating layer 817*b*, and the insulating layer 815. Since no opening needs to be provided in the substrate 711, there is no limitation on the material of the substrate 711.

Note that as illustrated in FIG. 27(B), the light-emitting element 830 may include an optical adjustment layer 832 between the lower electrode 831 and the EL layer 833. It is preferable to use a conductive material having a light-transmitting property for the optical adjustment layer 832. Owing to the combination of a color filter (the coloring layer) and a microcavity structure (the optical adjustment layer), light with high color purity can be extracted from the display device of one embodiment of the present invention. The thickness of the optical adjustment layer is varied depending on the emission color of the sub-pixel.

<Specific Example 3>

FIG. 25(B) illustrates a plan view of a light-emitting panel, and FIG. 27(C) illustrates an example of a cross-sectional view taken along dashed-dotted line A3-A4 in FIG. 25(B). The light-emitting panel described in Specific Example 3 is a top-emission light-emitting panel using a separate coloring method.

The light-emitting panel in FIG. 27(C) includes the substrate 701, the bonding layer 703, the insulating layer 705, a plurality of transistors, the conductive layer 857, the insulating layer 815, the insulating layer 817, a plurality of light-emitting elements, the insulating layer 821, the spacer 823, the bonding layer 822, and the substrate 711. The bonding layer 822 and the substrate 711 transmit visible light.

In the light-emitting panel illustrated in FIG. 27(C), the connector 825 is positioned over the insulating layer 815. The connector 825 is connected to the conductive layer 857 through an opening provided in the insulating layer 815. Moreover, the connector 825 is connected to the FPC 808. The FPC 808 and the conductive layer 857 are electrically connected to each other through the connector 825.

<Specific Example 4>

Figure 28A:
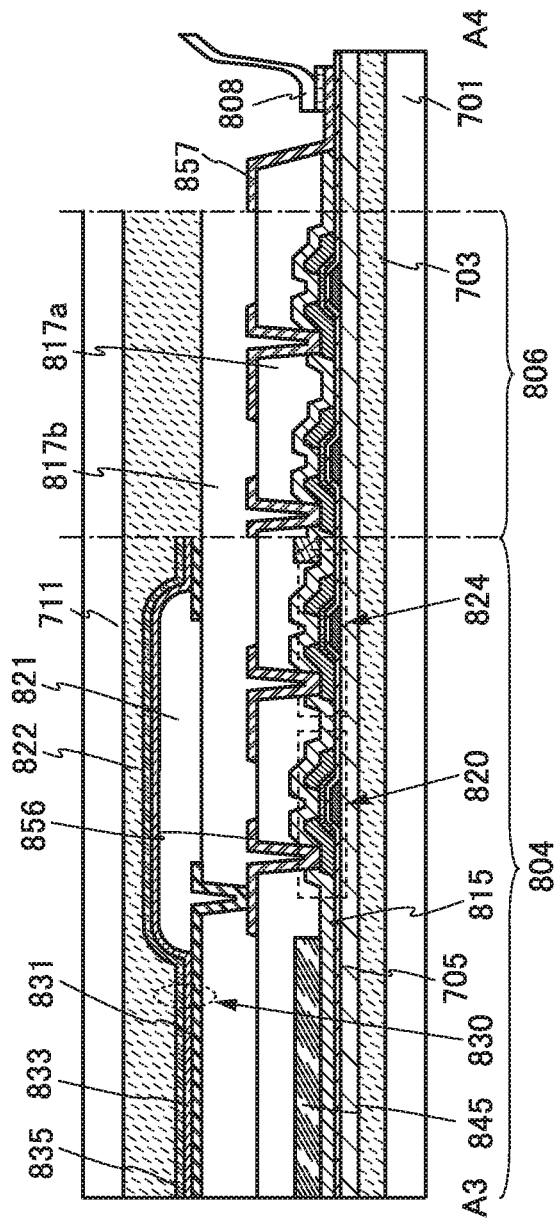
FIG. 28 Diagrams illustrating examples of a light-emitting panel.

FIG. 25(B) illustrates a plan view of a light-emitting panel, and FIG. 28(A) illustrates an example of a cross-sectional view taken along dashed-dotted line A3-A4 in FIG. 25(B). The light-emitting panel described in Specific example 4 is a bottom-emission light-emitting panel using a color filter method.

The light-emitting panel in FIG. 28(A) includes the substrate 701, the bonding layer 703, the insulating layer 705, a plurality of transistors, the conductive layer 857, the insulating layer 815, the coloring layer 845, the insulating layer 817*a*, the insulating layer 817*b*, the conductive layer 856, a plurality of light-emitting elements, the insulating layer 821, the bonding layer 822, and the substrate 711. The substrate 701, the bonding layer 703, the insulating layer 705, the insulating layer 815, the insulating layer 817*a*, and the insulating layer 817*b* transmit visible light.

The light-emitting portion 804 includes the transistor 820, a transistor 824, and the light-emitting element 830 over the substrate 701 with the bonding layer 703 and the insulating layer 705 provided therebetween. The light-emitting element 830 includes the lower electrode 831 over the insulating layer 817, the EL layer 833 over the lower electrode 831, and the upper electrode 835 over the EL layer 833. The lower electrode 831 is electrically connected to the source electrode or the drain electrode of the transistor 820. An end portion of the lower electrode 831 is covered with the insulating layer 821. It is preferable that the upper electrode 835 reflect visible light. The lower electrode 831 transmits visible light. There is no particular limitation on the position to provide the coloring layer 845 overlapping with the light-emitting element 830; for example, it can be provided between the insulating layer 817a and the insulating layer 817b or between the insulating layer 815 and the insulating layer 817a.

The driver circuit portion 806 includes a plurality of transistors over the substrate 701 with the bonding layer 703 and the insulating layer 705 provided therebetween. FIG. 28(A) illustrates two of the transistors included in the driver circuit portion 806.

The insulating layer 705 and the substrate 701 are attached to each other with the bonding layer 703. A film highly resistant to moisture is preferably used for the insulating layer 705, in which case impurities such as water can be prevented from entering the light-emitting element 830, the transistor 820, and the transistor 824, leading to higher reliability of the light-emitting panel.

The conductive layer 857 is electrically connected to an external input terminal through which a signal or a potential from the outside is transmitted to the driver circuit portion 806. Here, an example in which the FPC 808 is provided as the external input terminal is described. Furthermore, here, an example is described in which the conductive layer 857 is formed using the same material and the same step(s) as those of the conductive layer 856.

<Specific Example 5>

Figure 28B:
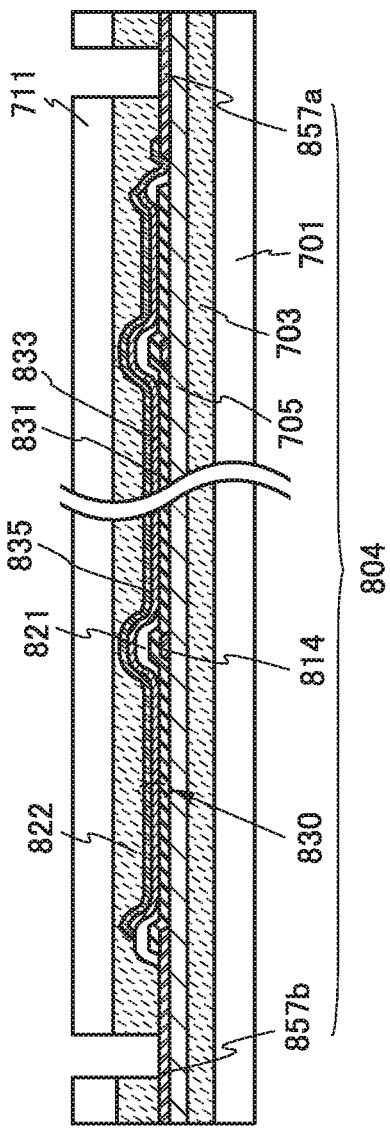

FIG. 28(B) illustrates an example of a light-emitting panel that is different from those in Specific examples 1 to 4.

A light-emitting panel in FIG. 28(B) includes the substrate 701, the bonding layer 703, the insulating layer 705, a conductive layer 814, a conductive layer 857a, a conductive layer 857b, the light-emitting element 830, the insulating layer 821, the bonding layer 822, and the substrate 711.

The conductive layer 857a and the conductive layer 857b, which are external connection electrodes of the light-emitting panel, can each be electrically connected to an FPC or the like.

The light-emitting element 830 includes the lower electrode 831, the EL layer 833, and the upper electrode 835. An end portion of the lower electrode 831 is covered with the insulating layer 821. The light-emitting element 830 has a bottom emission structure, a top emission structure, or a dual emission structure. The electrode, the substrate, the insulating layer, and the like on the light extraction side each transmit visible light. The conductive layer 814 is electrically connected to the lower electrode 831.

The substrate on the light extraction side may have, as a light extraction structure, a hemispherical lens, a micro lens array, a film provided with an uneven structure, a light diffusing film, or the like. For example, a substrate having the light extraction structure can be formed by bonding the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be formed with a single layer or a stacked layer using a material selected from copper, titanium, tantalum, tungsten, molybdenum, chromium, neodymium, scandium, nickel, or aluminum, an alloy material containing any of them as its main component, and the like. The thickness of the conductive layer 814 can be greater than or equal to 0.1 µm and less than or equal to 3 µm, preferably greater than or equal to 0.1 µm and less than or equal to 0.5 µm, for example.

<Examples of Materials>

Next, materials and the like that can be used for the light-emitting panel are described. Note that description on the components already described in this specification is omitted in some cases.

For the substrates, a material such as glass, quartz, an organic resin, metal, an alloy, or the like can be used. For the substrate through which light is extracted from the light-emitting element, a material which transmits the light is used.

In particular, a flexible substrate is preferably used. For example, an organic resin; or glass, a metal, or an alloy that is thin enough to have flexibility; can be used.

An organic resin, which has a specific gravity smaller than that of glass, is preferably used for the flexible substrate, in which case the light-emitting panel can be more lightweight as compared with the case where glass is used.

For the substrate, a material with high toughness is preferably used. Thus, a light-emitting panel with high impact resistance that is less likely to be broken can be provided. For example, when an organic resin substrate or a thin metal or alloy substrate is used, the light-emitting panel that is lightweight and unlikely to be broken as compared with the case where a glass substrate is used can be provided.

A metal material and an alloy material, which have high thermal conductivity, are each preferable because they can easily conduct heat to the whole substrate and accordingly can prevent a local temperature rise in the light-emitting panel. The thickness of a substrate using a metal material or an alloy material is preferably greater than or equal to 10 µm and less than or equal to 200 µm, further preferably greater than or equal to 20 µm and less than or equal to 50 µm.

There is no particular limitation on a material for the metal substrate or the alloy substrate, but, for example, aluminum, copper, nickel, a metal alloy such as an aluminum alloy or stainless steel, or the like can be preferably used.

Furthermore, when a material with high thermal emissivity is used for the substrate, the surface temperature of the light-emitting panel can be prevented from rising, so that breakage or a decrease in reliability of the light-emitting panel can be prevented. For example, the substrate may have a stacked-layer structure of a metal substrate and a layer with high thermal emissivity (a metal oxide or a ceramic material can be used, for example).

As a material having flexibility and a light-transmitting property, for example, a material for the protective substrate 132 described in Embodiment 1 can be given.

The flexible substrate may be formed with a stacked layer of a layer of any of the above-mentioned materials and a hard coat layer by which a surface of the device is protected from damage or the like (e.g., a silicon nitride layer), a layer of a material that can disperse pressure (e.g., an aramid resin layer), or the like.

For the flexible substrate, a stack of a plurality of layers can also be used. In particular, when a structure including a glass layer is employed, a barrier property against water or oxygen can be improved and thus a highly reliable light-emitting panel can be obtained.

For example, a flexible substrate in which a glass layer, a bonding layer, and an organic resin layer are stacked from the side closer to a light-emitting element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water or oxygen and a high flexibility. The thickness of the organic resin layer is greater than or equal to 10 μm and less than or equal to 200 μm, preferably greater than or equal to 20 μm and less than or equal to 50 μm. By providing such an organic resin layer, a crack or a break in the glass layer can be suppressed and mechanical strength can be improved. When such a composite material of a glass material and an organic resin is used for the substrate, a highly reliable and flexible light-emitting panel can be provided.

As the bonding layer, a variety of curable adhesives such as a reactive curable adhesive, a thermosetting adhesive, an anaerobic adhesive, and a photo-curable adhesive such as an ultraviolet curable adhesive can be used. As these adhesives, an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, and the like can be given. In particular, a material with low moisture permeability, such as an epoxy resin, is preferred. Alternatively, a two-component type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because impurities such as water can be prevented from entering the functional element, thereby improving the reliability of the light-emitting panel.

In addition, it is preferable to mix a filler with a high refractive index or light-scattering member into the resin, in which case the efficiency of light extraction from the light-emitting element can be improved. For example, titanium oxide, barium oxide, zeolite, zirconium, or the like can be used.

Insulating films highly resistant to moisture are preferably used as the insulating layer 705 and the insulating layer 715. Alternatively, the insulating layer 705 and the insulating layer 715 each preferably have a function of preventing diffusion of impurities to the light-emitting element.

As the insulating film highly resistant to moisture, a film containing nitrogen and silicon, such as a silicon nitride film or a silicon nitride oxide film; a film containing nitrogen and aluminum, such as an aluminum nitride film; or the like can be given. Alternatively, a silicon oxide film, a silicon oxynitride film, an aluminum oxide film, or the like may be used.

For example, the permeation amount of water vapor of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

In the light-emitting panel, it is necessary that at least one of the insulating layer 705 and the insulating layer 715 transmit light emitted from the light-emitting element. One of the insulating layer 705 and the insulating layer 715, which transmits light emitted from the light-emitting element, preferably has higher average transmittance of light having a wavelength greater than or equal to 400 nm and less than or equal to 800 nm than the other.

The insulating layer 705 and the insulating layer 715 each preferably include oxygen, nitrogen, and silicon. The insulating layer 705 and the insulating layer 715 each preferably include, for example, silicon oxynitride. Moreover, the insulating layer 705 and the insulating layer 715 each preferably include silicon nitride or silicon nitride oxide. It is preferable that the insulating layer 705 and the insulating layer 715 each have a stacked-layer structure of a silicon oxynitride film and a silicon nitride film and that the silicon oxynitride film and the silicon nitride film be in contact with each other. The silicon oxynitride film and the silicon nitride film are alternately stacked so that antiphase interference occurs more often in a visible region, whereby the visible light transmittance of the stack can be increased.

The structure of the transistors included in the light-emitting panel is not particularly limited. For example, a forward staggered transistor or an inverted staggered transistor may be used. Furthermore, either a top-gate transistor structure or a bottom-gate transistor structure may be employed. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistor, and any of an amorphous semiconductor and a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

In one embodiment of the present invention, a CAAC-OS (c-axis aligned crystalline oxide semiconductor) is preferably used as a semiconductor material used for the transistors. Unlike amorphous semiconductor, the CAAC-OS has few defect states, so that the reliability of the transistor can be improved. Moreover, since the CAAC-OS has a feature that a grain boundary is not found, a stable and uniform film can be formed over a large area, and in addition, a crack is less likely to be generated in a CAAC-OS film by stress caused when a flexible light-emitting device is bent.

A CAAC-OS is a crystalline oxide semiconductor having c-axis alignment of crystals in a direction substantially perpendicular to the film surface. As the other crystal structures of an oxide semiconductor, it is found that a variety of structures which are different from a single-crystal structure, such as a nano-crystal (nc) structure which is an aggregate of nanoscale microcrystals, exist. The crystallinity of a CAAC-OS structure is lower than that of a single-crystal structure and higher than that of an nc structure.

For stable characteristics of the transistor, or the like, a base film is preferably provided. As the base film, an inorganic insulating film such as a silicon oxide film, a silicon nitride film, a silicon oxynitride film, or a silicon nitride oxide film is used, and formation with a single layer or a stacked layer is possible. The base film can be formed by a sputtering method, a CVD (chemical vapor deposition) method (e.g., a plasma CVD method, a thermal CVD method, or a MOCVD (metal organic CVD method), an ALD (atomic layer deposition) method, a coating method, a printing method, or the like. Note that the base film is not necessarily provided if unnecessary, and in this case, the insulating layer 705 can serve as a base film of the transistor.

As the light-emitting element, a self-luminous element can be used, and an element whose luminance is controlled by current or voltage is included in the category. For example, a light-emitting diode (LED), an organic EL element, an inorganic EL element, or the like can be used.

The light-emitting element may be any of a top-emission light-emitting element, a bottom-emission light-emitting element, and a dual-emission light-emitting element. A visible-light-transmitting conductive film is used for the electrode through which light is extracted. A conductive film that reflects visible light is preferably used for the electrode through which light is not extracted.

The visible-light-transmitting conductive film can be formed using, for example, indium oxide; indium tin oxide (ITO: indium tin oxide); indium zinc oxide; zinc oxide (ZnO); zinc oxide to which gallium is added; or the like. Moreover, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can also be used when being formed thin so as to have a light-transmitting property. Alternatively, a stacked film of any of the above materials can be used for the conductive layers. For example, a stacked film of ITO and an alloy of silver and magnesium is preferably used because the conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, formation is possible using an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium. An alloy containing silver and copper is preferable because of its high heat resistance. Furthermore, when a metal film or a metal oxide film is stacked on and in contact with an aluminum alloy film, oxidation of the aluminum alloy film can be prevented. As a material for the metal film or the metal oxide film, titanium, titanium oxide, or the like can be given. Alternatively, the above visible-light-transmitting conductive film and a film containing a metal material may be stacked. For example, a stacked film of silver and ITO; a stacked film of an alloy of silver and magnesium and ITO; or the like can be used.

Each of the electrodes can be formed by an evaporation method or a sputtering method. Alternatively, formation using a discharging method such as an inkjet method, a printing method such as a screen printing method, or a plating method is possible.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. As a layer other than the light-emitting layer, the EL layer 833 may further include a layer containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be included. Each of the layers included in the EL layer 833 can be formed by a method such as an evaporation method (including a vacuum evaporation method), a transfer method, a printing method, an inkjet method, or a coating method.

The light-emitting element 830 may contain two or more kinds of light-emitting substances. Thus, for example, a light-emitting element that emits white light can be achieved. When light-emitting substances are selected so that light emission of the two or more kinds of light-emitting substances has the relationship of complementary colors, for example, white light emission can be obtained. A light-emitting substance that emits light of R (red), G (green), B (blue), Y (yellow), O (orange), or the like, or a light-emitting substance that emits light containing spectral components of two or more colors of R, G, and B can be used, for example. A light-emitting substance that emits blue light and a light-emitting substance that emits yellow light may be used, for example. At this time, the emission spectrum of the light-emitting substance that emits yellow light preferably contains spectral components of green and red. Moreover, the emission spectrum of the light-emitting element 830 preferably has two or more peaks in the visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material in an excited state which is generated in the phosphorescent layer to a fluorescent material in the fluorescent layer. The thickness of the separation layer may be approximately several nanometers, specifically 0.1 nm or more and 20 nm or less, 1 nm or more and 10 nm or less, or 1 nm or more and 5 nm or less. The separation layer contains a single material (preferably a bipolar material) or a plurality of materials (preferably, a hole-transport material and an electron-transport material).

The separation layer may be formed using a material contained in the light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may be formed with the host material and the assist material. To put the above structure in other words, the separation layer includes a region which does not contain the phosphorescent material, while the phosphorescent layer includes a region containing the phosphorescent material. Thus, the separation layer and the phosphorescent layer can be separately deposited depending on whether the phosphorescent material is contained or not. Furthermore, such a structure enables the separation layer and the phosphorescent layer to be deposited in the same chamber. Thus, the manufacturing costs can be reduced.

Moreover, the light-emitting element 830 may be a single element including one EL layer or a tandem element including a plurality of EL layers stacked with a charge generation layer provided therebetween.

The light-emitting element is preferably provided between a pair of insulating films highly resistant to moisture. Thus, entry of an impurity such as water into the light-emitting element can be inhibited, so that a decrease in the reliability of the light-emitting panel can be suppressed. Specifically, when an insulating film highly resistant to moisture is used as the insulating layer 705 and the insulating layer 715, the light-emitting element is located between a pair of insulating films highly resistant to moisture, so that decrease in reliability of the light-emitting panel can be prevented.

As the insulating layer 815, for example, an inorganic insulating film such as a silicon oxide film, a silicon oxynitride film, or an aluminum oxide film can be used. Furthermore, for example, as the insulating layer 817, the insulating layer 817a, and the insulating layer 817b, an organic material such as polyimide, acrylic, polyamide, polyimide amide, or a benzocyclobutene-based resin can be used. Alternatively, a low-dielectric constant material (a low-k material) or the like can be used. Furthermore, each insulating layer may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, a phenol resin, or the like can be used. It is particularly preferable to perform formation using a photosensitive resin material to have an opening portion over the lower electrode 831 so that a side wall of the opening portion is formed as an inclined surface with a continuous curvature.

There is no particular limitation on the method for forming the insulating layer 821. A photolithography method, a sputtering method, an evaporation method, a droplet discharging method (e.g., an inkjet method), a printing method (e.g., a screen printing method or an off-set printing method), or the like can be used, for example.

The spacer 823 can be formed using an inorganic insulating material, an organic insulating material, a metal material, or the like. As the inorganic insulating material and the organic insulating material, a variety of materials that can be used for the above insulating layers can be given, for example. As the metal material, titanium, aluminum, or the like can be used. When a structure is employed in which the spacer 823 containing a conductive material is electrically connected to the upper electrode 835, a potential drop due to the resistance of the upper electrode 835 can be inhibited. Moreover, the spacer 823 may have either a tapered shape or an inverse tapered shape.

For example, a conductive layer functioning as an electrode or a wiring of the transistor, an auxiliary electrode of the light-emitting element, or the like, which is used for the light-emitting panel, can be formed with a single layer or a stacked layer using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), ZnO, ITO, indium zinc oxide (e.g., $In_2O_3$—ZnO), or any of these metal oxide materials in which silicon oxide is contained can be used.

The coloring layer is a colored layer that transmits light in a specific wavelength range. For example, a color filter that transmits light in a wavelength range of red, green, blue, or yellow, or the like can be used. Each coloring layer is formed in a desired position with any of various materials by a printing method, an inkjet method, an etching method using a photolithography method, or the like. Moreover, In a white subpixel, a resin such as a transparent resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be supressed. As the light-blocking layer, a material that can block light from the light-emitting element can be used; for example, a black matrix can be formed using a metal material or a resin material containing pigment or dye. Note that it is preferable to provide the light-blocking layer in a region other than the light-emitting portion, such as a driver circuit portion, in which case undesired light leakage of guided light or the like can be inhibited.

Furthermore, an overcoat covering the coloring layer and the light-blocking layer may be provided. By provision of the overcoat, an impurity and the like contained in the coloring layer can be prevented from being diffused into the light-emitting element. The overcoat is formed with a material that transmits light emitted from the light-emitting element; for example, an inorganic insulating film such as a silicon nitride film or a silicon oxide film or an organic insulating film such as an acrylic film or a polyimide film can be used, and furthermore, a stacked-layer structure of an organic insulating film and an inorganic insulating film may be employed.

Furthermore, in the case where a material of the bonding layer is applied on the coloring layer and the light-blocking layer, a material which has high wettability with respect to the material of the bonding layer is preferably used as a material of the overcoat. For example, an oxide conductive film such as an ITO film or a metal film such as an Ag film which is thin enough to have a light-transmitting property is preferably used as the overcoat.

As the connector, any of a variety of anisotropic conductive films (ACF: Anisotropic Conductive Film), anisotropic conductive pastes (ACP: Anisotropic Conductive Paste), and the like can be used.

As described above, a variety of panels such as a light-emitting panel, a display panel, and a touch panel can be used in the display device of one embodiment of the present invention.

As an example of the display element, for example, an EL element (an EL element containing organic and inorganic materials, an organic EL element, or an inorganic EL element), an LED (a white LED, a red LED, a green LED, a blue LED, or the like), a liquid crystal element, an electrophoretic element, a display element using a MEMS (micro electro mechanical system), or the like can be given.

Note that the light-emitting panel of one embodiment of the present invention may be used as a display panel or may be used as a lighting panel. For example, it may be used as a light source such as a backlight or a front light, that is, a lighting device for a display panel.

This embodiment can be combined with any of other embodiments as appropriate.

(Embodiment 6)

In this embodiment, touch panels which are examples of a display panel are described with reference to the drawings. Note that the above description can be referred to for the components of a touch panel, which are similar to those of the light-emitting panel described in Embodiment 5. Furthermore, although a touch panel including a light-emitting element is described as an example in this embodiment, the touch panel is not limited to this.

<Structural Example 1>

Figure 29A:
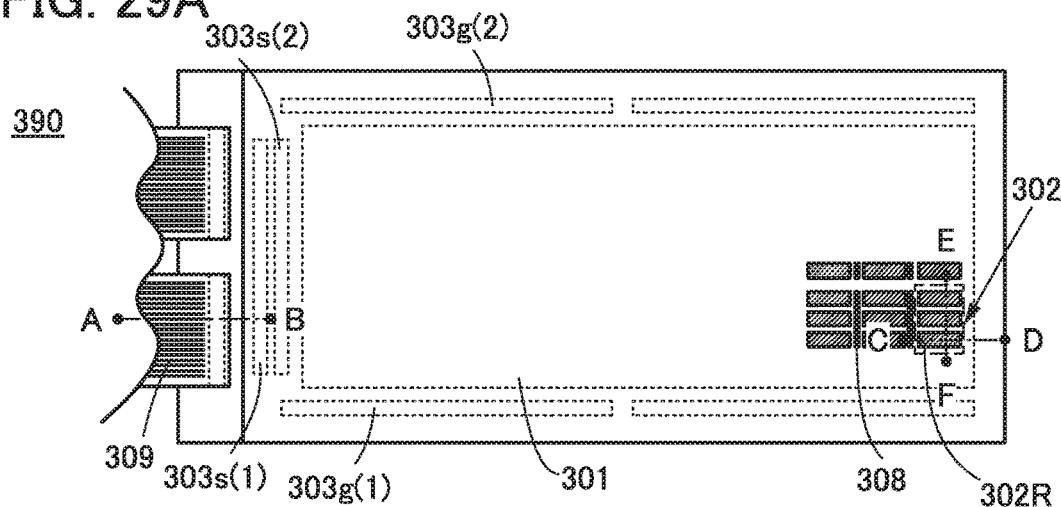
FIG. 29 Diagrams illustrating an example of a touch panel.
Figure 29B:
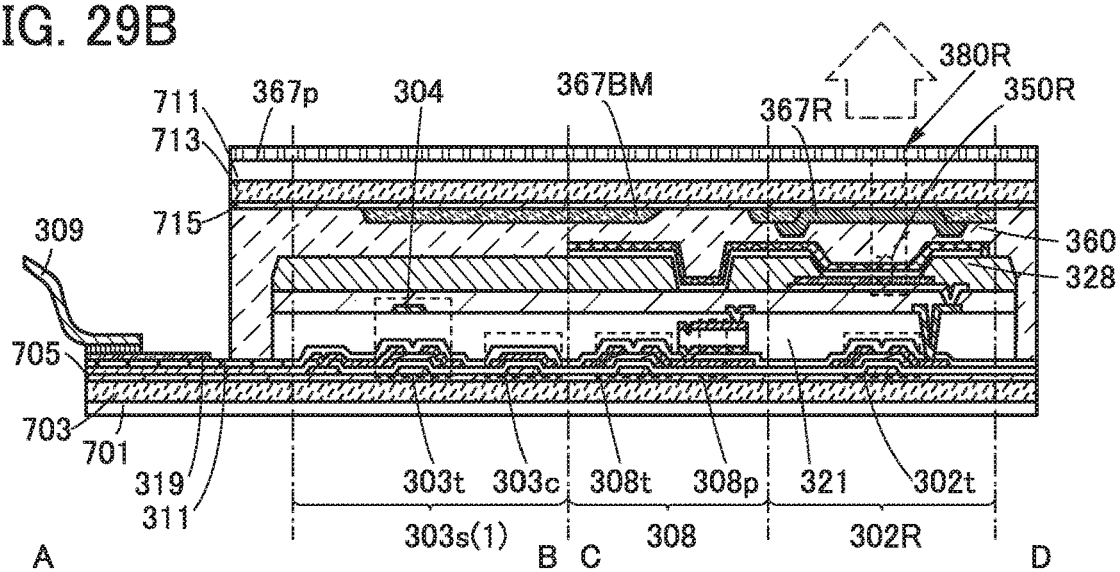
Figure 29C:
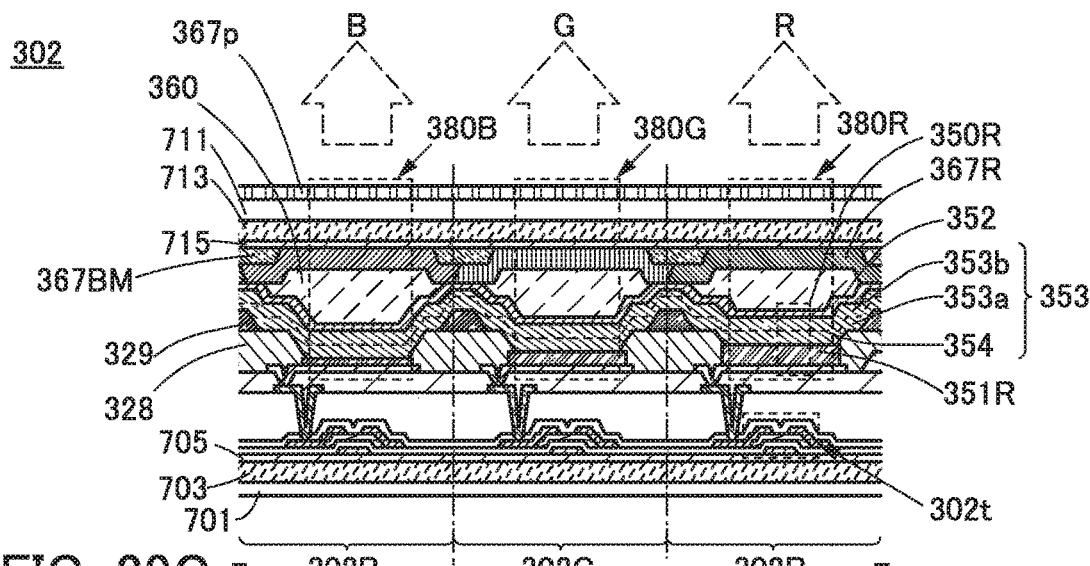

FIG. 29(A) is a top view of the touch panel. FIG. 29(B) is a cross-sectional view taken along dashed-dotted line A-B and dashed-dotted line C-D in FIG. 29(A). FIG. 29(C) is a cross-sectional view taken along dashed-dotted line E-F in FIG. 29(A).

A touch panel 390 illustrated in FIG. 29(A) includes a display portion 301 (serving also as an input portion), a scan line driver circuit 303g(1), an imaging pixel driver circuit 303g(2), an image signal line driver circuit 303s(1), and an imaging signal line driver circuit 303s(2).

The display portion 301 includes a plurality of pixels 302 and a plurality of imaging pixels 308.

The pixel 302 includes a plurality of sub-pixels. Each sub-pixel includes a light-emitting element and a pixel circuit.

The pixel circuits can supply electric power for driving the light-emitting element. The pixel circuits are electrically connected to wirings through which selection signals can be supplied. Moreover, the pixel circuits are electrically connected to wirings through which image signals are supplied.

The scan line driver circuit 303g(1) can supply selection signals to the pixels 302.

The image signal line driver circuit 303s(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals can be supplied. Furthermore, the imaging pixel circuits are also electrically connected to wirings through which power supply potentials can be supplied.

As the control signals, for example, a signal that can select an imaging pixel circuit from which a recorded imaging signal is read, a signal that can initialize an imaging pixel circuit, a signal that can determine the time it takes for an imaging pixel circuit to sense light, and the like can be given.

The imaging pixel driver circuit 303g(2) can supply control signals to the imaging pixels 308.

The imaging signal line driver circuit 303s(2) can read out imaging signals.

As illustrated in FIGS. 29(B) and (C), the touch panel 390 includes the substrate 701, the bonding layer 703, the insulating layer 705, the substrate 711, the bonding layer 713, and the insulating layer 715. The substrate 701 and the substrate 711 are bonded to each other with a bonding layer 360.

The substrate 701 and the insulating layer 705 are bonded to each other with the bonding layer 703. Furthermore, the substrate 711 and the insulating layer 715 are bonded to each other with the bonding layer 713.

Embodiment 2 can be referred to for materials that can be used for the substrates, the bonding layers, and the insulating layers.

Each of the pixels 302 includes a sub-pixel 302R, a sub-pixel 302G, and a sub-pixel 302B (FIG. 29(C)). Moreover, the sub-pixel 302R includes a light-emitting unit 380R, the sub-pixel 302G includes a light-emitting unit 380G, and the sub-pixel 302B includes a light-emitting unit 380B.

For example, the sub-pixel 302R includes the light-emitting element 350R and the pixel circuit. The pixel circuit includes a transistor 302t that can supply electric power to the light-emitting element 350R. Furthermore, the light-emitting unit 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 29(C)).

The EL layer 353 includes a first EL layer 353a, an intermediate layer 354, and a second EL layer 353b, which are stacked in this order.

Note that a microcavity structure can be provided for the light-emitting unit 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

For example, the light-emitting unit 380R includes the bonding layer 360 that is in contact with the light-emitting element 350R and the coloring layer 367R.

The coloring layer 367R is placed at a position overlapping with the light-emitting element 350R. Accordingly, part of light emitted from the light-emitting element 350R passes through the bonding layer 360 and through the coloring layer 367R and is emitted to the outside of the light-emitting unit 380R as denoted by an arrow in the drawing.

The touch panel 390 includes a light-blocking layer 367BM. The light-blocking layer 367BM is provided so as to surround the coloring layer (e.g., the coloring layer 367R).

The touch panel 390 includes an anti-reflective layer 367p at a position overlapping with the display portion 301. As the anti-reflective layer 367p, a circular polarizing plate can be used, for example.

The touch panel 390 includes an insulating layer 321. The insulating layer 321 covers the transistor 302t and the like. Note that the insulating layer 321 can be used as a layer for planarizing unevenness caused by the pixel circuits and the imaging pixel circuits. Furthermore, the transistor 302t and the like are preferably covered with an insulating layer that can inhibit diffusion of impurities to the transistor 302t and the like.

The touch panel 390 includes a partition 328 that overlaps with an end portion of the lower electrode 351R. In addition, a spacer 329 that controls the distance between the substrate 701 and the substrate 711 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 29(B), the transistor 303t may include a second gate 304 over the insulating layer 321. The second gate 304 may be electrically connected to a gate of the transistor 303t, or different potentials may be supplied to them. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light with which the photoelectric conversion element 308p is irradiated. The imaging pixel circuit includes the transistor 308t.

For example, a PIN photodiode can be used as the photoelectric conversion element 308p.

The touch panel 390 includes a wiring 311 through which a signal can be supplied. The wiring 311 is provided with a terminal 319. An FPC 309 through which a signal such as an image signal or a synchronization signal can be supplied is electrically connected to the terminal 319. A printed wiring board (PWB) may be attached to the FPC 309.

Note that transistors such as the transistor 302t, the transistor 303t, and the transistor 308t can be formed in the same process. Alternatively, they may be formed in different processes.

<Structural Example 2>

Figure 30A:
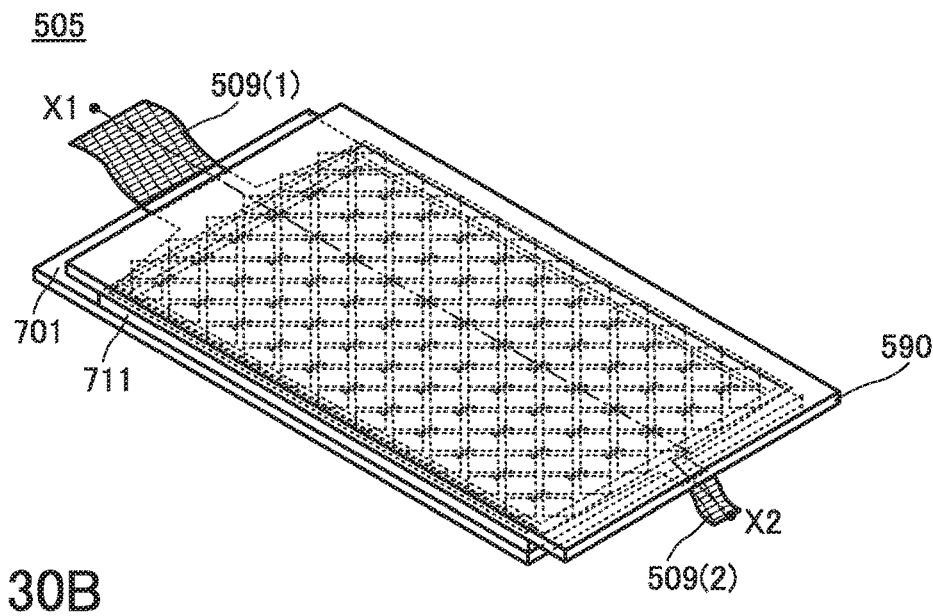
FIG. 30 Diagrams illustrating an example of a touch panel.

FIGS. 30(A) and (B) are perspective views of a touch panel 505. Note that main components are illustrated for clarity. FIG. 31 are each a cross-sectional view taken along dashed-dotted line X1-X2 in FIG. 30(A)

As illustrated in FIGS. 30(A) and (B), the touch panel 505 includes a display portion 501, the scan line driver circuit 303g(1), a touch sensor 595, and the like. Furthermore, the touch panel 505 includes the substrate 701, the substrate 711, and a substrate 590.

The touch panel 505 includes a plurality of pixels and a plurality of wirings 311. The plurality of wirings 311 can supply signals to the pixels. The plurality of wirings 311 are led to a peripheral portion of the substrate 701, and part thereof forms the terminal 319. The terminal 319 is electrically connected to an FPC 509(1).

Figure 30B:
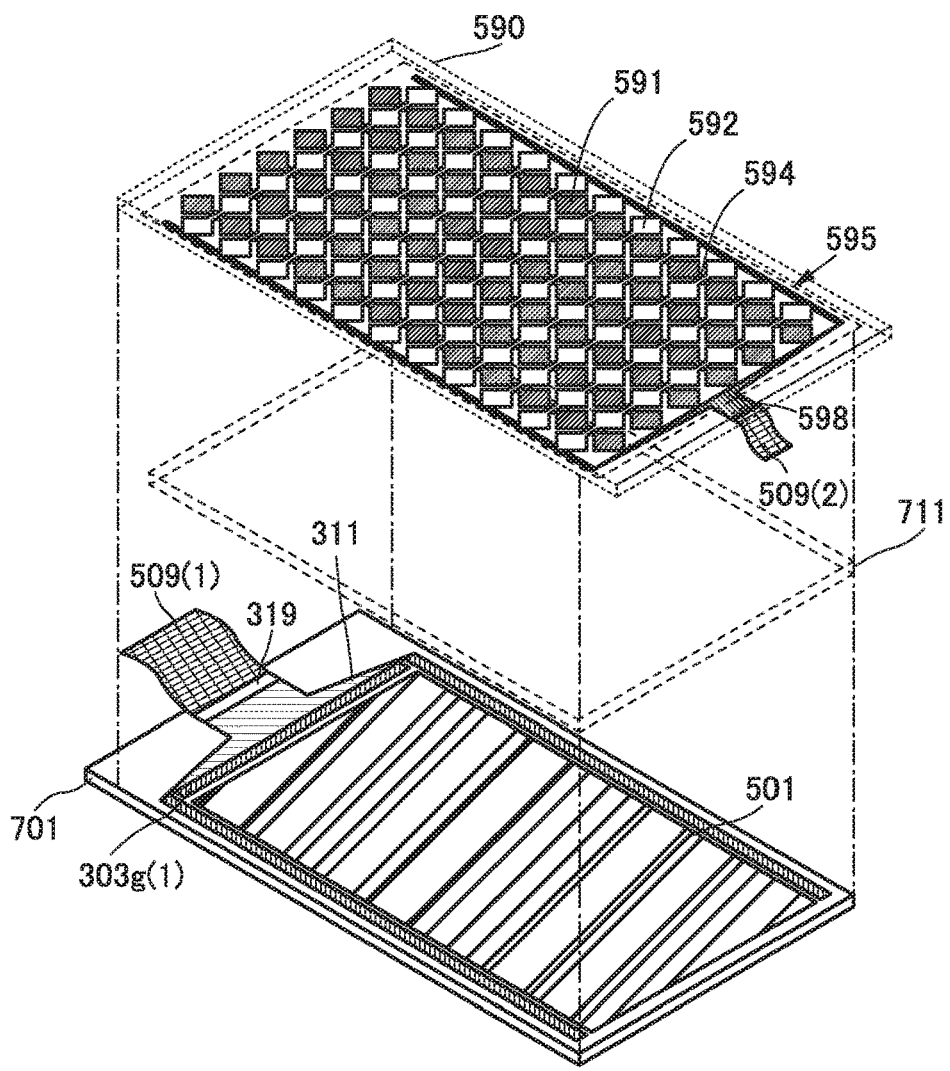

The touch panel 505 includes the touch sensor 595 and a plurality of wirings 598. The plurality of wirings 598 are electrically connected to the touch sensor 595. The plurality of wirings 598 is led to a peripheral portion of the substrate 590, and part thereof forms a terminal. In addition, the terminal is electrically connected to an FPC 509(2). Note that in FIG. 30(B), electrodes, wirings, and the like of the touch sensor 595 provided on the rear surface side of the substrate 590 (the surface side facing the substrate 701) are denoted by solid lines for clarity.

As the touch sensor 595, for example, a capacitive touch sensor can be used. As the capacitive touch sensor, a surface capacitive touch sensor, a projected capacitive touch sensor, or the like can be given. The case of using a projected capacitive touch sensor is described here.

As the projected capacitive touch sensor, a self capacitive touch sensor, a mutual capacitive touch sensor, or the like can be given. The use of a mutual capacitive touch sensor is preferable because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrode 592 has a shape in which a plurality of quadrangles arranged repeatedly in one direction are connected to each other at corners as illustrated in FIGS. 30(A) and (B).

The electrodes 591 have a quadrangular shape and are arranged repeatedly in a direction intersecting with the direction in which the electrodes 592 extend. Note that the plurality of electrodes 591 is not necessarily arranged in the direction orthogonal to one electrode 592 and may be arranged at an angle of less than 90 degrees.

The wiring 594 is provided so as to intersect with the electrode 592. The wiring 594 electrically connects two electrodes 591 between which one of the electrodes 592 is positioned. At this time, a shape is preferable in which the area of an intersecting portion of the electrode 592 and the wiring 594 is as small as possible. Thus, the area of a region where the electrodes are not provided can be reduced, so that unevenness in light transmittance can be reduced. As a result, unevenness in luminance of light transmitted through the touch sensor 595 can be reduced.

Note that the shapes of the electrodes 591 and the electrodes 592 are not limited to this and can be any of a variety of shapes. For example, a structure may be employed in which the plurality of electrodes 591 is provided so that space is generated as little as possible, and the plurality of electrodes 592 is provided with an insulating layer interposed between the electrodes 591 and the electrodes 592 so as to be spaced apart from each other to form a region not overlapping with the electrodes 591. In this time, it is preferable to provide a dummy electrode which is electrically insulated from them between two adjacent electrodes 592, in which case the area of a region having a different light transmittance can be reduced.

Figure 31A:
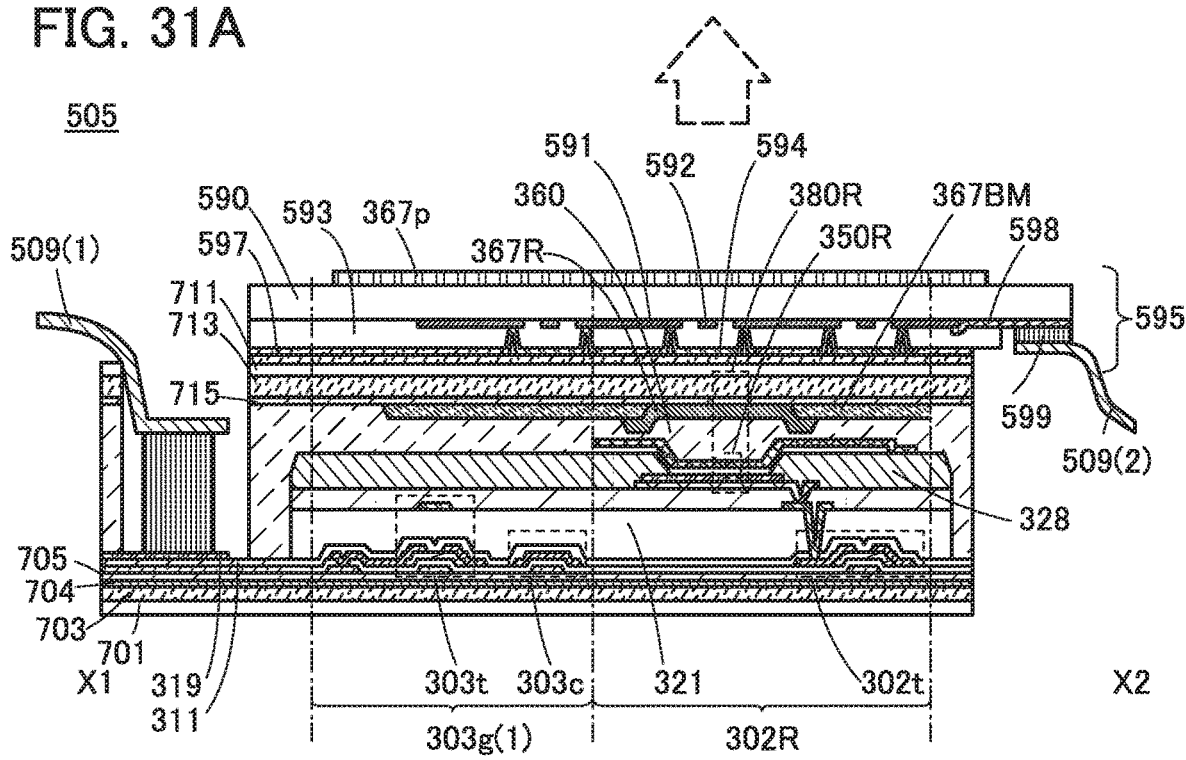
FIG. 31 Diagrams illustrating examples of a touch panel.

As illustrated in FIG. 31(A), the touch panel 505 includes the substrate 701, the bonding layer 703, the insulating layer 705, the substrate 711, the bonding layer 713, and the insulating layer 715. Moreover, the substrate 701 and the substrate 711 are bonded to each other with the bonding layer 360.

A bonding layer 597 bonds the substrate 590 to the substrate 711 so that the touch sensor 595 overlaps with the display portion 501. The bonding layer 597 has a light-transmitting property.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene can be used as well. The film including graphene can be formed, for example, by reducing a film containing graphene oxide formed in a film-like shape. As a reducing method, a method with application of heat or the like can be employed.

Furthermore, the resistance of a material used for conductive films such as the electrodes 591, the electrodes 592, and the wiring 594, i.e., a wiring and an electrode included in the touch panel, is preferably low. As an example, ITO, indium zinc oxide, ZnO, silver, copper, aluminum, a carbon nanotube, graphene, or the like may be used. Alternatively, a metal nanowire including a number of extremely small conductors (for example, a diameter of several nanometers) may be used. As an example, an Ag nanowire, a Cu nanowire, an Al nanowire, or the like may be used. In the case of an Ag nanowire, for example, light transmittance of 89% or more and a sheet resistance of 40 ohms/square or more and 100 ohms/square or less can be achieved. Note that a metal nanowire, a carbon nanotube, graphene, or the like may be used for an electrode used for the display element, e.g., a pixel electrode or a common electrode because of its high light transmittance.

The electrodes 591 and the electrodes 592 can be formed by depositing a light-transmitting conductive material on the substrate 590 by a sputtering method and then removing an unnecessary portion by any of various patterning techniques such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used for the wiring 594 because the aperture ratio of the touch panel can be increased. Moreover, a material with higher conductivity than the conductivities of the electrodes 591 and the electrodes 592 can be favorably used for the wiring 594 because electric resistance can be reduced.

Note that an insulating layer that covers the insulating layer 593 and the wiring 594 can be provided to protect the touch sensor 595.

Furthermore, a connection layer 599 electrically connects the wiring 598 to the FPC 509(2).

The display portion 501 includes a plurality of pixels arranged in a matrix. The pixel is similar to Structure example 1; thus, description thereof is omitted.

Note that any of a variety of transistors can be used in the touch panel. Note that a structure in the case of using bottom-gate transistors is illustrated in FIGS. 31(A) and (B).

For example, a semiconductor layer containing an oxide semiconductor, amorphous silicon, or the like can be used in the transistor 302t and the transistor 303t illustrated in FIG. 31(A).

Figure 31B:
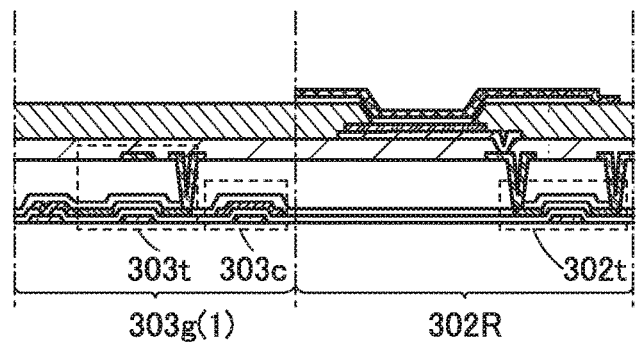

For example, a semiconductor layer containing polycrystalline silicon obtained by crystallization through a process such as laser annealing can be used in the transistor 302t and the transistor 303t illustrated in FIG. 31(B).

Figure 31C:
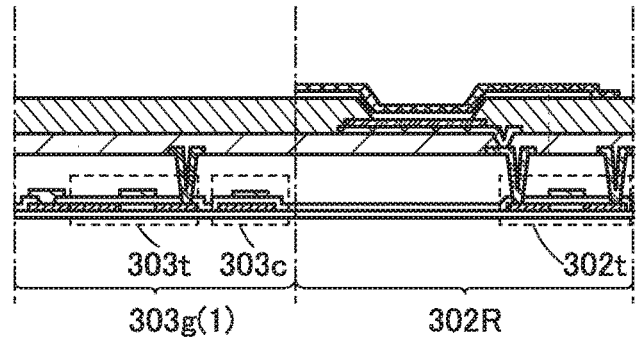

Furthermore, a structure in the case of using top-gate transistors is illustrated in FIG. 31(C).

For example, a semiconductor layer containing polycrystalline silicon, a single crystal silicon film that is transferred from a single crystal silicon substrate, or the like can be used in the transistor 302t and the transistor 303t illustrated in FIG. 31(C).

<Structural Example 3>

FIG. 32 are cross-sectional views of a touch panel 505B. The touch panel 505B described in this embodiment is different from the touch panel 505 in Structure Example 2 in that supplied image data is displayed on the side where the transistors are provided and that the touch sensor is provided on the substrate 701 side of the display portion. Different structures are described in detail here, and the above description is referred to for the components that can have structures similar to the above.

The coloring layer 367R is placed at a position overlapping with the light-emitting element 350R. Furthermore, the light-emitting element 350R illustrated in FIG. 32(A) emits light to the side where the transistor 302t is provided. Accordingly, part of light emitted from the light-emitting element 350R passes through the coloring layer 367R and is emitted to the outside of the light-emitting unit 380R in a direction indicated by an arrow in the drawing.

The touch panel 505B includes the light-blocking layer 367BM in a direction in which light is emitted. The light-blocking layer 367BM is provided so as to surround the coloring layer (e.g., the coloring layer 367R).

Figure 32A:
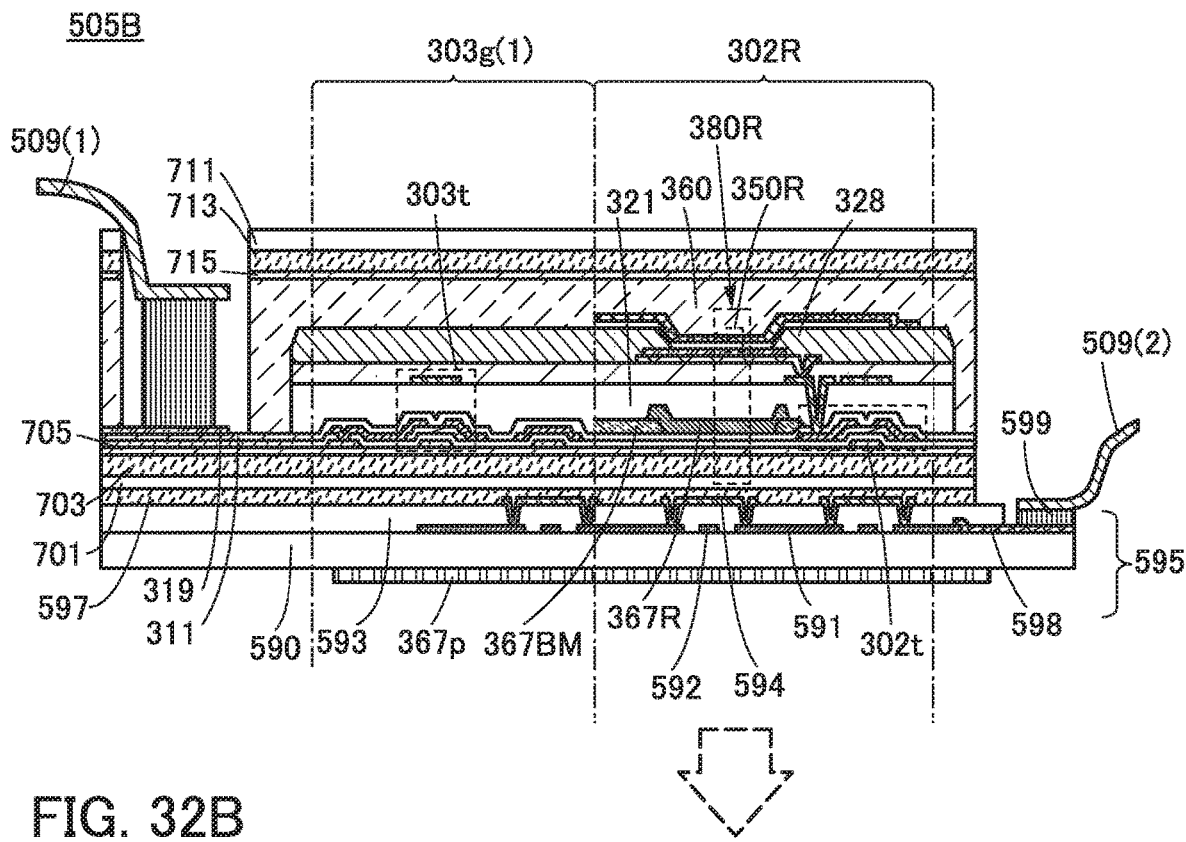
FIG. 32 Diagrams illustrating examples of a touch panel.

The touch sensor 595 is provided not on the substrate 711 side but on the substrate 701 side (see FIG. 32(A)).

The bonding layer 597 bonds the substrate 590 to the substrate 701 so that the touch sensor 595 overlaps with the display portion. The bonding layer 597 has a light-transmitting property.

Note that a structure in the case of using bottom-gate transistors in the display portion 501 is illustrated in FIGS. 32(A) and (B).

For example, a semiconductor layer containing an oxide semiconductor, amorphous silicon, or the like can be used in the transistor 302t and the transistor 303t illustrated in FIG. 32(A).

Figure 32B:
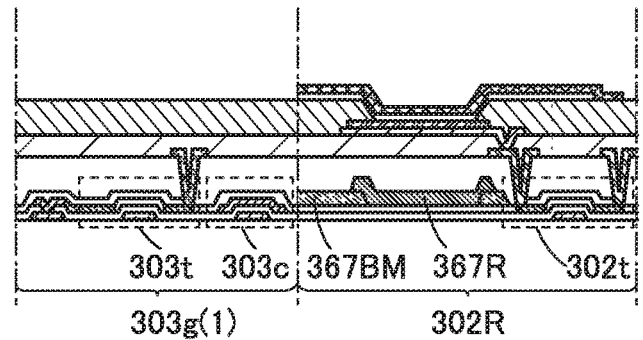

For example, a semiconductor layer containing polycrystalline silicon or the like can be used in the transistor 302t and the transistor 303t illustrated in FIG. 32(B).

Figure 32C:
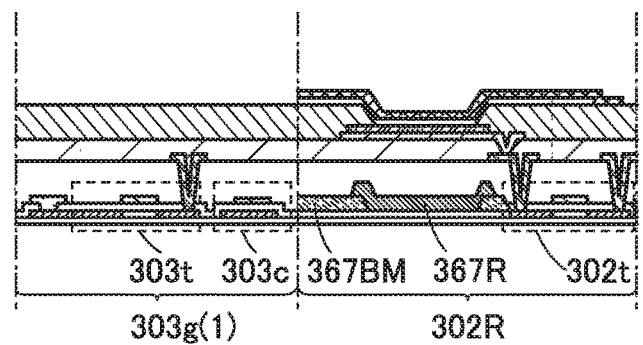

In addition, a structure in the case of using top-gate transistors is illustrated in FIG. 32(C).

For example, a semiconductor layer including polycrystalline silicon, a single crystal silicon film that is transferred from a single crystal silicon substrate, or the like can be used in the transistor 302t and the transistor 303t illustrated in FIG. 32(C).

This embodiment can be combined with any of other embodiments as appropriate.

(Embodiment 7)

In this embodiment, a display panel is described with reference to drawings.

Figure 33A:
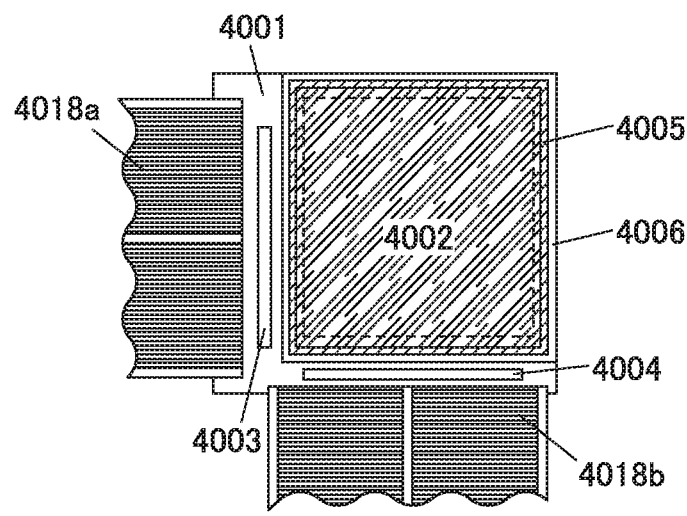
FIG. 33 Diagrams illustrating examples of a display panel.

In FIG. 33(A), a sealant 4005 is provided so as to surround a pixel portion 4002 provided over a first substrate 4001. The pixel portion 4002 is sealed by the first substrate 4001, the sealant 4005, and a second substrate 4006. In FIG. 33(A), a scan line driver circuit 4004 and a signal line driver circuit 4003 each are formed using a single-crystal semiconductor or a polycrystalline semiconductor over a substrate prepared separately, and mounted in a region different from the region surrounded by the sealant 4005 over the first substrate 4001. Furthermore, various signals and potentials supplied to the signal line driver circuit 4003, the scan line driver circuit 4004, and the pixel portion 4002 are supplied from FPCs 4018a and 4018b.

Figure 33B:
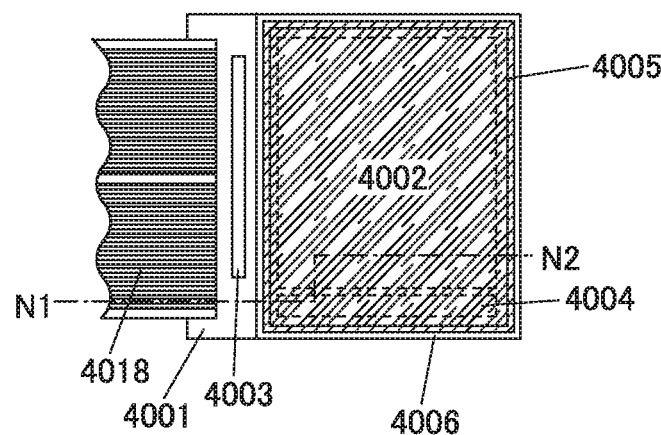

In FIGS. 33(B) and (C), the sealant 4005 is provided so as to surround the pixel portion 4002 and the scan line driver circuit 4004 which are provided over the first substrate 4001. The pixel portion 4002 and the scan line driver circuit 4004 are sealed together by the first substrate 4001, the sealant 4005, and the second substrate 4006. In FIGS. 33(B) and (C), a signal line driver circuit 4003 formed using a single crystal semiconductor or a polycrystalline semiconductor over a substrate separately prepared is mounted in a region different from the region surrounded by the sealant 4005 over the first substrate 4001. In FIGS. 33(B) and (C), a variety of signals and potentials supplied to the signal line driver circuit 4003, the scan line driver circuit 4004, and the pixel portion 4002 are supplied from the FPC 4018.

Although FIGS. 33(B) and (C) each illustrate an example in which the signal line driver circuit 4003 is formed separately and mounted on the first substrate 4001, there is no limitation to this structure. The scan line driver circuit may be formed separately and then mounted, or only part of the signal line driver circuit or part of the scan line driver circuit may be formed separately and then mounted.

Figure 33C:
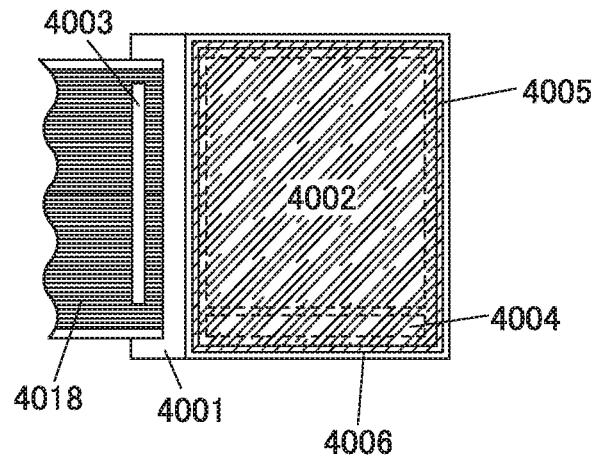

Note that a connection method of a separately formed driver circuit is not particularly limited, and wire bonding, COG, TCP, COF, or the like can be used. FIG. 33(A) illustrates an example in which the signal line driver circuit 4003 and the scan line driver circuit 4004 are mounted by COG. FIG. 33(B) illustrates an example in which the signal line driver circuit 4003 is mounted by COG. FIG. 33(C) illustrates an example in which the signal line driver circuit 4003 is mounted by TCP.

Furthermore, the pixel portion 4002 and the scan line driver circuit 4004 which are provided over the first substrate 4001 include a plurality of transistors.

Figure 34:
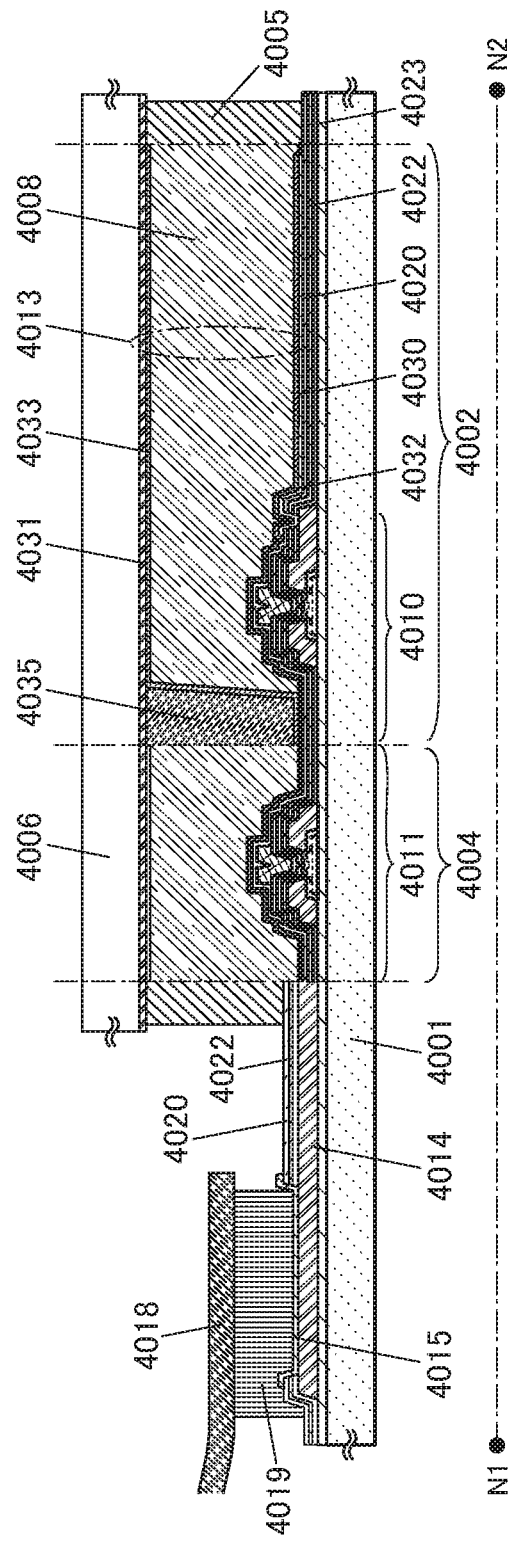
FIG. 34 A diagram illustrating an example of a liquid crystal display panel.

FIG. 34 is a cross-sectional view taken along dashed-dotted line N1-N2 in FIG. 33(B). As illustrated in FIG. 34, the display panel has an electrode 4015, and the electrode 4015 is electrically connected to a terminal included in the FPC 4018 through an anisotropic conductive layer 4019. Moreover, the electrode 4015 is electrically connected to a wiring 4014 through an opening formed in an insulating layer 4020 and an insulating layer 4022.

The electrode 4015 is formed of the same conductive layer as a first electrode 4030, and the wiring 4014 is formed of the same conductive layer as source and drain electrodes of a transistor 4010 and a transistor 4011.

Although the electrode 4015 and the wiring 4014 are connected through one opening formed in the insulating layer 4020 and the insulating layer 4022 in FIG. 34, the number of the openings is not limited to one. Since unevenness is formed on a surface of the electrode 4015 by formation of a plurality of openings, for example, the area of contact between the electrode 4015 to be formed later and the anisotropic conductive layer 4019 can be increased. Thus, favorable connection of the FPC 4018 and the electrode 4015 can be obtained.

Furthermore, the pixel portion 4002 and the scan line driver circuit 4004 provided over the first substrate 4001 each include a plurality of transistors. FIG. 34 illustrates the transistor 4010 included in the pixel portion 4002 and the transistor 4011 included in the scan line driver circuit 4004 as an example. In FIG. 34(A), the insulating layer 4020 is provided over the transistor 4010 and the transistor 4011. Note that an insulating layer 4023 is an insulating film which functions as a base layer and the insulating layer 4022 is an insulating layer which functions as a gate insulating layer.

The transistor 4010 provided in the pixel portion 4002 is electrically connected to a display element so that a display panel is formed. There is no particular limitation on the display element as long as display can be performed, and any of a variety of display elements can be used.

FIG. 34 illustrates an example of a liquid crystal display panel in which a liquid crystal element is used as a display element. In FIG. 34, a liquid crystal element 4013 which is a display element includes the first electrode layer 4030, a second electrode 4031, and a liquid crystal layer 4008. Note that insulating films 4032 and 4033 serving as alignment films are provided so that the liquid crystal layer 4008 is sandwiched therebetween. A structure is employed in which the second electrode 4031 is provided on the second substrate 4006 side, and the first electrode 4030 and the second electrode 4031 overlap with each other with the liquid crystal layer 4008 positioned therebetween.

Moreover, a spacer 4035 is a columnar spacer obtained by selective etching of an insulating layer and is provided in order to control a distance between the first electrode 4030 and the second electrode 4031 (a cell gap). Note that a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions. Alternatively, liquid crystal that exhibits a blue phase for which an alignment film is not used may be used.

Furthermore, the specific resistivity of the liquid crystal material is higher than or equal to $1\times10^9$ Ω·cm, preferably higher than or equal to $1\times10^{11}$ Ω·cm, further preferably higher than or equal to $1\times10^{12}$ Ω·cm. Note that the value of the specific resistivity in this specification is a value obtained by measurement at 20° C.

The size of a storage capacitor formed in the liquid crystal display panel is set considering the leakage current of the transistor provided in a pixel portion, or the like so that charge can be held for a predetermined period. The size of the storage capacitor may be set considering the off-state current of the transistor or the like. By using a transistor including a high-purity oxide semiconductor layer, it is enough to provide a storage capacitor having a capacitance that is less than or equal to ⅓, preferably less than or equal to ⅕ of a liquid crystal capacitance of each pixel.

Furthermore, in a transistor including an oxide semiconductor, relatively high field-effect mobility can be obtained, whereby high-speed operation is possible. Consequently, when the transistor including an oxide semiconductor is used in a pixel portion of a semiconductor device having a display function, high-quality images can be provided. In addition, since a driver circuit portion and the pixel portion can be formed over one substrate, the number of components of the semiconductor device can be reduced.

For the liquid crystal display panel, a TN (twisted nematic) mode, an IPS (in-plane-switching) mode, an FFS (fringe field switching) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Alternatively, a normally black liquid crystal display panel such as a transmissive liquid crystal display panel utilizing a vertical alignment (VA) mode may be used. Here, the vertical alignment mode is one kind of a method for controlling the alignment of liquid crystal molecules of a liquid crystal display panel, and is a method in which liquid crystal molecules are aligned in a vertical direction with respect to a panel surface when no voltage is applied. Some are given as the vertical alignment mode. For example, an MVA (multi-domain vertical alignment) mode, a PVA (patterned vertical alignment) mode, an ASV (advanced super view) mode, and the like can be used. Moreover, it is possible to use a method called domain multiplication or multi-domain design, which devises such that a pixel (pixel) is divided into some regions (subpixels) and molecules are aligned in different directions.

Furthermore, in the display panel, a black matrix (a light-blocking layer), an optical member (an optical substrate) such as a polarizing member, a retardation member, or an anti-reflection member, and the like are provided as appropriate. For example, circular polarization with a polarizing substrate and a retardation substrate may be used. In addition, a backlight, a side light, or the like may be used as a light source.

Furthermore, as a display method in the pixel portion, a progressive method, an interlace method, or the like can be used. Furthermore, color elements controlled in a pixel at the time of color display are not limited to three colors: R, G, and B (R, G, and B represent red, green, and blue, respectively). For example, R, G, B, and W (W represents white); R, G, and B to which one or more of yellow, cyan, magenta, and the like are added; or the like can be given. Note that the size of a display region may be different depending on respective dots of the color components. However, one embodiment of the present invention is not limited to a color display panel and can also be applied to a monochrome display panel.

REFERENCE NUMERALS 10 display device
11 display region
15 display device
16 display device
30 support panel
30a support panel
30b support panel
30c support panel
31 first shaft
31a first shaft
31b first shaft
31c first shaft
31d first shaft
32 second shaft
32c second shaft
32d second shaft
33 unit
33a unit
33b unit
33c unit
33d unit
33e unit
33f unit
33g unit
33h unit
35 arm
35a arm
35b arm
35c arm
35d arm
36 arm
36c arm
36d arm
37 arm
37c arm
37d arm
38 third shaft
39a hinge portion
39b hinge portion
39c hinge portion
39d hinge portion
70 support panel
70a support panel
70b support panel
70c support panel
81 device
85 pillar
86 wall
100 display panel
100a display panel
100b display panel
100c display panel
100d display panel
100f display panel
100h display panel
101 display region
101a display region
101b display region
101c display region
102 region
102a region
102b region
103 light-transmitting layer
103a light-transmitting layer
103b light-transmitting layer
110 visible-light-transmitting region
110a visible-light-transmitting region
110b visible-light-transmitting region
110c visible-light-transmitting region
112a FPC
112b FPC
120 visible-light-blocking region
120a visible-light-blocking region
120b visible-light-blocking region
120c visible-light-blocking region
132 protective substrate
151a substrate
151b substrate
152a substrate
152b substrate
153a element layer
153b element layer
155a region
155b region
156a region
156b region
200 electronic device
201a housing
201b housing
205 visible-light-transmitting region
210 electronic device
211 battery
212 circuit board
213 antenna
250 electronic device
251a housing
251b housing
252 pin
253 circuit board
254 antenna
256 battery
257 stick
258 string
260 electronic device
261a housing
261b housing
262 pin
267 stick
268 string
270 electronic device
277 operation button
278 stick
279 holder
280 electronic device
289 holder 290 advertising balloon
291 sphere
293a housing
293b housing
294 support panel
295 electronic device
296 rope
301 display portion
302 pixel
302B subpixel
302G subpixel
302R subpixel
302t transistor
303c capacitor
303g(1) scan line driver circuit
303g(2) imaging pixel driver circuit
303s(1) image signal line driver circuit
303s(2) imaging signal line driver circuit
303t transistor
304 gate
308 imaging pixel
308p photoelectric conversion element
308t transistor
309 FPC
311 wiring
319 terminal
321 insulating layer
328 partition
329 spacer
330 electronic device
331 housing
332 speaker
333a camera
333b camera
334a light
334b light
335 operation button
336 battery
337 operation button
338 microphone
339 region
339a region
339b region
340 electronic device
342 external connection port
349 housing
350R light-emitting element
351R lower electrode
352 upper electrode
353 EL layer
353a EL layer
353b EL layer
354 intermediate layer
360 bonding layer
367BM light-blocking layer
367p anti-reflective layer
367R coloring layer
380B light-emitting unit
380G light-emitting unit
380R light-emitting unit
390 touch panel
501 display portion
505 touch panel
505B touch panel
509 FPC
590 substrate
591 electrode
592 electrode
593 insulating layer
594 wiring
595 touch sensor
597 bonding layer
598 wiring
599 bonding layer
701 substrate
703 bonding layer
705 insulating layer
711 substrate
713 bonding layer
715 insulating layer
804 light-emitting portion
806 driver circuit portion
808 FPC
814 conductive layer
815 insulating layer
817 insulating layer
817a insulating layer
817b insulating layer
820 transistor
821 insulating layer
822 bonding layer
823 spacer
824 transistor
825 connector
830 light-emitting element
831 lower electrode
832 optical adjustment layer
833 EL layer
835 upper electrode
845 coloring layer
847 light-blocking layer
849 overcoat
856 conductive layer
857 conductive layer
857a conductive layer
857b conductive layer
4001 substrate
4002 pixel portion
4003 signal line driver circuit
4004 scan line driver circuit
4005 sealant
4006 substrate
4008 liquid crystal layer
4010 transistor
4011 transistor
4013 liquid crystal element
4014 wiring
4015 electrode
4018 FPC
4018a FPC
4018b FPC
4019 anisotropic conductive layer
4020 insulating layer
4022 insulating layer
4023 insulating layer
4030 electrode
4031 electrode
4032 insulating layer
4033 insulating layer
4035 spacer

The invention claimed is:
1. A display device comprising:
a first display panel comprising a first region having a function of performing display;

a second display panel comprising a second region having a function of performing display and a third region adjacent to the second region and having a function of transmitting visible light;
a first support panel that supports the first display panel;
a second support panel that supports the second display panel; and
a hinge portion connecting the first support panel and the second support panel to each other,
wherein the display device is configured to change from a stored state to an extended state,
wherein the display device is configured to change from the extended state to the stored state,
wherein in the stored state, the first display panel and the second display panel overlap each other with a display surface of the first display panel and a display surface of the second display panel facing in the same direction,
wherein the hinge portion comprises a first unit and a second unit each comprising a first shaft, a second shaft, and an arm,
wherein the arm is connected to the first shaft so as to be rotatable about the first shaft,
wherein the arm is connected to the second shaft so as to be rotatable about the second shaft,
wherein a side surface of the first support panel has an opening, and
wherein the first shaft is moveable along the opening.

2. The display device according to claim 1,
wherein the display device is configured to overlap the first display panel and the second display panel in a state where end portions are aligned at three or more sides.

3. The display device according to claim 1,
wherein the display device is configured to fix positions of the first display panel and the second display panel in a first state, and
wherein in the first state, a display surface of the first region overlaps with the third region.

4. The display device according to claim 1,
wherein at least one of the first display panel and the second display panel has flexibility.

5. The display device according to claim 1,
wherein at least one of the first display panel and the second display panel has a curved surface.

6. The display device according to claim 1,
wherein the first region comprises a pixel, and
wherein an angle formed by a side of the pixel and a side of the third region is greater than 0° and less than 50°.

7. The display device according to claim 1,
wherein in the extended state, the third region of the second display panel overlaps the display surface of the first display panel.

8. A display device comprising:
a first display panel comprising a first region having a function of performing display;
a second display panel comprising a second region having a function of performing display and a third region adjacent to the second region and having a function of transmitting visible light;
a first support panel that supports the first display panel;
a second support panel that supports the second display panel; and
a hinge portion connecting the first support panel and the second support panel to each other,
wherein the display device is configured to change from a stored state to an extended state,
wherein the display device is configured to change from the extended state to the stored state,
wherein in the stored state, the first display panel and the second display panel overlap each other with a display surface of the first display panel and a display surface of the second display panel facing in the same direction,
wherein the hinge portion comprises a first unit and a second unit each comprising a first shaft, a second shaft, a third shaft, a first arm, and a second arm,
wherein the first arm is connected to the first shaft so as to be rotatable about the first shaft,
wherein the first arm is connected to the third shaft so as to be rotatable about the third shaft,
wherein the second arm is connected to the second shaft so as to be rotatable about the second shaft, and
wherein the second arm is connected to the third shaft so as to be rotatable about the third shaft.

9. The display device according to claim 8,
wherein in the extended state, the third region of the second display panel overlaps the display surface of the first display panel.

10. The display device according to claim 8,
wherein the display device is configured to overlap the first display panel and the second display panel in a state where end portions are aligned at three or more sides.

11. The display device according to claim 8,
wherein the display device is configured to fix positions of the first display panel and the second display panel in a first state, and
wherein in the first state, a display surface of the first region overlaps with the third region.

12. The display device according to claim 8,
wherein at least one of the first display panel and the second display panel has flexibility.

13. The display device according to claim 8,
wherein at least one of the first display panel and the second display panel has a curved surface.

14. The display device according to claim 8,
wherein the first region comprises a pixel, and
wherein an angle formed by a side of the pixel and a side of the third region is greater than 0° and less than 50°.

15. An electronic device comprising:
a first display panel;
a housing; and
a communication means,
wherein the first display panel is positioned in the housing,
wherein the first display panel comprises a first region and a second region,
wherein the first region has a function of performing display,
wherein the second region is adjacent to the first region and has a function of transmitting visible light,
wherein the housing comprises a mechanism which exposes the second region, and
wherein the electronic device is configured to use the first display panel and a second display panel included in another electronic device as one display region in such a manner that the second region overlaps with part of the second display panel, and communication with the other electronic device is performed using the communication means.

16. The electronic device according to claim 15,
wherein the second region is exposed by detachment or rotation of part of the housing.

17. The electronic device according to claim 15, wherein the first display panel has flexibility.

18. The electronic device according to claim 15, wherein the first display panel has a curved surface.

19. The electronic device according to claim 15, further comprising at least any one of an antenna, a battery, a speaker, a microphone, and an operation button.

* * * * *